(12) United States Patent
Imoto et al.

(10) Patent No.: US 7,932,605 B2
(45) Date of Patent: Apr. 26, 2011

(54) SEMICONDUCTOR DEVICE AND MANUFACTURING METHOD THEREFOR

(75) Inventors: Takashi Imoto, Yokohama (JP); Chiaki Takubo, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 445 days.

(21) Appl. No.: 11/889,071

(22) Filed: Aug. 8, 2007

(65) Prior Publication Data

US 2008/0017973 A1  Jan. 24, 2008

Related U.S. Application Data

(62) Division of application No. 10/885,138, filed on Jul. 7, 2004, now Pat. No. 7,352,052.

(30) Foreign Application Priority Data

Apr. 30, 2004  (JP) .................................. 2004-136255

(51) Int. Cl.
- H01L 23/52 (2006.01)
- H01L 23/48 (2006.01)
- H01L 29/40 (2006.01)

(52) U.S. Cl. ................. 257/774; 257/E23.174; 257/686; 257/724; 257/730; 438/109; 361/736

(58) Field of Classification Search ........... 257/E21.512, 257/E23.174, 774, 773, 700, 622, 686, 698, 257/724, 687, 730, 783; 438/107, 109; 361/736
See application file for complete search history.

(56) References Cited

U.S. PATENT DOCUMENTS

| | | | |
|---|---|---|---|
| 5,111,278 A | 5/1992 | Eichelberger | |
| 5,688,408 A | 11/1997 | Tsuru et al. | |
| 5,689,091 A | 11/1997 | Hamzehdoost et al. | |
| 5,726,493 A * | 3/1998 | Yamashita et al. | 257/698 |
| 6,121,553 A | 9/2000 | Shinada et al. | |
| 6,228,683 B1 | 5/2001 | Manteghi | |
| 6,433,420 B1 | 8/2002 | Yang et al. | |
| 6,469,374 B1 | 10/2002 | Imoto | |

(Continued)

FOREIGN PATENT DOCUMENTS

JP  63-147354  6/1988

(Continued)

OTHER PUBLICATIONS

Decision on Rejection issued by Japanese Patent Office, mailed Jun. 26, 2007, in Japanese Application No. 2004-136255 and English translation.

(Continued)

*Primary Examiner* — Chris Chu
(74) *Attorney, Agent, or Firm* — Finnegan, Henderson, Farabow, Garrett & Dunner, L.L.P.

(57) ABSTRACT

There is disclosed a semiconductor device comprising at least one semiconductor element, one chip mounting base being provided at least one first interconnection on one major surface thereof and at least one second interconnection on the other major surface thereof, and the semiconductor element being electrically connected to at least the one first interconnection and mounted on the one major surface, a sealing member being provided on the one major surface of the chip mounting base and covering the semiconductor element and the first interconnection, at least one third interconnection being provided on a surface of the sealing member, and at least one fourth interconnection being provided in the sealing member and the chip mounting base, and electrically connected to the first interconnection, the second interconnection, and the third interconnection.

13 Claims, 25 Drawing Sheets

U.S. PATENT DOCUMENTS

| | | | |
|---|---|---|---|
| 6,489,676 B2* | 12/2002 | Taniguchi et al. | 257/698 |
| 6,696,320 B2* | 2/2004 | Gacusan | 438/109 |
| 6,734,541 B2 | 5/2004 | Shimoe et al. | |
| 6,933,602 B1 | 8/2005 | Patel et al. | |
| 6,949,818 B2* | 9/2005 | Park | 257/686 |
| 6,972,481 B2 | 12/2005 | Karnezos | |
| 6,998,702 B1 | 2/2006 | Zwenger et al. | |
| 7,002,236 B2* | 2/2006 | Ito | 257/587 |
| 7,057,290 B2 | 6/2006 | Sunohara et al. | |
| 7,185,426 B1* | 3/2007 | Hiner et al. | 29/841 |
| 7,224,054 B2* | 5/2007 | Shibata | 257/684 |
| 7,242,081 B1* | 7/2007 | Lee | 257/686 |
| 7,261,596 B2* | 8/2007 | Akaike et al. | 439/607.01 |
| 7,352,052 B2* | 4/2008 | Imoto et al. | 257/622 |
| 7,548,430 B1* | 6/2009 | Huemoeller et al. | 361/760 |
| 7,569,925 B2* | 8/2009 | Nishizawa et al. | 257/700 |
| 7,615,856 B2* | 11/2009 | Sakai et al. | 257/686 |
| 7,656,031 B2 | 2/2010 | Chen et al. | 257/733 |
| 7,671,459 B2 | 3/2010 | Corisis et al. | 257/686 |
| 2002/0060361 A1* | 5/2002 | Sasaki | 257/698 |
| 2005/0045369 A1* | 3/2005 | Ishimaru et al. | 174/250 |
| 2007/0290376 A1* | 12/2007 | Zhao et al. | 257/787 |

FOREIGN PATENT DOCUMENTS

| | | |
|---|---|---|
| JP | 2-379 | 1/1990 |
| JP | 03-042864 | 2/1991 |
| JP | 05-291318 | 11/1993 |
| JP | 5-291474 | 11/1993 |
| JP | 10-284873 | 10/1998 |
| JP | 11-087560 | 3/1999 |
| JP | 11-243160 | 9/1999 |
| JP | 2000-031207 | 1/2000 |
| JP | 2001-127186 | 5/2001 |
| JP | 2001-189515 | 7/2001 |
| JP | 2001-223295 | 8/2001 |
| JP | 2002-26187 | 1/2002 |
| JP | 2002-84070 | 3/2002 |
| JP | 2002-134653 | 5/2002 |
| JP | 2002-158312 | 5/2002 |
| JP | 2002-170906 | 6/2002 |
| JP | 2002-170921 | 6/2002 |
| JP | 2002-184796 | 6/2002 |
| JP | 2002-261449 | 9/2002 |
| JP | 2002-305364 | 10/2002 |

OTHER PUBLICATIONS

Notification of Reasons for Rejection from Japanese Patent Office mailed Mar. 22, 2006, in Japanese Application No. 2004-136255, and English translation thereof.

* cited by examiner

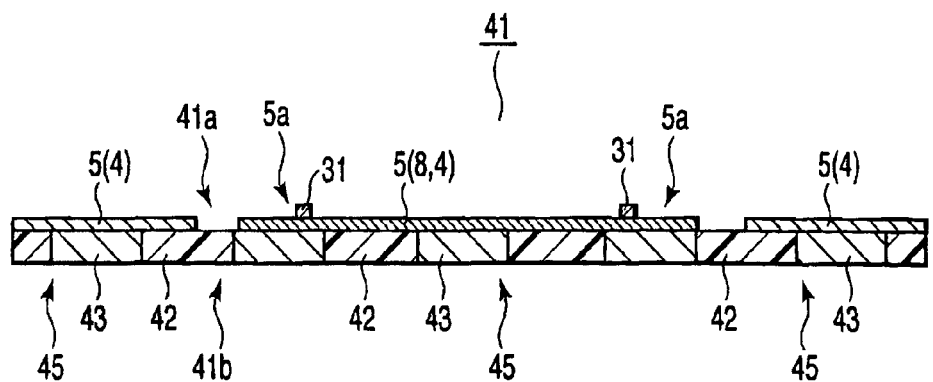
F I G. 1 2 A
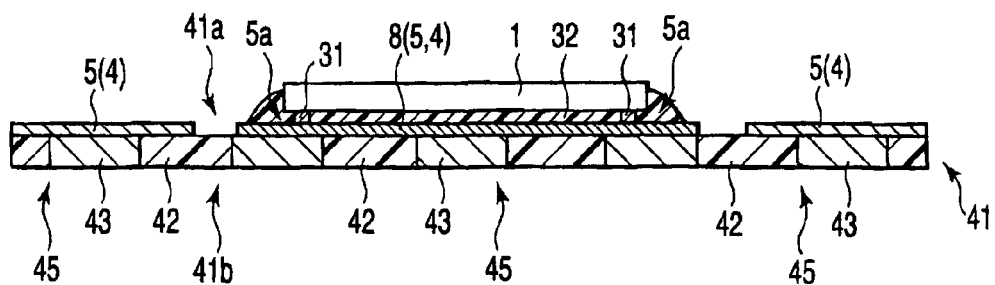
F I G. 1 2 B
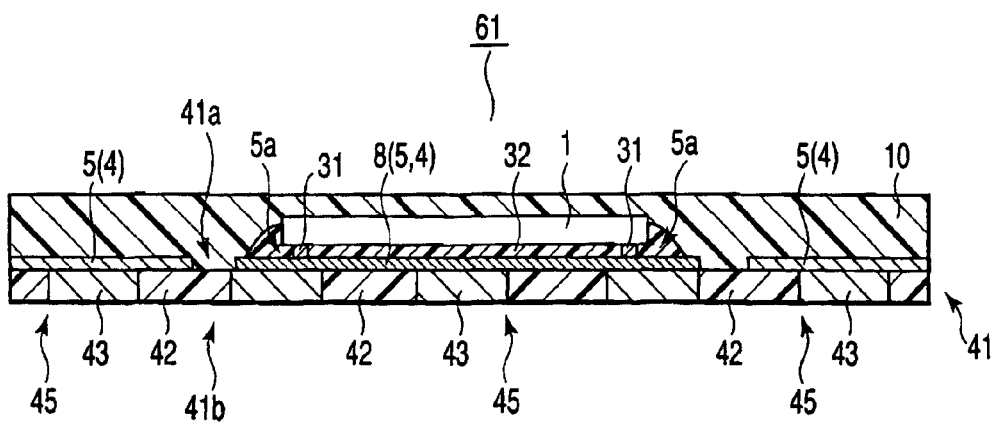
F I G. 1 2 C

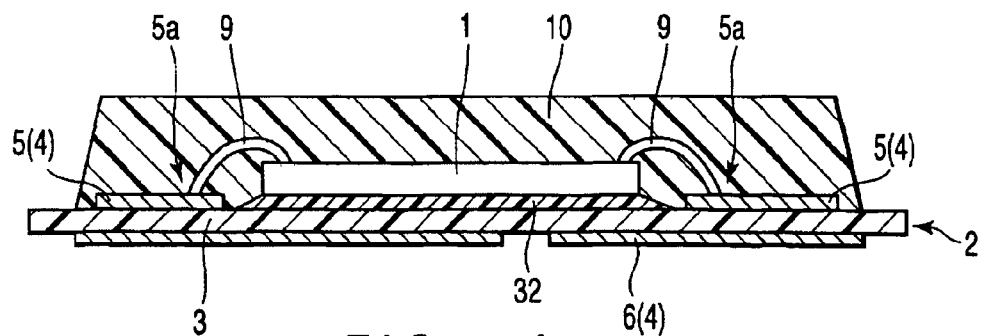
F I G. 2 2 A
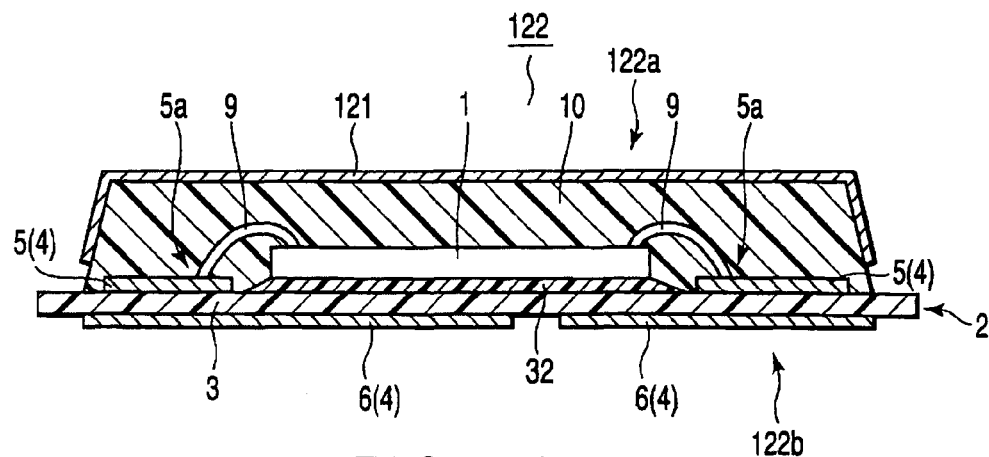
F I G. 2 2 B
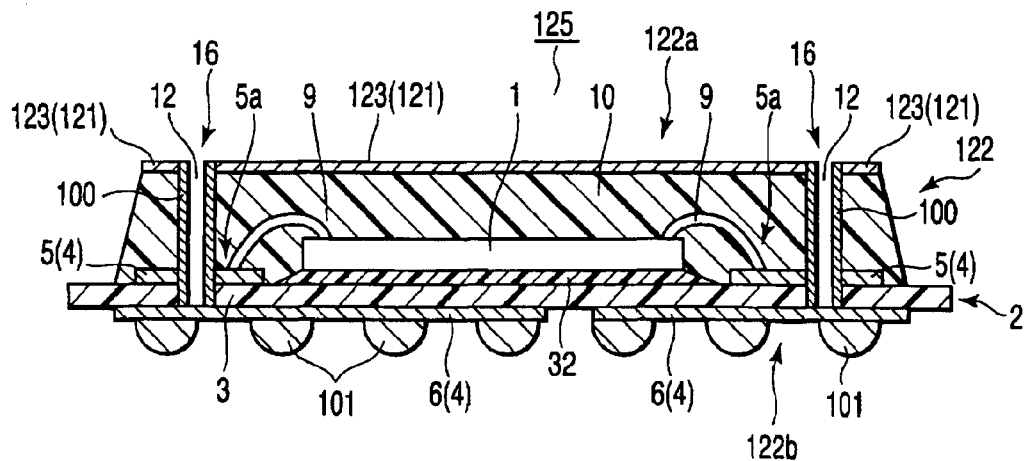
F I G. 2 2 C

SEMICONDUCTOR DEVICE AND MANUFACTURING METHOD THEREFOR

CROSS-REFERENCE TO RELATED APPLICATIONS

This is a divisional of U.S. patent application Ser. No. 10/885,138, filed Jul. 7, 2004 now U.S. Pat. No. 7,352,052, which is incorporated herein in its entirety by reference. This application is also based upon and claims priority from prior Japanese Patent Application No. 2004-136255, filed Apr. 30, 2004, the entire contents of which are incorporated herein by reference.

BACKGROUND OF THE INVENTION

1. Field of the Invention

The present invention relates to a semiconductor device packaging technique and, more particularly, to a semiconductor device having a structure in which a plurality of semiconductor elements can be stacked while electrically connected to each other, and a manufacturing method therefore.

2. Description of the Related Art

Some of semiconductor devices comprise a plurality of semiconductor chips (semiconductor elements), and these semiconductor devices are generally called multichip packages or multichip modules. Semiconductor devices having the multichip structure include chip-stacked semiconductor devices in which a plurality of semiconductor chips are stacked and mounted. In order to obtain the chip-stacked semiconductor device, there have been proposed many techniques of stacking a plurality of semiconductor devices (packages or modules) in each of which one or a plurality of semiconductor chips are mounted. These techniques are disclosed in, e.g., Jpn. Pat. Appln. KOKAI Publication Nos. 2002-134653, 2002-170906, 2002-184796, 2002-170921, and 2002-305364.

A chip-stacked multichip package (multichip module) is fabricated by stacking a plurality of semiconductor packages (semiconductor modules) by, e.g., the following fabrication method. First, packages are fabricated as individual packages for respective layers. Then, the packages are stacked into one multichip package, and a lower interconnection (lower connecting terminal) for mounting the package on a packaging substrate is provided on the lowermost package. When other electrical components and the like are to be mounted on the package, an upper interconnection (upper connecting terminal) is provided on the uppermost package. Alternatively, the lowermost package is fabricated in advance as a substrate package having a structure dedicated to package a substrate, or the uppermost package is fabricated in advance as a component package having a structure dedicated to package a component.

This technique hardly increases the production efficiency of all packages because packages are fabricated as individual packages for respective layers. The equipment cost may rise due to, for example, the necessity of assembly equipment dedicated to each package. High equipment cost increases the production cost of each package. This leads to high production cost of the whole multichip package of stacked packages and high production cost of a semiconductor device having the multichip package.

BRIEF SUMMARY OF THE INVENTION

According to an aspect of the invention, there is provided a semiconductor device comprising: at least one semiconductor element; one chip mounting base being provided at least one first interconnection on one major surface thereof and at least one second interconnection on the other major surface thereof, and the semiconductor element being electrically connected to at least the one first interconnection and mounted on the one major surface; a sealing member being provided on the one major surface of the chip mounting base and covering the semiconductor element and the first interconnection; at least one third interconnection being provided on a surface of the sealing member; and at least one fourth interconnection being provided in the sealing member and the chip mounting base, and electrically connected to the first interconnection, the second interconnection, and the third interconnection.

According to another aspect of the invention, there is provided a semiconductor device comprising: at least one semiconductor element; one chip mounting base being provided at least one first interconnection on one major surface thereof and at least one second interconnection which is electrically connected to at least the one first interconnection with extending through a base body of the chip mounting base and being exposed on the other major surface thereof, and the semiconductor element being electrically connected to at least the one first interconnection and mounted on the one major surface; a sealing member being provided on the one major surface of the chip mounting base and covering the semiconductor element and the first interconnection; at least one third interconnection being provided on a surface of the sealing member; and at least one fourth interconnection being provided in the sealing member and electrically connected to the first interconnection and the third interconnection.

According to another aspect of the invention, there is provided a semiconductor device comprising: at least one semiconductor element; at least one first interconnection which is electrically connected to the semiconductor element; a sealing member being provided with covering the semiconductor element and a connecting portion between the semiconductor element and the first interconnection and with exposing at least one end of the first interconnection; at least one second interconnection and at least one third interconnection being provided on a surface of the sealing member with facing each other and with sandwiching the semiconductor element and the first interconnection between the second interconnection and the third interconnection; and at least one fourth interconnection being provided in the sealing member and electrically connected to the first interconnection, the second interconnection, and the third interconnection.

According to another aspect of the invention, there is provided a semiconductor device comprising: a plurality of stacked semiconductor devices, wherein at least two the semiconductor devices adjacent in a stacking direction comprising: at least one semiconductor element; one chip mounting base being provided at least one first interconnection on one major surface thereof and at least one second interconnection on the other major surface thereof, and the semiconductor element being electrically connected to at least the one first interconnection and mounted on the one major surface; a sealing member being provided on the one major surface of the chip mounting base and covering the semiconductor element and the first interconnection; at least one third interconnection being provided on a surface of the sealing member; at least one fourth interconnection being provided in the sealing member and the chip mounting base, and electrically connected to the first interconnection, the second interconnection, and the third interconnection; and the second interconnections, the third interconnections, or the second interconnections and the third interconnections of at least two the semiconductor devices adjacent in a stacking direction being electrically connected.

According to another aspect of the invention, there is provided a semiconductor device comprising: a plurality of stacked semiconductor devices, wherein at least two the semiconductor devices adjacent in a stacking direction comprising; at least one semiconductor element; one chip mounting base being provided at least one first interconnection on one major surface thereof and at least one second interconnection which is electrically connected to at least the one first interconnection with extending through a base body of the chip mounting base and being exposed on the other major surface thereof, and the semiconductor element being electrically connected to at least the one first interconnection and mounted on the one major surface; a sealing member being provided on the one major surface of the chip mounting base and covering the semiconductor element and the first interconnection; at least one third interconnection being provided on a surface of the sealing member; at least one fourth interconnection being provided in the sealing member and electrically connected to the first interconnection and the third interconnection; and the second interconnections, the third interconnections, or the second interconnections and the third interconnections of at least two the semiconductor devices adjacent in a stacking direction being electrically connected.

According to another aspect of the invention, there is provided a semiconductor device comprising: a plurality of stacked semiconductor devices, wherein at least two the semiconductor devices adjacent in a stacking direction comprising; at least one semiconductor element; at least one first interconnection which is electrically connected to the semiconductor element; a sealing member being provided with covering the semiconductor element and a connecting portion between the semiconductor element and the first interconnection and with exposing at least one end of the first interconnection; at least one second interconnection and at least one third interconnection being provided on a surface of the sealing member with facing each other and with sandwiching the semiconductor element and the first interconnection between the second interconnection and the third interconnection; at least one fourth interconnection being provided in the sealing member and electrically connected to the first interconnection, the second interconnection, and the third interconnection; and the first interconnections, the second interconnections, the third interconnections, or predetermined interconnections out of the first interconnections, the second interconnections, and the third interconnections of at least two the semiconductor devices adjacent in a stacking direction being electrically connected.

According to another aspect of the invention, there is provided a semiconductor device manufacturing method comprising: electrically connecting at least one semiconductor element to at least one first interconnection and mounting the semiconductor element on one major surface of a chip mounting base in which at least the one first interconnection is provided on the one major surface and at least one second interconnection is provided on the other major surface; and providing a sealing member on the one major surface of the chip mounting base with covering the semiconductor element and the first interconnection, providing at least one third interconnection on a surface of the sealing member, and providing in the sealing member and the chip mounting base at least one fourth interconnection which is electrically connected to the first interconnection, the second interconnection, and the third interconnection.

According to another aspect of the invention, there is provided a semiconductor device manufacturing method comprising: electrically connecting at least one semiconductor element to at least one first interconnection and mounting the semiconductor element on one major surface of a chip mounting base in which at least the one first interconnection is provided on the one major surface and at least one second interconnection which is electrically connected to at least the one first interconnection is provided with extending through a base body and being exposed on the other major surface; and providing a sealing member on the one major surface of the chip mounting base with covering the semiconductor element and the first interconnection, providing at least one third interconnection on a surface of the sealing member, and providing in the sealing member at least one fourth interconnection which is electrically connected to the first interconnection and the third interconnection.

According to another aspect of the invention, there is provided a semiconductor device manufacturing method comprising: electrically connecting at least one semiconductor element to at least one first interconnection; and providing a sealing member with covering the semiconductor element and a connecting portion between the semiconductor element and the first interconnection and with exposing at least one end of the first interconnection, providing at least one second interconnection and at least one third interconnection on a surface of the sealing member with facing each other and with sandwiching the semiconductor element and the first interconnection between the second interconnection and the third interconnection, and providing in the sealing member at least one fourth interconnection which is electrically connected to the first interconnection, the second interconnection, and the third interconnection.

According to another aspect of the invention, there is provided a semiconductor device manufacturing method comprising: stacking a plurality of semiconductor devices, wherein at least two the semiconductor devices adjacent in a stacking direction being fabricated by electrically connecting at least one semiconductor element to at least one first interconnection and mounting the semiconductor element on one major surface of a chip mounting base in which at least the one first interconnection is provided on the one major surface and at least one second interconnection is provided on the other major surface; and providing a sealing member on the one major surface of the chip mounting base with covering the semiconductor element and the first interconnection, providing at least one third interconnection on a surface of the sealing member, and providing in the sealing member and the chip mounting base at least one fourth interconnection which is electrically connected to the first interconnection, the second interconnection, and the third interconnection; and electrically connecting the second interconnections, the third interconnections, or the second interconnections and the third interconnections of at least two the semiconductor devices adjacent in a stacking direction.

According to another aspect of the invention, there is provided a semiconductor device manufacturing method comprising: stacking a plurality of semiconductor devices, wherein at least two the semiconductor devices adjacent in a stacking direction being fabricated by electrically connecting at least one semiconductor element to at least one first interconnection and mounting the semiconductor element on one major surface of a chip mounting base in which at least the one first interconnection is provided on the one major surface and at least one second interconnection which is electrically connected to at least the one first interconnection is provided with extending through a base body and being exposed on the other major surface; and providing a sealing member on the one major surface of the chip mounting base with covering the semiconductor element and the first interconnection, providing at least one third interconnection on a surface of the sealing member, and providing in the sealing member at least one fourth interconnection which is electrically connected to the first interconnection and the third interconnection; and electrically connecting the second interconnections, the third interconnections, or the second interconnections and the third interconnections of at least two the semiconductor devices adjacent in a stacking direction.

According to a further aspect of the invention, there is provided a semiconductor device manufacturing method comprising: stacking a plurality of semiconductor devices, wherein at least two the semiconductor devices adjacent in a stacking direction being fabricated by electrically connecting at least one semiconductor element to at least one first interconnection; and providing a sealing member with covering the semiconductor element and a connecting portion between the semiconductor element and the first interconnection and with exposing at least one end of the first interconnection, providing at least one second interconnection and at least one third interconnection on a surface of the sealing member with facing each other and with sandwiching the semiconductor element and the first interconnection between the second interconnection and the third interconnection, and providing in the sealing member at least one fourth interconnection which is electrically connected to the first interconnection, the second interconnection, and the third interconnection; and electrically connecting the first interconnections, the second interconnections, the third interconnections, or predetermined interconnections out of the first interconnections, the second interconnections, and the third interconnections of at least two the semiconductor devices adjacent in a stacking direction.

BRIEF DESCRIPTION OF THE SEVERAL VIEWS OF THE DRAWING

FIGS. 12A to 12C are sectional views respectively showing steps in a semiconductor device manufacturing method according to the fifth embodiment;

FIGS. 22A to 22C are sectional views respectively showing steps in a semiconductor device manufacturing method according to the 10th embodiment;

DETAILED DESCRIPTION OF THE INVENTION

Figure 1A:
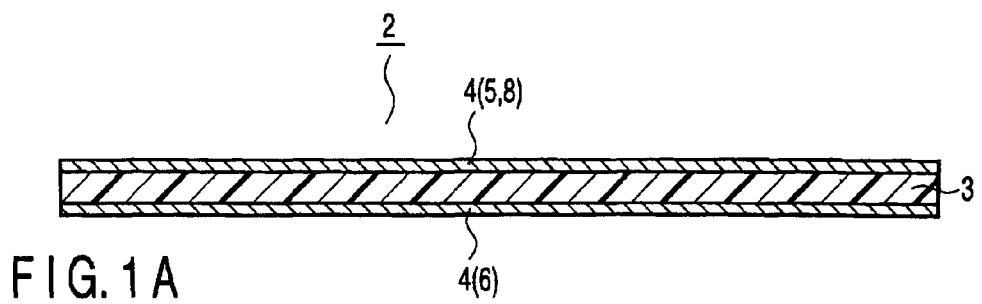
FIGS. 1A to 1E are sectional views respectively showing steps in a semiconductor device manufacturing method according to the first embodiment.

Preferred embodiments according to the present invention will be described below with reference to the several views of the accompanying drawing.

First Embodiment

The first embodiment according to the first embodiment will be described with reference to FIGS. 1A to 3C. FIGS. 1A to 3C are sectional views respectively showing steps in a semiconductor device manufacturing method according to the first embodiment.

In the first embodiment, interconnection layers are provided not only on the non-chip mounting surface (lower surface) of a chip mounting base but also the surface layer (upper surface) of a sealing resin in a semiconductor package (semiconductor device) in which, for example, a semiconductor chip on the chip mounting base is sealed with a resin. More specifically, interconnection layers are provided on the upper and lower (front and back) sides of the semiconductor package. This structure allows easily packaging commercially available existing semiconductor-package, passive components, and the like on the semiconductor package of the first embodiment while mounting the semiconductor package on another packaging base. A semiconductor device and a manufacturing method therefor according to this embodiment will be described in detail with reference to the several views of the drawing.

As shown in FIG. 1A, one chip mounting base (chip mounting substrate or chip packaging base) 2 on which at least one semiconductor element semiconductor chip) 1 is to be mounted (packaged) on one major surface is prepared. In the first embodiment, a flexible base 2 whose base body 3 is made from a soft (flexible) material is adopted as the chip mounting base. The base body 3 of the flexible base 2 is formed from a tape of polyimide, glass epoxy, BT resin, or the like. Conductors 4 each including at least one conductive layer (metal layer) are provided on the base body 3, and cover the front and back (upper and lower) major surfaces of the base body 3. More specifically, each of the two conductors 4 is formed from one copper foil layer (Cu foil or Cu layer). The flexible base 2 having this structure is called a double-sided copper-clad tape. The copper foils 4 serve as a first interconnection 5 and second interconnection 6 (to be described later).

Figure 1B:
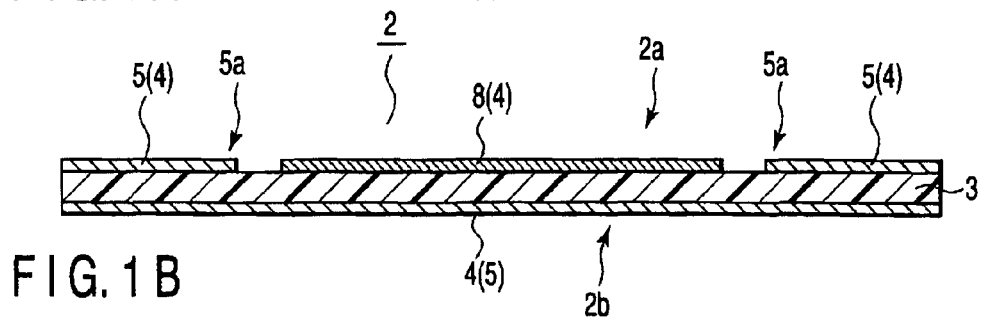

As shown in FIG. 1B, at least one first interconnection 5 is formed on a chip mounting surface 2a serving as a major surface on which the semiconductor chip 1 of the flexible base 2 is to be mounted. At the same time, a chip mount die pad 8 for mounting the semiconductor chip 1 is formed on the chip mounting surface 2a of the flexible base 2. In the first embodiment, a plurality of first interconnections 5 are formed on the chip mounting surface 2a. The first interconnections 5 form internal interconnections of a semiconductor device 20 according to the first embodiment together with a fourth interconnection 15 (to be described later).

At least one of the first interconnections 5 serves as a chip interconnection which is electrically connected to the semiconductor chip 1. In other words, not all the first interconnections 5 are formed as chip interconnections. Some of the first interconnections 5 may not be electrically connected to the semiconductor chip 1. For example, although not shown, a first interconnection 5 which is not connected to the semiconductor chip 1 may be formed as a so-called dummy interconnection. Alternatively, a first interconnection 5 which is not connected to the semiconductor chip 1 may be formed as part of a so-called relay interconnection for electrically connecting, without the mediacy of the semiconductor chip 1, external devices or other components connected to the semiconductor device 20 via the second interconnection 6 and a third interconnection 13 (to be described later). In the following description, the first interconnections 5 are simply explained as chip interconnections, unless otherwise specified. FIGS. 1B to 1E, 2A to 2C, and 3A to 3C show, of a plurality of first interconnections 5, only chip interconnections 5 which are electrically connected to the semiconductor chip 1.

The chip interconnections 5 and chip mount die pad 8 are formed by etching the Cu foil 4 on the chip mounting surface 2a. More specifically, a photoresist (not shown) is applied with a predetermined pattern onto the surface of the Cu foil 4 on the chip mounting surface 2a, and then exposed. Accordingly, a resist mask (not shown) is formed on the surface of the Cu foil 4 on the chip mounting surface 2a. The photoresist pattern is determined in accordance with the layout of one or a plurality of connecting pads (electrodes or terminals: not shown) of the semiconductor chip (silicon element) 1 to be mounted on the flexible base 2. After that, the Cu foil 4 on the chip mounting surface 2a undergoes etching, development, or the like, leaving the Cu foil 4 with a predetermined pattern. As a result, a plurality of chip interconnections 5 with the predetermined pattern are formed on the chip mounting surface 2a of the flexible base 2. The chip interconnections (first interconnections) 5 are formed by patterning the Cu foil 4 on the chip mounting surface 2a of the flexible base 2 into a predetermined pattern. That is, the chip interconnections (first interconnections) 5 are substantially part of the Cu foil 4 provided in advance on the chip mounting surface 2a of the flexible base 2.

The chip interconnections 5 electrically connect the semiconductor chip 1, at least one second interconnection 6 (to be described later), and at least one third interconnection 13 (to be described later) together with at least one fourth interconnection 15 in a predetermined pattern. As will be described later, the second and third interconnections 6 and 13 form external interconnections (external terminals) of the semiconductor device 20. Part of the chip interconnection 5 has a pad connecting portion (contact) 5a to which each pad of the semiconductor chip 1 is to be electrically connected.

In etching for forming the chip interconnections 5, the surface of the Cu foil 4 on a major surface of the flexible base 2 opposite to the chip mounting surface 2a is entirely covered with a mask (not shown). That is, the mask entirely covers the surface of the Cu foil 4 on a non-chip mounting surface 2b serving as a major surface of the flexible base 2 on which no semiconductor chip 1 is mounted. The Cu foil 4 on the non-chip mounting surface 2b serves as the second interconnection 6 (to be described later).

Figure 1C:
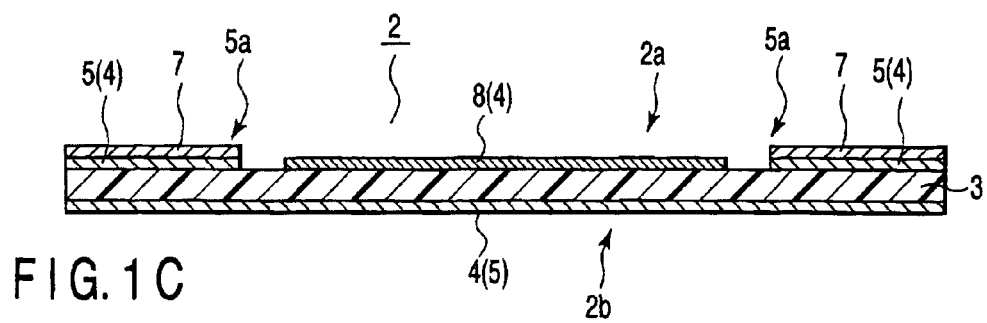

As shown in FIG. 1C, a predetermined process is done on at least the surfaces of the pad connecting portions 5a of the chip interconnections 5. The surface treatment is a proper one corresponding to the packaging method of the semiconductor chip 1 on the flexible base 2, such as wire bonding or flip chip connection. In the first embodiment, the semiconductor chip 1 is electrically connected to the chip interconnections 5 by wire bonding, and mounted on the flexible base 2. In this case, the surfaces of the pad connecting portions 5a of the chip interconnections 5 are plated with nickel (Ni) and gold (Au). That is, Ni/Au-plating portions 7 are provided on the surfaces of the pad connecting portions 5a.

Figure 1D:
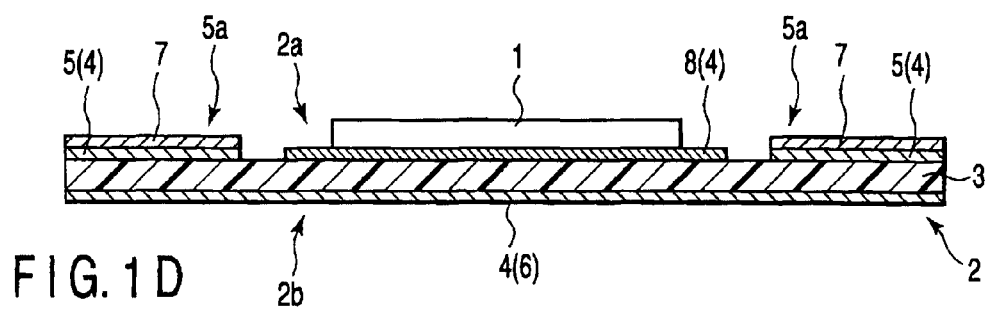

As shown in FIG. 1D, at least one semiconductor chip 1 is mounted on the flexible base 2. In the first embodiment, one semiconductor chip 1 is attached to, of the Cu foil 4 on the chip mounting surface 2a, a portion (region) serving as the chip mount die pad 8 for mounting the semiconductor chip 1. The semiconductor chip 1 is adhered (bonded) to the chip mount die pad 8 with an adhesive (not shown) such as an epoxy resin, and mounted on the flexible base 2.

Figure 1E:
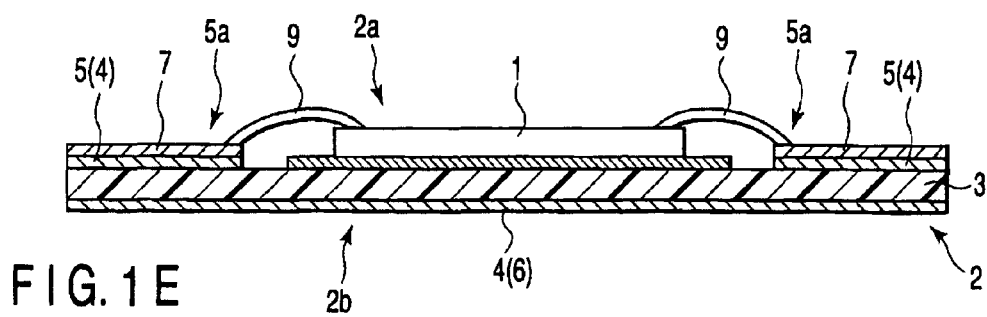

As shown in FIG. 1E, the semiconductor chip 1 is electrically connected to the chip interconnections 5 by wire bonding. More specifically, a plurality of gold bonding wires (Au bonding wires) 9 are connected to the connecting pads of the semiconductor chip 1. At the same time, the Au bonding wires 9 are connected to the Ni/Au-plating portions 7 on the pad connecting portions 5a of the chip interconnections 5. Consequently, the semiconductor chip 1 is electrically connected to the chip interconnections 5 via the Ni/Au-plating portions 7. The Au bonding wires 9 are bonded to the connecting pads of the semiconductor chip 1 and the Ni/Au-plating portions 7 by, e.g., ultrasonic bonding.

After one semiconductor chip 1 is mounted on the chip mount die pad 8, at least one semiconductor chip 1 can also be stacked on the semiconductor chip 1 and connected to the chip interconnections 5 by wire bonding. In this case, the semiconductor device 20 can be formed as a multichip package (multichip module). A semiconductor device having this structure and a manufacturing method therefor will be described in detail in the seventh embodiment.

Figure 2A:
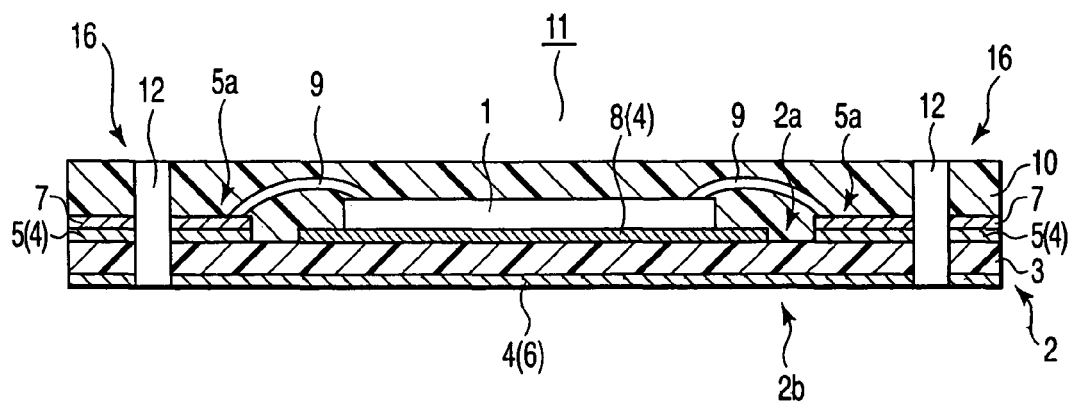
FIGS. 2A to 2C are sectional views respectively showing steps in the semiconductor device manufacturing method according to the first embodiment.

As shown in FIG. 2A, a sealing member 10 is provided on the chip mounting surface 2a of the flexible base 2. More specifically, the sealing member 10 is provided on the chip mounting surface 2a of the flexible base 2, and covers the semiconductor chip 1, chip interconnections 5 (pad connecting portions 5a), Ni/Au-plating portions 7, chip mount die pad 8, Au bonding wires 9, and the like. The sealing member 10 seals at least the semiconductor chip 1 and the pad connecting portions 5a serving as connecting portions between the semiconductor chip 1 and the chip interconnections 5. Sealing is non-airtight sealing (non-hermetic sealing) such as injection molding or transfer molding. In the first embodiment, the sealing member 10 is provided on the chip mounting surface 2a of the flexible base 2 by transfer molding. As the sealing member 10, a resin mixture of an epoxy resin and silica filler is used. The above steps fabricate a resin-sealed package (mold-sealed package) 11 comprised of the semiconductor chip 1, flexible base 2, sealing resin 10, and the like. The resin-sealed package 11 is a main building component of the semiconductor device 20 according to the first embodiment.

As shown in FIG. 2A, at least one fourth interconnection recess (hole or aperture) 12 for providing the fourth interconnection 15 is formed in the resin-sealed package 11. In the first embodiment, a plurality of fourth interconnection recesses 12 are formed in the resin-sealed package 11 in order to provide a plurality of fourth interconnections 15 in the resin-sealed package 11. The fourth interconnections 15 form internal interconnections of the semiconductor device 20 together with the chip interconnections 5. At least one of the fourth interconnections 15 electrically connects at least one chip interconnection (first interconnection) 5, at least one second interconnection 6, and at least one third interconnection 13. That is, at least one fourth interconnection 15 electrically connects, together with at least one chip interconnection 5, at least one second interconnection 6 and at least one third interconnection 13 which form external interconnections (external terminals) of the semiconductor device 20.

In the first embodiment, of the fourth interconnections 15, at least fourth interconnections 15 which are electrically connected to the semiconductor chip 1 are electrically connected to the second and third interconnections 6 and 13 at once along the direction of thickness of the resin-sealed package 11. For this purpose, the recesses 12 for providing the fourth interconnections 15 to be electrically connected to the semiconductor chip 1 are formed at positions where the recesses 12 extend through the chip interconnections 5, second interconnections 6, and third interconnections 13 at once along the direction of thickness of the resin-sealed package 11. Of the recesses 12, at least recesses 12 for providing the fourth interconnections 15 to be electrically connected to the semiconductor chip 1 are formed as through holes (via holes) which extend through the resin-sealed package 11 at once along the direction of thickness.

Although not shown, recesses for providing the fourth interconnections 15 not connected to the semiconductor chip 1 can also be formed as through holes (via holes) which extend through the resin-sealed package 11 at once along the direction of thickness. By forming all the fourth interconnection recesses 12 as through holes, the step of forming the fourth interconnection recesses 12 can be simplified (unified) regardless of the connection states between the semiconductor chip 1 and the fourth interconnections 15. This can increase the manufacturing efficiency of the semiconductor device 20. In the following description, portions at which the fourth interconnections 15 to be electrically connected to the semiconductor chip 1 are electrically connected at once to the chip interconnections 5, second interconnections 6, and third interconnections 13 will be called interconnection connecting portions 16.

The through holes 12 formed at the interconnection connecting portions 16 extend through the sealing resin 10, the Ni/Au-plating portions 7, the pad connecting portions 5a (chip interconnections 5), the base body 3 of the flexible base 2, and the Cu foil 4 on the nom-chip mounting surface 2b of the flexible base 2 at once along the direction of thickness of them. The through holes are formed with a drill (not shown) or the like. The diameter of each through hole 12 is set to about 50 μm to 400 μm.

Figure 2B:
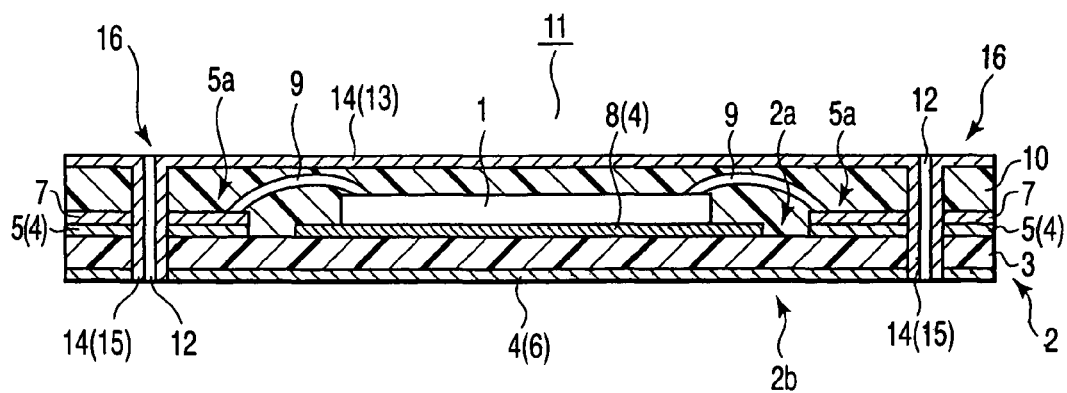

As shown in FIG. 2B, a conductor (conductive layer) 14 serving as the third interconnection 13 and a conductor 14 serving as the fourth interconnection 15 are respectively provided on the surface of the sealing resin 10 and the inner wall surfaces of the through holes 12. In the first embodiment, the conductor 14 serving as the third interconnection 13 and the conductor 14 serving as the fourth interconnection 15 are integrally provided at once. More specifically, the residue in each through hole 12 is removed (desmeared). A Cu conductive layer (electroless Cu layer) about 0.01 μm to 1 μm thick is entirely provided on the surface of the sealing resin 10 and the inner wall surfaces of the through holes 12 by electroless plating. Subsequently, a Cu conductive layer (electrolytic Cu layer) about 1 μm to 30 μm thick is entirely provided on the surface of the electroless Cu layer by electrolytic plating. The electrolytic Cu layer is integrally provided on the electroless Cu layer by using the electroless Cu layer as a seed layer (underlayer). Accordingly, one Cu layer 14 serving as the third interconnection 13 and one Cu layer 14 serving as the fourth interconnection 15 are provided at once integrally on the surface of the sealing resin 10 and the inner wall surfaces of the through holes 12. The Cu layer 14 provided on the inner wall surface of each through hole 12 is directly used as the fourth interconnection 15.

In the first embodiment, the thickness of the electrolytic Cu layer is properly set to an appropriate size in accordance with the diameter of each through hole 12 so as not to fill the through hole 12. In a series of plating steps, the surface of the Cu foil 4 on the non-chip mounting surface 2b of the flexible base 2 is entirely kept covered with the above-mentioned mask applied in forming the chip interconnections 5.

As described above, in the first embodiment, the Cu layer (conductor) 14 serving as the third interconnection 13 is provided on the surface of the sealing resin 10 by successively executing electroless plating and electrolytic plating. However, the method of providing the Cu layer 14 is not limited to plating. When the adhesion strength between the third interconnection 13 and the sealing resin 10 must be increased, the conductor 14 is provided integrally with the sealing resin 10 at once in the step of providing the sealing resin 10. For example, although not shown, a copper foil (Cu foil) having undergone a mat process is set in the cavity of an upper mold facing the upper surface of the semiconductor package, and then transfer molding is performed. It is also effective to perform hot lamination for a resined Cu foil prepared by coating a Cu foil with an epoxy resin, BT resin, or the like in molding. By these sealing steps, the copper foil can be provided at once integrally with the sealing resin while the adhesion strength between the copper foil serving as the third interconnection 13 and the sealing resin is increased. A semiconductor device having this structure and a manufacturing method therefor will be described in detail in the eighth and ninth embodiments.

As described above, the fourth interconnections 15 (Cu layer 14) formed at the interconnection connecting portions 16 in the through holes 12 which extend through the resin-sealed package 11 along the direction of thickness are integrated with the Cu layer 14 serving as the third interconnection 13 on the surface of the sealing resin 10. Also, the fourth interconnections 15 formed at the interconnection connecting portions 16 in the through holes 12 extend through the chip interconnections (first interconnections) 5 formed on the chip mounting surface 2a of the flexible base 2, and are electrically connected to them. The fourth interconnections 15 formed at the interconnection connecting portions 16 are electrically connected to the Cu foil 4 serving as the second interconnection 6 on the non-chip mounting surface 2b of the flexible base 2. In other words, the fourth interconnections 15 are provided as so-called through plugs (via plugs) in the resin-sealed package 11. As shown in FIG. 2B, the semiconductor chip 1 in the resin-sealed package 11 is electrically connected to the second and third interconnections 6 and 13 as external interconnections via the through plugs 15 and chip interconnections 5 serving as internal interconnections, and the like.

Also as described above, the through plugs 15 formed at the interconnection connecting portions 16 are electrically connected to the semiconductor chip 1. However, all the through plugs 15 need not necessarily be electrically connected to the semiconductor chip 1. Similar to the first interconnections 5 described above, some of the through plugs 15 may not be electrically connected to the semiconductor chip 1.

For example, although not shown, a plurality of semiconductor devices 20 are stacked, and adjacent semiconductor devices 20 are electrically connected to each other via the second and third interconnections 6 and 13. In this case, some of through plugs 15 provided in a semiconductor device 20 of a predetermined layer may be disconnected from a semiconductor chip 1 (chip interconnections 5) of the predetermined layer, and formed on an energization path (interconnection) electrically connected to a semiconductor chip 1 of another layer adjacent to the predetermined layer. Alternatively, through plugs 15 in semiconductor devices 20 of respective layers may be formed on energization paths which electrically connect semiconductor chips 1 of the respective layers every other layer. Also, external devices and external components are electrically connected to the semiconductor device 20 via the second and third interconnections 6 and 13, or the semiconductor device 20 is packaged on a substrate. In these cases, some of through plugs 15 in the semiconductor device 20 may be disconnected from the semiconductor chip 1, and formed on an energization path electrically connected to the external devices, external components, or substrate.

In this manner, all the through plugs 15 need not necessarily be electrically connected to the semiconductor chip 1. Similar to the first interconnections 5 described above, a through plug 15 which is not connected to the semiconductor chip 1 may be formed as a dummy plug which forms part of a dummy interconnection. Alternatively, a through plug 15 which is not connected to the semiconductor chip 1 may be formed as a relay plug for electrically connecting, without the mediacy of the semiconductor chip 1, external devices or other components connected to the semiconductor device 20 via the second and third interconnections 6 and 13. In the following description, the through plugs 15 are simply explained as through plugs which are electrically connected to the semiconductor chip 1, unless otherwise specified. FIGS. 2B, 2C, and 3A to 3C show, of a plurality of through plugs 15, only through plugs 15 which are provided at the interconnection connecting portions 16 and electrically connected to the semiconductor chip 1.

Figure 2C:
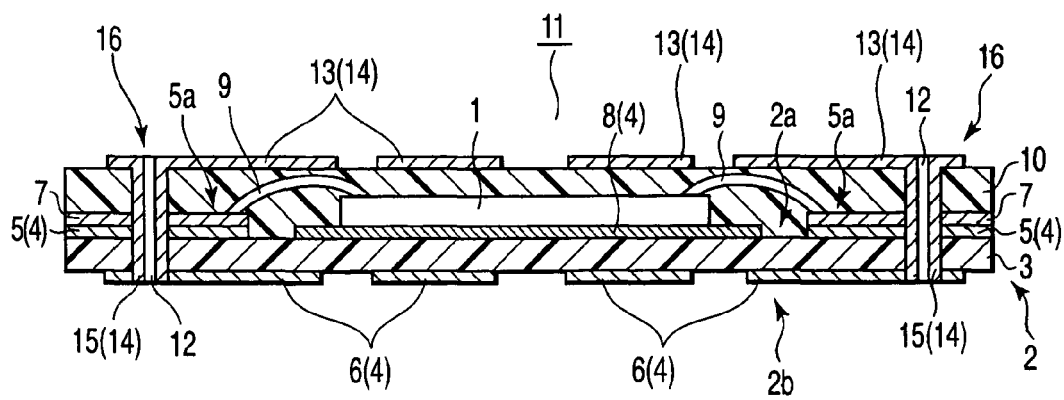

As shown in FIG. 2C, at least one second interconnection 6 is formed on the non-chip mounting surface 2b of the flexible base 2. At the same time, at least one third interconnection 13 is formed on the surface of the sealing resin 10. In the first embodiment, pluralities of second and third interconnections 6 and 13 are formed. The second and third interconnections 6 and 13 are formed by the same method as that of forming the first interconnections (chip interconnections) 5 described above.

Formation of the second interconnections 6 will be explained. As described above, upon the completion of forming the through plugs 15 in the resin-sealed package 11, the surface of the Cu foil 4 on the non-chip mounting surface 2b is entirely covered with the mask applied in forming the chip interconnections 5. First, the mask which covers the surface of the Cu foil 4 on the non-chip mounting surface 2b is peeled. Subsequently, a photoresist (not shown) is applied with a predetermined pattern onto the surface of the Cu foil 4 on the non-chip mounting surface 2b, and exposed. As a result, a resist mask (not shown) is formed on the surface of the Cu foil 4 on the non-chip mounting surface 2b. The photoresist pattern is determined in accordance with the positions of the through plugs 15, the connecting positions of an external device, external component, and the like which are to be electrically connected to the second interconnections 6. Thereafter, the Cu foil 4 on the non-chip mounting surface 2b undergoes etching, development, or the like, leaving the Cu foil 4 with a predetermined pattern. A plurality of second interconnections 6 with the predetermined pattern are formed on the non-chip mounting surface 2b of the flexible base 2.

The second interconnections 6 are formed by patterning the Cu foil 4 on the non-chip mounting surface 2b of the flexible base 2 into a predetermined pattern. That is, the second interconnections 6 are substantially part of the Cu foil 4 provided in advance on the non-chip mounting surface 2b of the flexible base 2.

Formation of the third interconnections 13 will be explained. Similar to formation of the second interconnections 6, a photoresist (not shown) is applied with a predetermined pattern onto the surface of the Cu layer 14 on the sealing resin 10, and exposed. A resist mask (not shown) is formed on the surface of the Cu layer 14 on the sealing resin 10. The photoresist pattern is determined in accordance with the positions of the through plugs 15, the connecting positions of an external device, external component, and the like which are to be electrically connected to the third interconnections 13. The Cu layer 14 on the sealing resin 10 undergoes etching, development, or the like, leaving the Cu layer 14 with a predetermined pattern. A plurality of third interconnections 13 are formed as surface layer interconnections (surface layer terminals) with the predetermined pattern on the sealing resin 10. In this way, the third interconnections 13 are formed by patterning the Cu layer 14 on the surface of the sealing resin 10 into a predetermined pattern. That is, the third interconnections 13 are substantially part of the Cu layer 14 provided on the surface of the sealing resin 10. The step of forming the third interconnections 13 may be executed at the same time as the step of forming the second interconnections 6.

As shown in FIG. 2C, the second and third interconnections 6 and 13 serve as external interconnections (external terminals) of the semiconductor device 20. As described above, when a plurality of semiconductor devices 20 are to be electrically connected and stacked, they are electrically connected via at least either the second interconnections 6 or third interconnections 13 of the semiconductor devices 20. Similarly, when the semiconductor device 20 is packaged on an external substrate or another semiconductor package, external device, external component, or the like is electrically connected to the semiconductor device 20, the second and third interconnections 6 and 13 function as external interconnections (external connecting terminals). At this time, the semiconductor device 20 may be connected to another semiconductor device 20, packaging substrate, or external device via either the second interconnections 6 or third interconnections 13. In other words, either the second interconnections 6 or third interconnections 13 may be used as package mounting interconnections (terminals), external device connecting interconnections (terminals), component mounting interconnections (terminals), substrate packaging interconnections (terminals), or the like.

Similarly, either the flexible base 2 or sealing resin 10 of the semiconductor device 20 may face up or down. That is, either the second interconnections 6 or third interconnections 13 may be used as upper interconnections (upper terminals) or lower interconnections (lower terminals). Also, the semiconductor device 20 may use a major surface on either the flexible base 2 side or sealing resin 10 side as a front surface or back surface. In other words, either the second interconnections 6 or third interconnections 13 may be used as front-surface interconnections (front-surface terminals) or back-surface interconnections (back-surface terminals).

As shown in FIG. 2C, some of the second and third interconnections 6 and 13 are electrically connected to the semiconductor chip 1 via the through plugs (fourth interconnections) 15 and chip interconnections (first interconnections) 5. However, similar to the chip interconnections 5 and through plugs 15 described above, all the second and third interconnections 6 and 13 need not necessarily be electrically connected to the semiconductor chip 1. Some of the second and third interconnections 6 and 13 may not be connected to the semiconductor chip 1. For example, similar to the chip interconnections 5 and through plugs 15 described above, second and third interconnections 6 and 13 which are not connected to the semiconductor chip 1 may be formed as dummy interconnections. Alternatively, second and third interconnections 6 and 13 which are not connected to the semiconductor chip 1 may be formed as part of a relay interconnection for electrically connecting, without the mediacy of the semiconductor chip 1, external devices or other components connected to the semiconductor device 20, together with through plugs 15 which are not connected to the semiconductor chip 1.

Figure 3A:
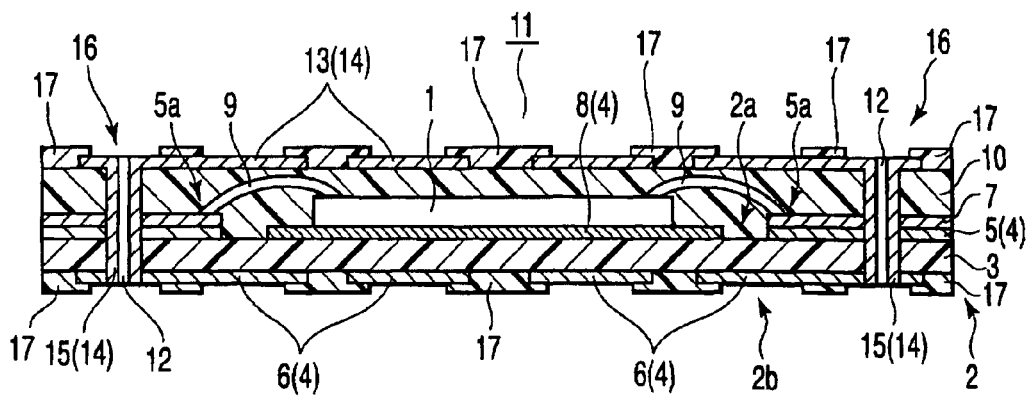
FIGS. 3A to 3C are sectional views respectively showing steps in the semiconductor device manufacturing method according to the first embodiment.

As shown in FIG. 3A, a solder resist 17 is applied with a predetermined pattern onto the non-chip mounting surface 2b of the flexible base 2 having a plurality of second interconnections 6. The solder resist 17 is also applied with a predetermined pattern onto the surface of the sealing resin 10 having a plurality of third interconnections 13. Although not shown, if necessary, predetermined surface treatment such as Ni/Au plating or corrosion prevention is performed for interconnections serving as package mounting terminals out of the second and third interconnections 6 and 13.

Figure 3B:
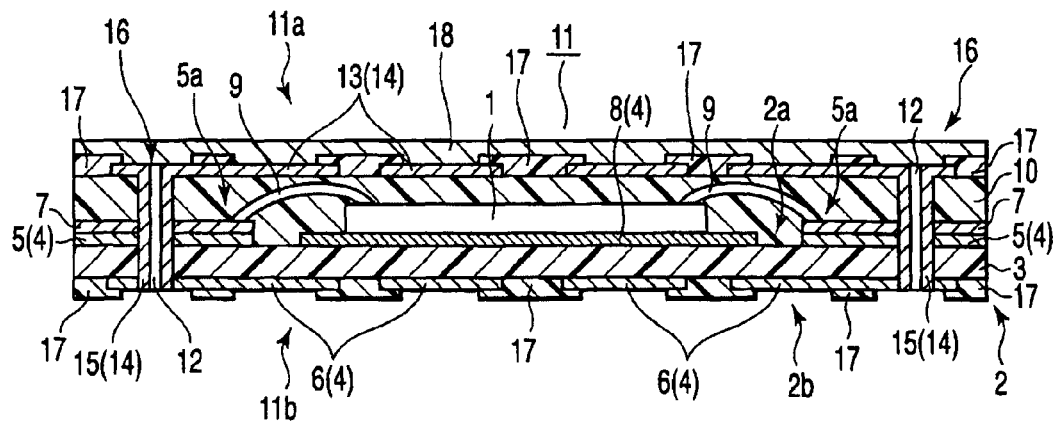

As shown in FIG. 3B, a connecting conductive member 18 for electrically connecting an external component and the like to the third interconnections 13 is provided on the major surface of the resin-sealed package 11 on the sealing resin 10 side. In the first embodiment, a solder paste 18 is used as the connecting conductive member. In the first embodiment, the major surface of the resin-sealed package 11 on the sealing resin 10 side is designed as a package mounting surface (external device connecting surface or component mounting surface) 11a. That is, in the first embodiment, the solder paste 18 serving as a connecting conductive member is applied onto the package mounting surface 11a of the resin-sealed package 11. The solder paste 18 is screen-printed over, e.g., the third interconnections 13 and solder resist 17, and entirely provided on the package mounting surface 11a of the resin-sealed package 11. The method of providing the connecting conductive member 18 is not limited to screen printing. For example, although not shown, solder balls of PbSn, SnAg, or the like may be mounted as the connecting conductive member 18 on surfaces of the third interconnections 13 that are exposed from the solder resist 17.

When the major surface of the resin-sealed package 11 on the sealing resin 10 side is designed as the package mounting surface 11a, the major surface of the resin-sealed package 11 on the flexible base 2 side can be used as a substrate packaging surface 11b. In this case, although not shown, a plurality of solder balls of PbSn, SnAg, or the like are mounted as connecting conductive members on the surface of the substrate packaging surface 11b of the resin-sealed package 11, as needed. At least some of the solder balls suffice to be in contact with (bonded to) the second interconnections 6.

Figure 3C:
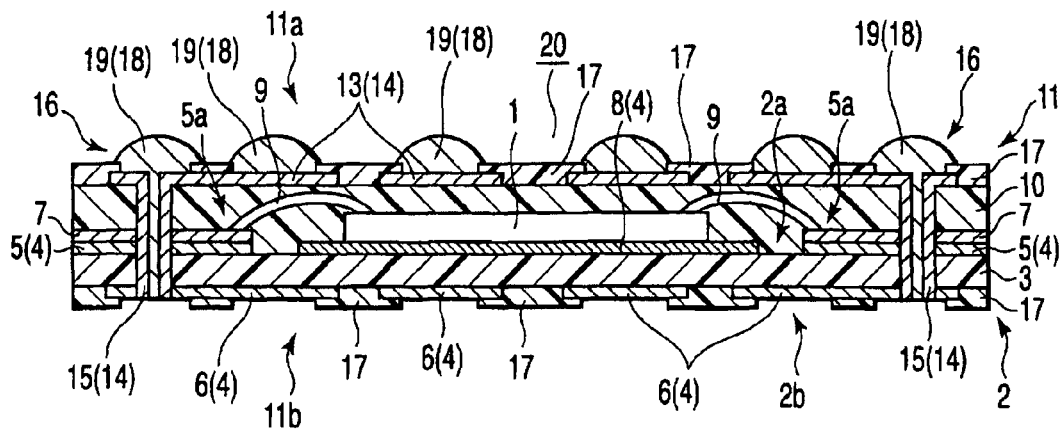

As shown in FIG. 3C, solder layers 19 are formed on the package mounting surface 11a of the resin-sealed package 11. More specifically, the solder paste 18 on the package mounting surface 11a of the resin-sealed package 11 is reflowed to form the solder layers 19 over surfaces of the third interconnections 13 that are exposed from the solder resist 17. In the first embodiment, the solder layers 19 about 50 μm to 0.3 mm thick are formed on the surfaces of the third interconnections 13. At this time, the interiors of the through holes 12 having the through plugs 15 are filled with the solder layers 19. Although not shown, if necessary, predetermined surface treatment is done for the second interconnections 6 on the substrate packaging surface 11b serving as the non-package mounting side of the resin-sealed package 11. For example, if necessary, the surfaces of the second interconnections 6 serving as substrate packaging terminals undergo a process such as corrosion prevention or Ni/Au plating which makes the solder easily wet and makes it difficult to form an unfused oxide film on the surfaces of the second interconnections 6 at a high-temperature test.

In the above description, the resin-sealed package 11 is fabricated as a single package for easy understanding of the contents of the first embodiment. However, although not shown, a plurality of resin-sealed packages 11 are fabricated at once in an actual manufacturing process. An assembly of the resin-sealed packages 11 fabricated at once by the above steps is cut from a tape into individual packages by dicing or the like. Although not shown, various tests to inspect whether the resin-sealed package 11 can be actually used as a product are executed for each resin-sealed package 11 under various environments such as low temperatures or high temperatures. Resin-sealed packages 11 which have passed these tests are determined as nondefectives. As a result, a desired semiconductor device 20 according to the first embodiment having the structure shown in FIG. 3C as a main building component is obtained.

That is, the semiconductor device 20 is built by the resin-sealed package 11. The resin-sealed package 11 comprises a plurality of Cu interconnections (third interconnections) 13 serving as package mounting terminals (package mounting interconnections) on the package mounting surface 11a of the resin-sealed package 11, and a plurality of Cu interconnections (second interconnections) 6 serving as substrate packaging terminals (substrate packaging interconnections) on the substrate packaging surface 11b of the resin-sealed package 11. One semiconductor chip 1 which is wire-bonded to a plurality of Cu chip interconnections (first interconnections) 5 on the chip mounting surface 2a of the chip mounting base 2 and mounted on the chip mounting base 2 is connected to the Cu interconnections 6 and 13 via a plurality of Cu through plugs (fourth interconnections) 15 which extend through the Cu chip interconnections 5 and resin-sealed package 11 along the direction of thickness.

If necessary, predetermined external devices (not shown) such as a passive component are mounted on the package mounting surface 11a of the semiconductor device 20. Also, if necessary, a packaging substrate (not shown) is packaged on the substrate packaging surface 11b of the semiconductor device 20.

In the first embodiment, although not shown, a semiconductor device (multichip package or multichip module) can be fabricated as a multilayered member by stacking a plurality of semiconductor devices 20 each serving a basic constitutional unit. In this case, each semiconductor device 20 can be called a single chip package (single chip module) in comparison with a multichip package serving as a multilayered member. A multichip package prepared by stacking a plurality of single chip packages 20 will be described in detail in the second embodiment with reference to the drawing.

As described above, the first embodiment can fabricate the semiconductor device 20 in which the second and third interconnections 6 and 13 are provided on upper and lower (front and back) major surfaces, as externals interconnections electrically connected to the semiconductor chip 1. A packaging substrate and external devices such as a passive component can be connected to either the flexible base 2 or sealing resin 10 of the semiconductor device 20 by properly forming the interconnection patterns of the second and third interconnections 6 and 13 and those of the first and fourth interconnections 5 and 15 serving as internal interconnections into appropriate shapes. The interconnection patterns of the second and third interconnections 6 and 13 and those of the first and fourth interconnections 5 and 15 can be properly formed into appropriate shapes in accordance with the specifications of the substrate, external devices, and the like. This allows packaging the semiconductor devices 20 on various general-purpose substrates which are commercially available, and connecting to the semiconductor devices 20 various general-purpose external devices which are commercially available. To fabricate a multichip package by stacking a plurality of semiconductor devices 20, the interconnection patterns of the first to fourth interconnections 5, 6, 13, and 15 are properly formed into appropriate shapes in accordance with the connection state with adjacent semiconductor devices 20, which will be explained in detail in the second embodiment. The semiconductor device 20 can be arranged at a desired position regardless of the number of stacked semiconductor devices 20.

In this manner, the semiconductor device 20 achieves high versatility and high packaging density. The semiconductor device 20 can also contribute to an increase in packaging density and compactness in an electrical device using the semiconductor device 20 as a building component. Since the semiconductor device 20 has high structural versatility, it can be used with various settings regardless of whether the semiconductor device 20 is used singly or in connection with another component and regardless of the number of stacked semiconductor devices 20 and the position when a plurality of semiconductor devices 20 are stacked and used. The semiconductor device 20 having this structure can be efficiently, easily manufactured at low cost. The semiconductor device manufacturing method according to the first embodiment can efficiently, easily manufacture the semiconductor device 20 at low cost.

Second Embodiment

Figure 4:
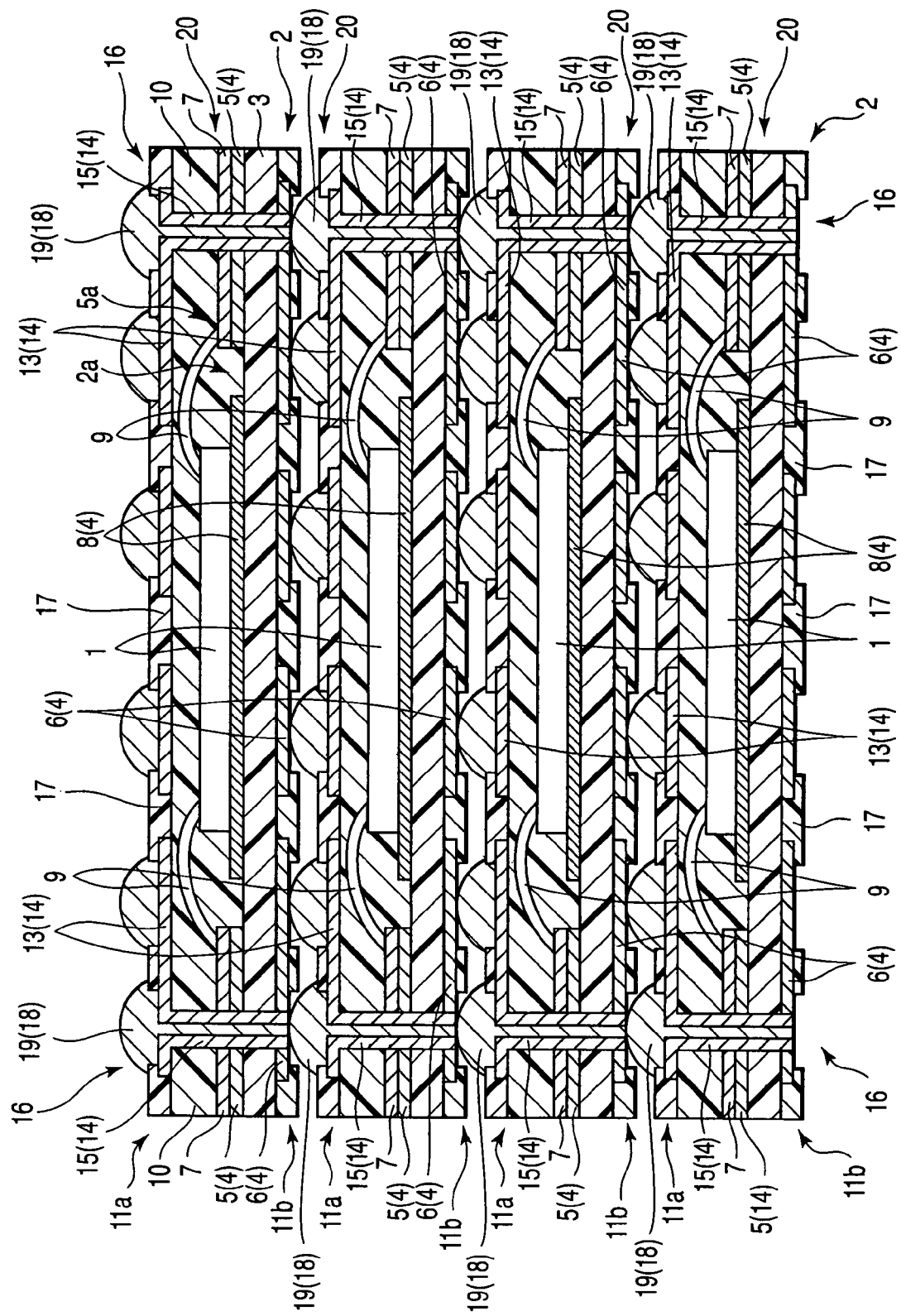
FIG. 4 is a sectional view showing a step in a semiconductor device manufacturing method according to the second embodiment.
Figure 5:
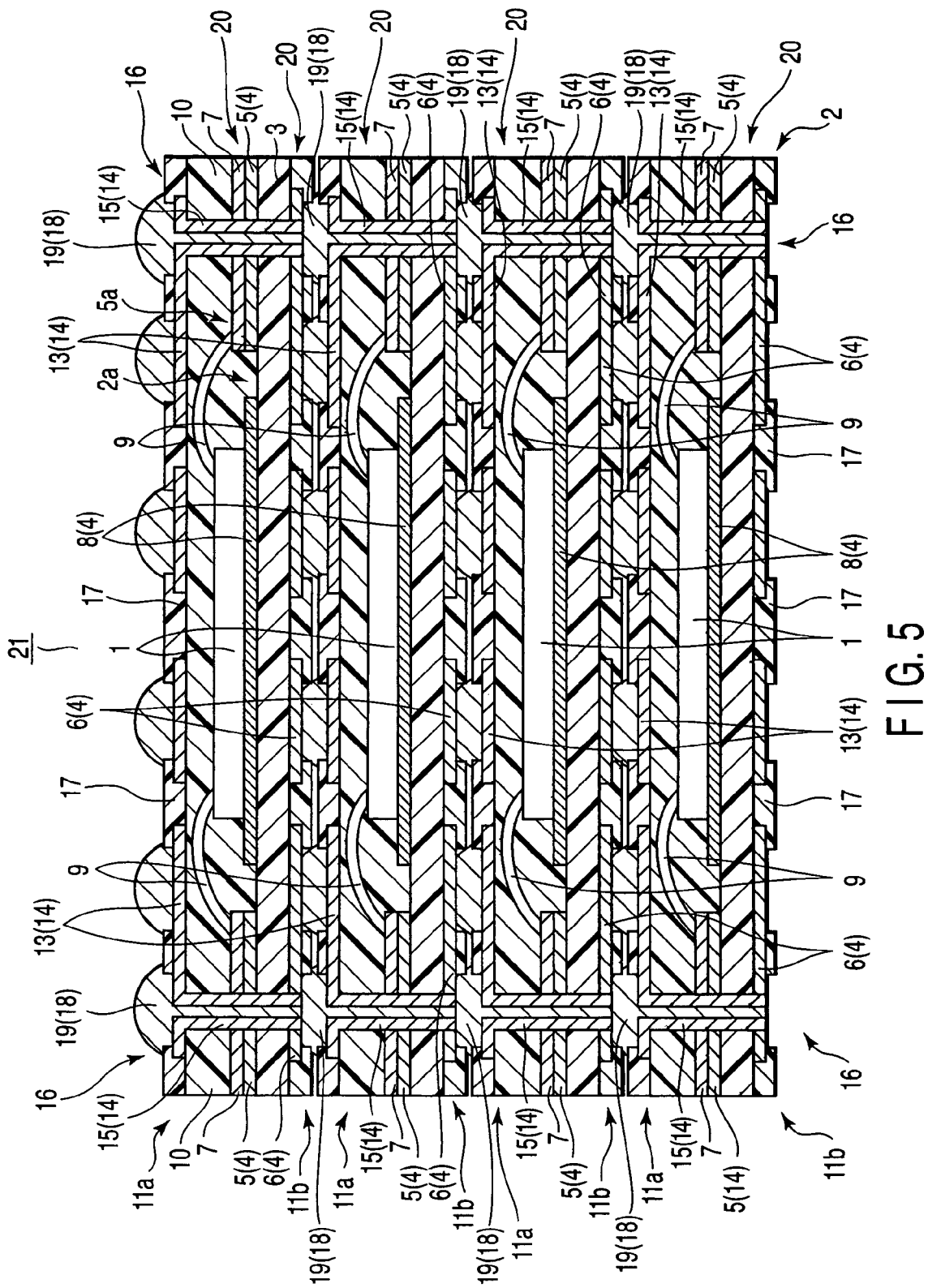
FIG. 5 is a sectional view showing another step in the semiconductor device manufacturing method according to the second embodiment.

The second embodiment according to the present invention will be described with reference to FIGS. 4 and 5. FIGS. 4 and 5 are sectional views respectively showing steps in a semiconductor device manufacturing method according to the second embodiment. The same reference numerals as in the first embodiment denote the same parts, and a detailed description thereof will be omitted.

The second embodiment will explain a semiconductor device manufactured by stacking a plurality of semiconductor devices 20 according to the first embodiment, and a manufacturing method therefor. The second embodiment will be described in detail.

As shown in FIG. 4, four semiconductor devices 20 of the first embodiment are stacked and arranged. Solder layers 19 on a package mounting surface 11a of a lower semiconductor device 20 and second interconnections (lower connecting terminals or lower interconnections) 6 on a substrate packaging surface 11b of an upper semiconductor device 20 are brought into contact with each other, thus arranging the semiconductor devices 20.

As shown in FIG. 5, the four stacked semiconductor devices 20 are reflowed. The solder layers 19 on the package mounting surfaces 11a of the semiconductor devices 20 fuse to electrically connect and bond the adjacent semiconductor devices 20.

Although not shown, various tests to inspect whether the multilayered member can be actually used as a product are executed for the multilayered member of the four bonded semiconductor devices 20 under various environments such as low temperatures or high temperatures. A multilayered member which has passed these tests is adopted as a nondefective. Consequently, a desired semiconductor device 21 according to the second embodiment is obtained, as shown in FIG. 5. In other words, the semiconductor device 21 is attained as a chip-stacked multichip package (multichip module) prepared by stacking four semiconductor devices 20 of the first embodiment as single chip packages (single chip modules).

If necessary, predetermined external devices (not shown) such as a passive component are mounted on the package mounting surface 11a of the uppermost single chip package 20. Also, if necessary, a packaging substrate (not shown) is packaged on the substrate packaging surface 11b of the lowermost single chip package 20.

As described above, the second embodiment can efficiently, easily manufacture the chip-stacked semiconductor device 21 because the semiconductor devices 20 according to the first embodiment are stacked.

Conventionally, when a chip-stacked multichip package (multichip module) is to be fabricated by stacking a plurality of semiconductor packages (semiconductor modules), packages are generally fabricated as individual packages for respective layers. After the packages are stacked into one multichip package, a lower interconnection (lower connecting terminal) for mounting the package on a packaging substrate is provided on the lowermost package. To mount another electrical component or the like on the package, an upper connecting interconnection (upper connecting terminal) is provided on the uppermost package. Alternatively, the lowermost package is fabricated in advance as a substrate package having a structure dedicated to package a substrate, or the uppermost package is fabricated in advance as a component mounting package having a structure dedicated to package a component. Conventionally, to fabricate a chip-stacked multichip package, different packages must be prepared in accordance with the arrangement position. This results in low manufacturing efficiency and high manufacturing cost.

To the contrary, the chip-stacked semiconductor device 21 according to the second embodiment is fabricated by stacking the semiconductor devices 20 of the first embodiment which have high structural versatility and can be used with various settings regardless of the number of stacked semiconductor devices 20 and the position when a plurality of semiconductor devices 20 are stacked and used. Hence, the semiconductor device 21 can be efficiently, easily manufactured at low cost.

Conventional chip-stacked multichip packages include a chip-stacked multichip package in which a plurality of semiconductor chips are stacked within one package. This chip-stacked multichip package will be concretely, concisely explained with reference to FIGS. 23A, 23B, and 24.

Figure 23A:
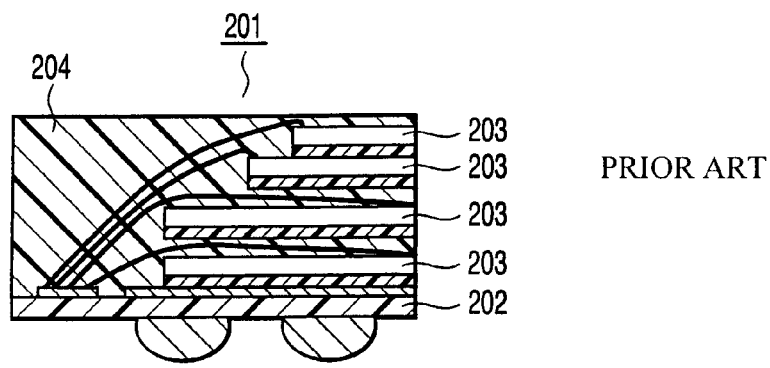
FIGS. 23A and 23B are sectional views showing semiconductor devices according to the prior art as comparative examples of the semiconductor devices according to the first to seventh embodiments.

A chip-stacked multichip package (multichip module) 201 shown in FIG. 23A will be explained. The multichip package 201 is manufactured by, e.g., the following steps. First, as shown in FIG. 23A, a plurality of semiconductor chips 203 are stacked on one packaging substrate 202. The semiconductor chips 203 are electrically connected to the packaging substrate 202 by repeating wire bonding. Subsequently, the packaging substrate 202 and semiconductor chips 203 are subjected to mold sealing and covered with a sealing resin 204. Then, a so-called Burn-In test is conducted for the mold-sealed packaging substrate 202 and semiconductor chips 203. As a result, the chip-stacked multichip package 201 is fabricated.

Figure 23B:
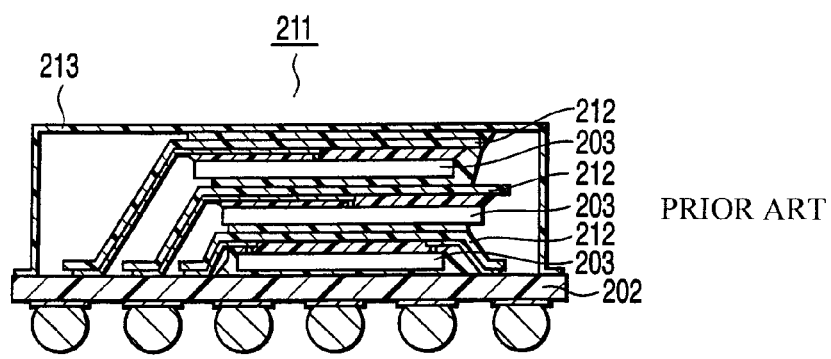

A chip-stacked multichip package 211 shown in FIG. 23B will be explained. The multichip package 211 is manufactured by, e.g., the following steps. First, as shown in FIG. 23B, each of semiconductor chips 203 is flip-chip-connected to a corresponding chip connecting substrate 212. The semiconductor chips 203 are stacked on one packaging substrate 202 together with the chip connecting substrates 212, and electrically connected (die-attached) to the packaging substrate 202. Subsequently, the packaging substrate 202 and semiconductor chips 203 are covered with a protection case 213 and packaged. Thereafter, a Burn-In test is conducted, similar to the above-described multichip package 201. The chip-stacked multichip package 211 of a type different from the multichip package 201 is fabricated.

In such arrangement like the packages 201 and 211, if even one of the semiconductor chips 203 in the package 201 or 211 is determined as a defective by a test, the whole package 201 or 211 becomes a defective. The fraction defective of the package 201 or 211 in the test is influenced by the fraction defective calculated by accumulating the fraction defectives of the respective semiconductor chips 203. For example, assume that the yields of the semiconductor chips from the first to fourth layers are 95%, 95%, 90%, and 85% in a multichip package in which four semiconductor chips 203 are stacked within the package, like the packages 201 and 211. In this case, the final yield of the entire package as a product is 0.95×0.95×0.90×0.85×100≈69(%) which is lower than 70%. In this manner, the yield of the whole package is influenced by the highest fraction defective among the fraction defectives of a plurality of semiconductor chips. In addition, nondefective semiconductor chips of other layers are greatly wasted.

The sealing resin 204 and protection case 213 are not equipped on their tops with any interconnection for mounting external devices. It is therefore difficult to electrically connect and mount external devices on the packages 201 and 211. In other words, the packages 201 and 211 suffer low packaging density. As for the package 211, the chip connecting substrate 212 must be arranged separately from the packaging substrate 202. The production efficiency hardly increases, and the cost of the entire package is likely to rise.

Figure 24:
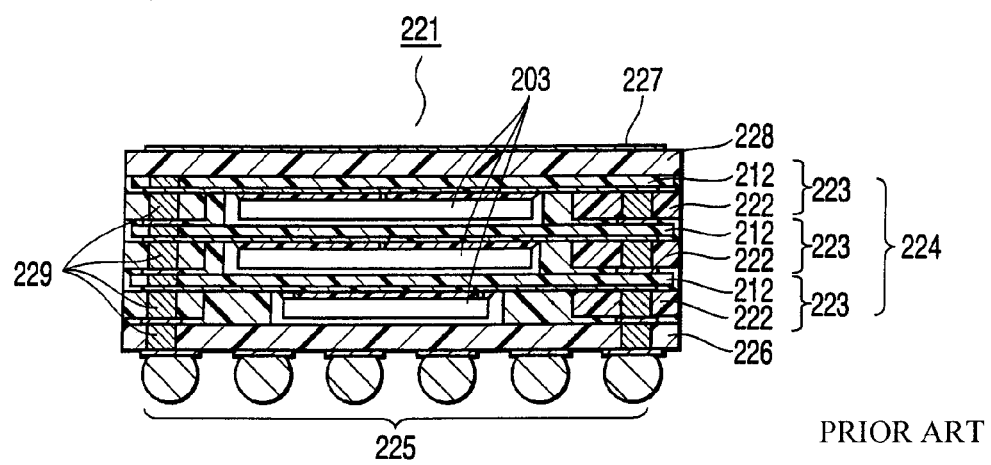
FIG. 24 is a sectional view showing another semiconductor device according to the prior art as another comparative example of the semiconductor devices according to the first to seventh embodiments.

FIG. 24 shows a conventional package-stacked module 221. In the module 221, a plurality of semiconductor chips 203, chip connecting substrates 212 to which the chips 203 are connected, and intermediate packages 223 comprised of a plurality of intermediate substrates 222 interposed between adjacent chips 203 are assembled for respective layers. After the intermediate packages 223 are fabricated, a Burn-In test or the like is temporarily conducted to screen the intermediate packages 223 into nondefectives and defectives. Only nondefective intermediate packages 223 are stacked into a desired number of layers to form a multilayered member 224 of intermediate packages 223. Thereafter, the lowermost intermediate package 223 of the multilayered member 224 is packaged on a packaging substrate 226 having a plurality of solder balls (Ball Grid Arrays: BGA) 225 serving as external terminals. At the same time, an external device mounting substrate 228 having a plurality of external device mounting interconnections 227 is connected to the uppermost intermediate package 223 of the multilayered member 224. The semiconductor chips 203, solder balls 225, and external device mounting interconnections 227 are electrically connected to each other via, e.g., a plurality of through plugs 229 which extend through the intermediate substrates 222.

The arrangement of the module 221 adopts only intermediate packages 223 which are determined as nondefectives in advance. This can avoid the loss of the yield of the whole package due to accumulation of fraction defectives of the semiconductor chips 203, unlike the above-mentioned packages 201 and 211. However, similar to the packages 201 and 211, the module 221 requires the intermediate substrate 222 for each layer, and also requires the packaging substrate 226 and external device mounting substrate 228 separately from the chip connecting substrate 212 and intermediate substrate 222. The module 221 also hardly increases the production efficiency, and the cost of the entire module (package) is likely to rise.

According to the prior art, it is difficult to increase the production efficiency of the chip-stacked package (module). Especially in a chip-stacked package having an arrangement similar to the module 221, dedicated assembly equipment must be installed for each intermediate package 223, resulting in high equipment cost. High equipment cost increases the production cost of each intermediate package. This results in high production cost of the whole multichip package 221 of the intermediate packages 223 and high production cost of a semiconductor device having the multichip package 221.

In contrast to this, the second embodiment can construct a multilayered package by stacking tested nondefective packages 20 of respective layers, as described above with reference to FIG. 5, without accumulating the chip yields of all layers of the multilayered structure. Passive components can also be mounted on the uppermost resin-sealed package 20, which can contribute to increasing the packaging density.

Moreover, an existing semiconductor package can be formed into a multilayered package by adding only a copper foil. Assembly equipment can also be applied to provide the chip-stacked multichip package 21 at low cost. This will be explained in detail in the eighth and ninth embodiments.

Third Embodiment

The third embodiment according to the present invention will be described with reference to FIGS. 6A to 7D. FIGS. 6A to 7D are sectional views respectively showing steps in a semiconductor device manufacturing method according to the third embodiment. The same reference numerals as in the first embodiment denote the same parts, and a detailed description thereof will be omitted.

The third embodiment will explain a semiconductor device manufactured by connecting a semiconductor chip 1 to a flexible base 2 by flip-chip connection instead of wire bonding in the first embodiment, and a manufacturing method therefor. The third embodiment will be described in detail.

Figure 6A:
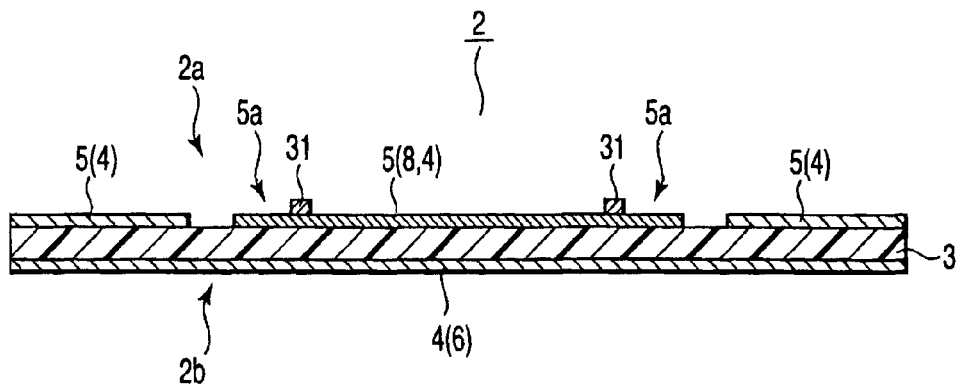
FIGS. 6A to 6C are sectional views respectively showing steps in a semiconductor device manufacturing method according to the third embodiment.

As shown in FIG. 6A, one flexible base (double-sided copper-clad tape) 2 employed in the first embodiment is prepared as a chip mounting base. A plurality of first interconnections 5 including at least one chip interconnection are formed on a chip mounting surface 2a of the flexible base 2 by the same step as that of the first embodiment. As will be described later, according to the third embodiment, the semiconductor chip 1 is electrically connected to the chip interconnection 5 by flip chip connection, and mounted on the flexible base 2. For this purpose, at least one of the chip interconnections 5 is formed as a chip mount die pad 8 on which the semiconductor chip 1 is to be mounted.

Predetermined regions of the chip mount die pad 8 are set as pad connecting portions 5a in accordance with the layout of the connecting pads of the semiconductor chip 1. The pad connecting portions 5a of the chip mount die pad 8 are electrically connected to the chip interconnections 5 which are electrically connected to second interconnections 6, third interconnections 13, and through plugs (fourth interconnections) 15 (to be described later) via other chip interconnections (not shown).

The surfaces of the pad connecting portions 5a undergo surface treatment for electrically connecting the connecting pads of the semiconductor chip 1. For example, the surfaces of the pad connecting portions 5a are subjected to Ni/Au plating in accordance with the layout of the connecting pads of the semiconductor chip 1. Accordingly, plated bumps (pad connecting bumps) 31 of Ni and Au are provided on the surfaces of the pad connecting portions 5a in accordance with the layout of the connecting pads of the semiconductor chip 1. In the third embodiment using flip chip connection, surface treatment for the pad connecting portions 5a is not limited to Ni/Au plating. For example, solder portions (not shown) may be provided on the surfaces of the pad connecting portions 5a instead of Ni/Au plating.

Figure 6B:
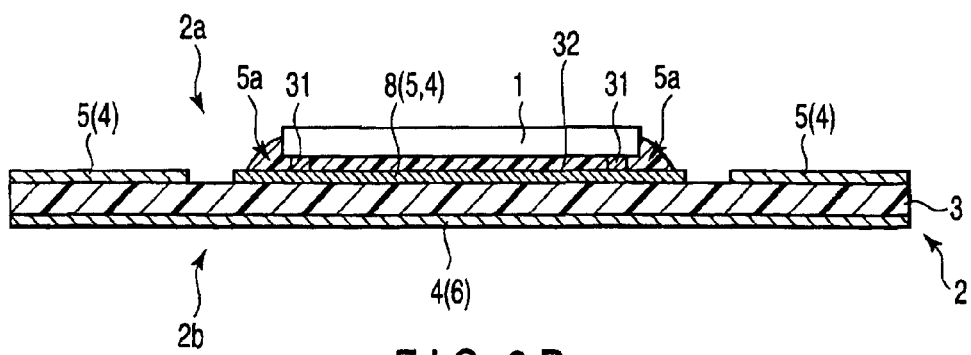

As shown in FIG. 6B, at least one semiconductor chip 1 is mounted on the chip mounting surface 2a of the flexible base 2. More specifically, one semiconductor chip 1 is attached to the chip mount die pad 8 by flip chip connection. At this time, the connecting pads of the semiconductor chip 1 are bonded to corresponding Ni/Au-plating bumps 31 on the surfaces of the pad connecting portions 5a by thermocompression bonding, ultrasonic bonding, or the like. At the same time, the semiconductor chip 1 is adhered (bonded) to the chip mount die pad 8 with an adhesive 32 such as an epoxy resin.

Figure 6C:
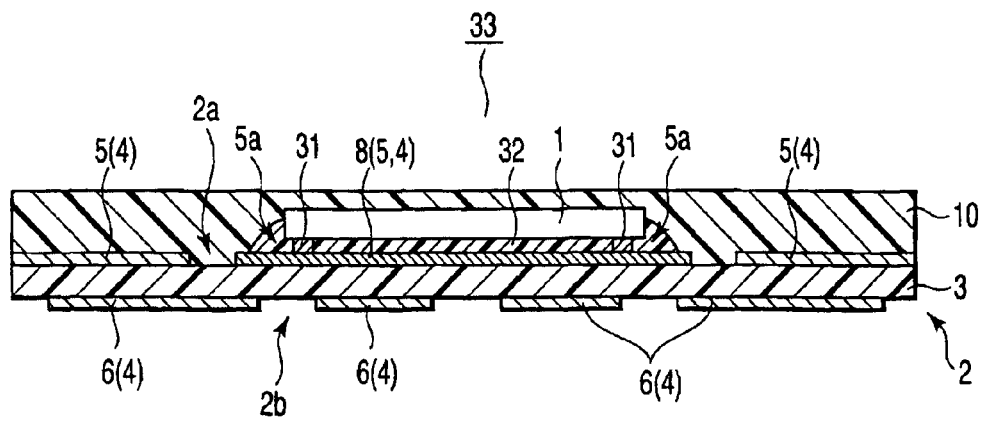

As shown in FIG. 6C, a sealing resin 10 is applied by transfer molding onto the chip mounting surface 2a of the flexible base 2 by the same step as that of the first embodiment, and cover the semiconductor chip 1, chip interconnections 5, chip mount die pad 8 (pad connecting portions 5a), Ni/Au-plating bumps 31, adhesive 32, and the like. Also, a plurality of second interconnections 6 are formed from one Cu foil 4 on a non-chip mounting surface 2b of the flexible base 2. The above steps provide a resin-sealed package 33 comprised of the semiconductor chip 1, flexible base 2, second interconnections 6, sealing resin 10, and the like. The resin-sealed package 33 serves as a main building component of a semiconductor device 34 according to the third embodiment.

Figure 7A:
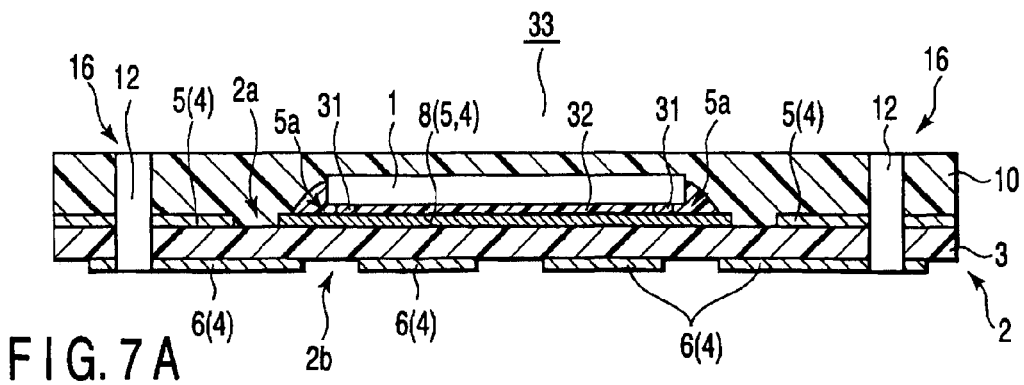
FIGS. 7A to 7D are sectional views respectively showing steps in the semiconductor device manufacturing method according to the third embodiment.

As shown in FIG. 7A, a plurality of through holes 12 are provided at interconnection connecting portions 16 of the resin-sealed package 33 by the same step as that of the first embodiment, and extend through the resin-sealed package 33 along the direction of thickness.

Figure 7B:
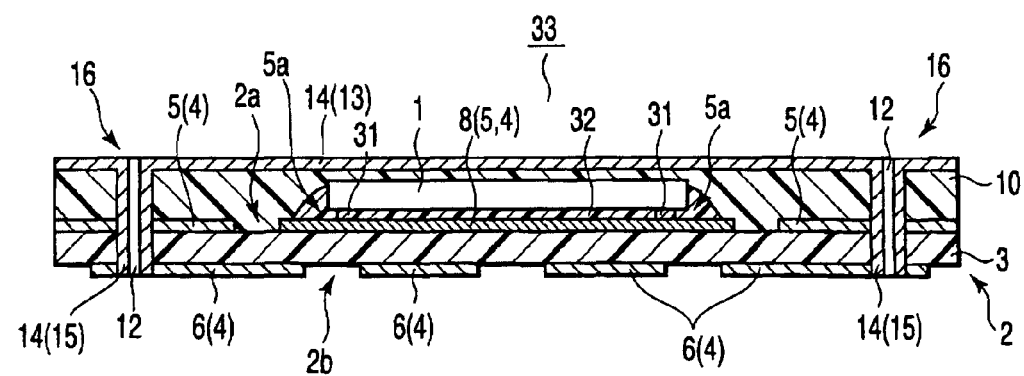

As shown in FIG. 7B, a conductor 14 serving as the third interconnection 13 and a conductor 14 serving as the fourth interconnection 15 are provided at once integrally on the surface of the sealing resin 10 and the inner wall surfaces of the through holes 12 by the same step as that of the first embodiment. That is, one Cu layer 14 serving as the third interconnection 13 is provided on the surface of the sealing resin 10, and the through plugs 15 of one Cu layer 14 are provided in the through holes 12.

Figure 7C:
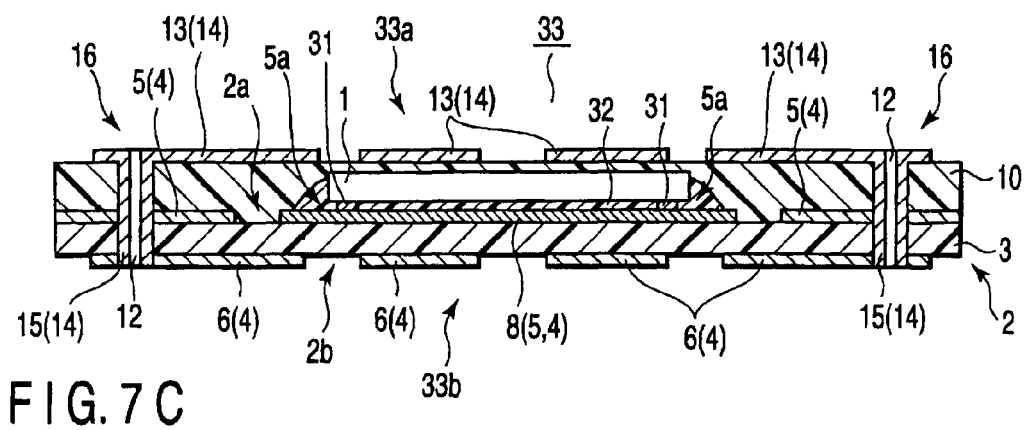

As shown in FIG. 7C, a plurality of third interconnections 13 of one Cu layer 14 are formed on the surface of the sealing resin 10 by the same step as that of the first embodiment. Also in the third embodiment, similar to the above-described first embodiment, a major surface (sealing resin 10 side) of the resin-sealed package 33 on which the third interconnections 13 are formed serves as a package mounting surface 33a. A major surface (flexible base 2 side) of the resin-sealed package 33 on which the second interconnections 6 are formed serves as a substrate packaging surface 33b.

Figure 7D:
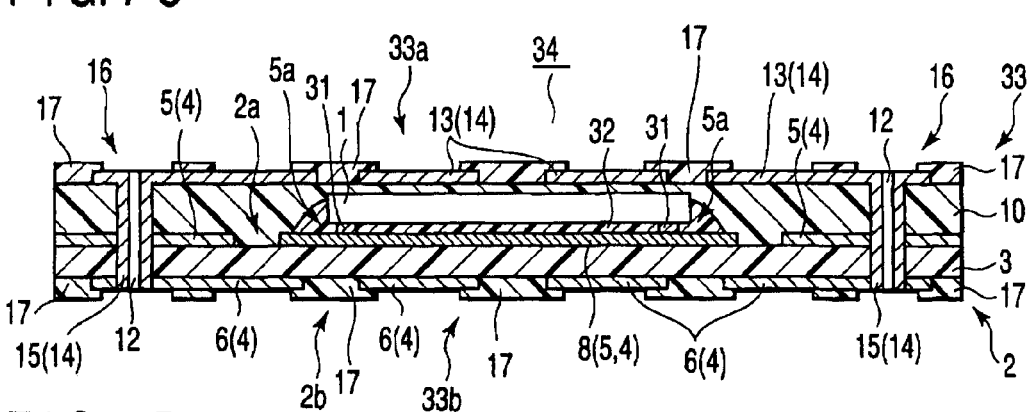

As shown in FIG. 7D, a solder resist 17 is applied with a predetermined pattern onto the non-chip mounting surface 2b of the flexible base 2 having a plurality of second interconnections 6 by the same step as that of the first embodiment. The solder resist 17 is also applied with a predetermined pattern onto the surface of the sealing resin 10 having a plurality of third interconnections 13.

Although not shown, if necessary predetermined surface treatment such as Ni/Au plating or corrosion prevention is performed for the third interconnections 13 serving as package mounting terminals by the same step as that of the first embodiment. Subsequently, a solder paste is applied onto the package mounting surface 33a of the resin-sealed package 33. If necessary, a plurality of solder balls are brought into contact with (bonded to) the second interconnections 6, and mounted on the substrate packaging surface 33b of the resin-sealed package 33. The resin-sealed package 33 having the solder paste is reflowed to form solder layers about 50 μm to 0.3 mm thick over surfaces of the third interconnections 13 that are exposed from the solder resist 17. The interiors of the through holes 12 having the through plugs 15 are filled with the solder layers. If necessary, the second interconnections 6 serving as substrate packaging terminals undergo surface treatment such as corrosion prevention or Ni/Au plating which makes the solder easily wet and makes it difficult to form an unfused oxide film on the surfaces of the second interconnections 6 at a high-temperature test.

An assembly of the resin-sealed packages 33 fabricated at once by the above steps is cut from a tape into individual packages by dicing or the like. Various tests are executed for the resin-sealed packages 33, and resin-sealed packages 33 which have passed these tests are determined as nondefectives. As a result, a desired semiconductor device 34 according to the third embodiment having the resin-sealed package 33 shown in FIG. 7D as a main building component is obtained.

That is, the semiconductor device 34 is built by the resin-sealed package 33. The resin-sealed package 33 comprises a plurality of Cu interconnections (third interconnections) 13 serving as package mounting terminals (package mounting interconnections) on the package mounting surface 33a of the resin-sealed package 33, and a plurality of Cu interconnections (second interconnections) 6 serving as substrate packaging terminals (substrate packaging interconnections) on the substrate packaging surface 33b of the resin-sealed package 33. One semiconductor chip 1 which is flip-chip-connected to a plurality of Cu chip interconnections (first interconnections) 5 on the chip mounting surface 2a of the chip mounting base 2 and mounted on the chip mounting base 2 is connected to the Cu interconnections 6 and 13 via a plurality of Cu through plugs (fourth interconnections) 15 which extend through the Cu chip interconnections 5 and resin-sealed package 33 along the direction of thickness.

If necessary, predetermined external devices (not shown) such as a passive component are mounted on the package mounting surface 33a of the semiconductor device 34. Also, if necessary, a packaging substrate (not shown) is packaged on the substrate packaging surface 33b of the semiconductor device 34. If necessary, a plurality of semiconductor devices 34 are stacked and used as a multichip package.

As described above, the third embodiment can achieve the same effects as those of the first embodiment. Since the semiconductor chip 1 is flip-chip-connected to the chip interconnections 5, a bonding wire connection failure or the like can be excluded, unlike wire bonding, and the mounting step of the semiconductor chip 1 can be simplified. This can improve the quality, reliability, performance, production efficiency, and yield of the semiconductor device 34, and suppress the production cost. Flip chip connection can realize micropatterning of the chip interconnections 5 and the second, third, and fourth interconnections 6, 13, and 15. As a result, the semiconductor device 34 can be made compact at a high integration degree. In this manner, the third embodiment can efficiently, easily manufacture a versatile, advanced semiconductor device 34 at low cost.

Fourth Embodiment

The fourth embodiment according to the present invention will be described with reference to FIGS. 8A to 11B. FIGS. 8A to 11B are sectional views respectively showing steps in a semiconductor device manufacturing method according to the fourth embodiment. The same reference numerals as in the first embodiment denote the same parts, and a detailed description thereof will be omitted.

The fourth embodiment will explain a semiconductor device using a single-sided copper-clad tape as a chip mounting base instead of the double-sided copper-clad tape 2 employed in the first embodiment, and a manufacturing method therefor. The fourth embodiment will be described in detail.

Figure 8A:
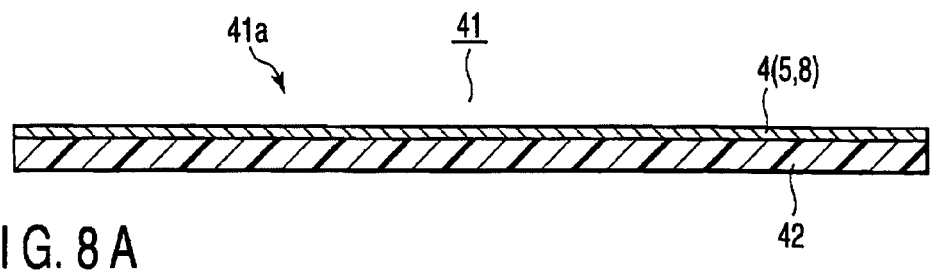
FIGS. 8A to 8D are sectional views respectively showing steps in a semiconductor device manufacturing method according to the fourth embodiment.

As shown in FIG. 8A, one chip mounting base 41 on which at least one semiconductor chip 1 is to be mounted on one major surface is prepared. Similar to the base body 3 of the chip mounting base 2 in the first embodiment, a base body 42 of the chip mounting base 41 is formed from a tape of a flexible material such as polyimide, glass epoxy, or BT resin. That is, the chip mounting base 41 of the fourth embodiment is a flexible base, similar to the chip mounting base 2 of the first embodiment. However, unlike the chip mounting base 2 of the first embodiment, the chip mounting base 41 of the fourth embodiment has a conductor 4 of at least one layer that covers either the front or back (upper or lower) major surface of the base body 42. More specifically, the flexible base 41 bears the Cu foil 4 of one layer that covers a chip mounting surface 41a serving as a major surface on which the semiconductor chip 1 is mounted. The flexible base 41 having this structure is also called a single-sided copper-clad tape in comparison with the flexible base 2 of the first embodiment that is also called a double-sided copper-clad tape. The Cu foil 4 serves as a first interconnection (chip interconnection) 5 and chip mount die pad B.

Figure 8B:
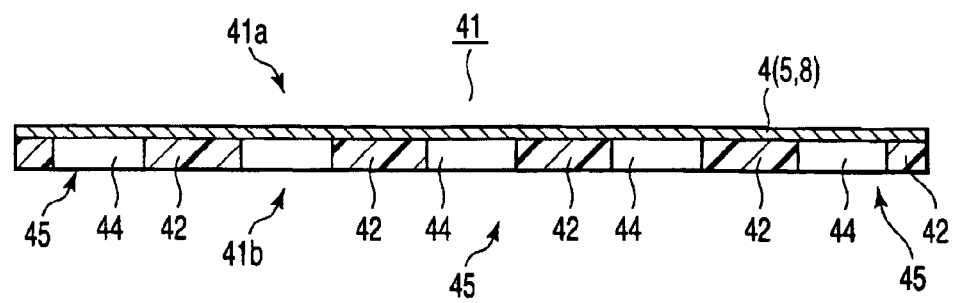

As shown in FIG. 8B, at least one second interconnection recess (hole or aperture) 44 for providing a second interconnection 43 is formed in the base body 42 of the flexible base 41. In the fourth embodiment, a plurality of second interconnection recesses 44 are formed in the flexible base 41 in order to provide a plurality of second interconnections 43 in the flexible base 41. The recesses 44 are formed along a predetermined pattern so that the second interconnections 43 are provided into the predetermined pattern. All the second interconnections 43 are exposed on a major surface of the base body 42 on which no Cu foil 4 is provided. In other words, all the second interconnections 43 are exposed on a non-chip mounting surface 41b serving as a major surface of the flexible base 41 on which no semiconductor chip 1 is mounted. At least one of the second interconnections 43 is electrically connected to a portion of the Cu foil 4 that serves as the chip interconnection 5. That is, of the second interconnections 43, a second interconnection 43 to be electrically connected to the Cu foil 4 serving as the chip interconnection 5 extends through the base body 42 along the direction of thickness. Of the recesses 44, a recess 44 for providing a second interconnection 43 to be electrically connected to the Cu foil 4 serving as the chip interconnection 5 is formed as a through hole (via hole) which extends through the base body 42 along the direction of thickness.

Recesses 44 for providing the second interconnections 43 not connected to the chip interconnections 5 (semiconductor chip 1) may also be formed as through holes (via holes) which extend through the base body 42 at once along the direction of thickness. In the fourth embodiment, as shown in FIG. 8B, all the second interconnection recesses 44 in which the second interconnections 43 are provided in contact with the Cu foil 4 are formed as through holes. By forming all the second interconnection recesses 44 as through holes, the step of forming the second interconnection recesses 44 can be simplified (unified) regardless of the connection states between the semiconductor chip 1 and the second interconnections 43. This can increase the manufacturing efficiency of a semiconductor device 52 according to the fourth embodiment. In the following description, portions at which the second interconnections 43 are provided in contact with the Cu foil 4 will be called first interconnection connecting portions (first external terminals) 45.

The through holes 44 are formed at the first interconnection connecting portions 45 by forming apertures from the non-chip mounting surface 41b to the base body 42 along the direction of thickness until the Cu foil 4 is exposed. These holes are formed with, e.g., a carbon dioxide laser beam or UV laser beam (not shown). Thereafter, the residue such as a carbide in each through hole 44 is removed (desmeared) with a potassium permanganate solution or the like.

Figure 8C:
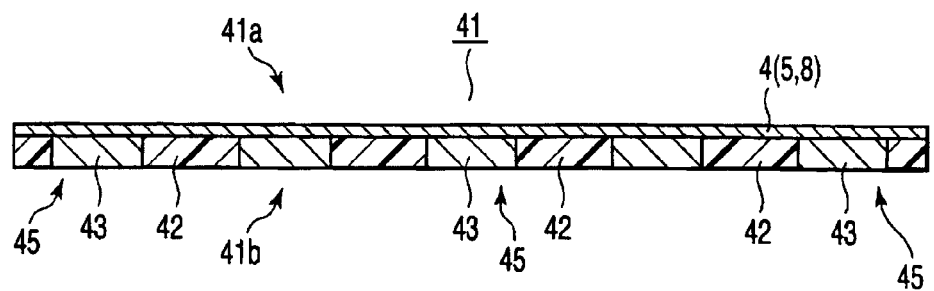

As shown in FIG. 8C, one second interconnection 43 is provided at each first interconnection connecting portion 45.

More specifically, predetermined plating is performed inside each through hole 44 formed at the first interconnection connecting portion 45. The conductor (metal) 43 serving as the second interconnection is buried in the plated through hole 44 to fill the through hole 44. CMP or the like is executed for the non-chip mounting surface 41b of the base body 42 to bury one second interconnection 43 in each first interconnection connecting portion 45. As the conductor 43 serving as the second interconnection, Sn, Cu, Sn—Ag alloy, PbSn, or the like is used. Accordingly, the semiconductor chip 1 is electrically connected to external devices (not shown) and the like via the second interconnections 43, Cu foil 4 (chip interconnections 5), and the like. However, all the second interconnections 43 need not necessarily be electrically connected to the semiconductor chip 1, similar to the first embodiment. Some of the second interconnections 43 may not be electrically connected to the semiconductor chip 1. Second interconnections 43 which are not connected to the semiconductor chip 1 may be formed as dummy interconnections or relay interconnections.

Figure 8D:
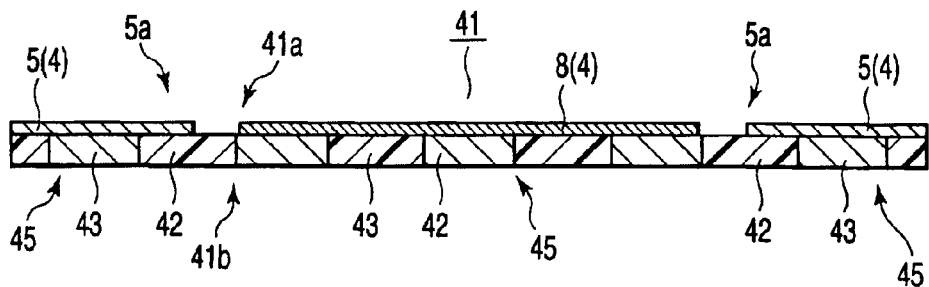

As shown in FIG. 8D, similar to the first embodiment, the Cu foil 4 undergoes etching or the like to form a plurality of first interconnections 5 including at least one chip interconnection and a chip mount die pad 8 on the chip mounting surface 41a of the flexible base 41. In etching, the surfaces of the second interconnections 43 which are exposed on the non-chip mounting surface 41b of the flexible base 41 are entirely covered with a mask.

Figure 9A:
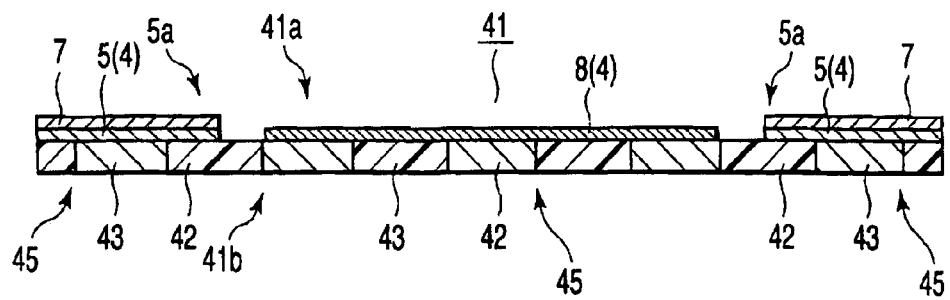
FIGS. 9A to 9C are sectional views respectively showing steps in the semiconductor device manufacturing method according to the fourth embodiment.

As shown in FIG. 9A, Ni/Au-plating portions 7 are provided on the surfaces of pad connecting portions 5a of the chip interconnections 5 by the same step as that of the first embodiment.

Figure 9B:
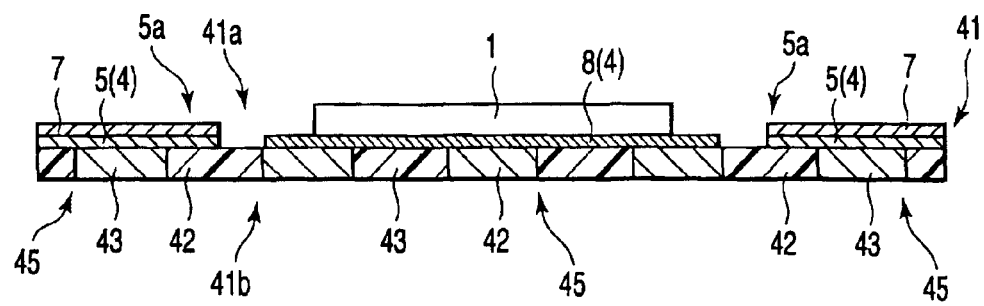

As shown in FIG. 9B, one semiconductor chip 1 is attached onto the chip mount die pad 8 by the same step as that of the first embodiment.

Figure 9C:
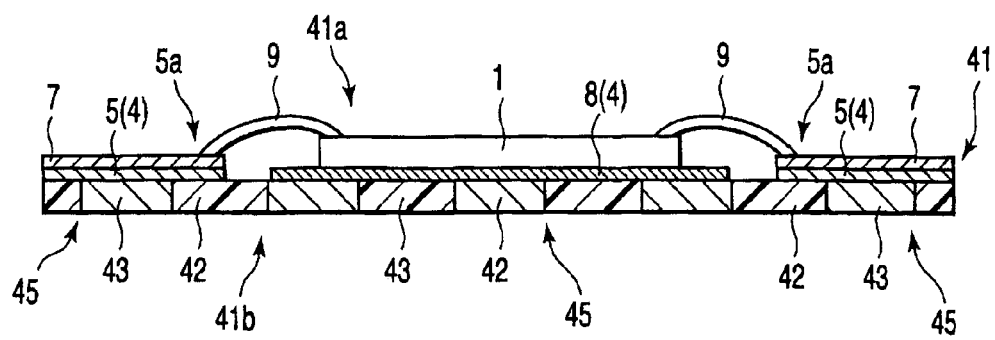

As shown in FIG. 9C, similar to the first embodiment, the semiconductor chip 1 is electrically connected by wire bonding to the chip interconnections 5 via the Ni/Au-plating portions 7 on the pad connecting portions 5a.

Figure 10A:
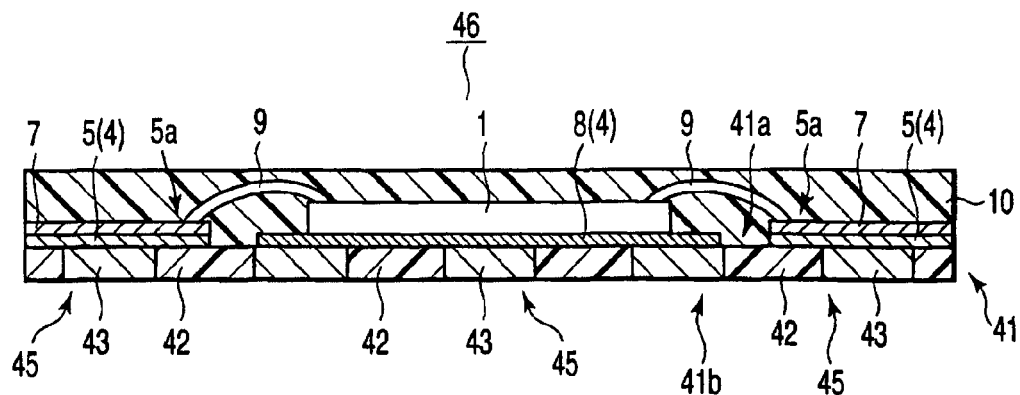
FIGS. 10A to 10C are sectional views respectively showing steps in the semiconductor device manufacturing method according to the fourth embodiment.

As shown in FIG. 10A, similar to the first embodiment, a sealing resin 10 is applied by transfer molding onto the chip mounting surface 41a of the flexible base 41 so as to cover the semiconductor chip 1, chip interconnections 5 (pad connecting portions 5a), Ni/Au-plating portions 7, chip mount die pad 8, Au bonding wires 9, and the like. The above steps provide a resin-sealed package (mold-sealed package) 46 comprised of the semiconductor chip 1, flexible base 41, sealing resin 10, and the like. The resin-sealed package 46 serves as a main building component of the semiconductor device 52 according to the fourth embodiment. At least one third interconnection 47 is provided on the surface of the sealing resin 10.

Figure 10B:
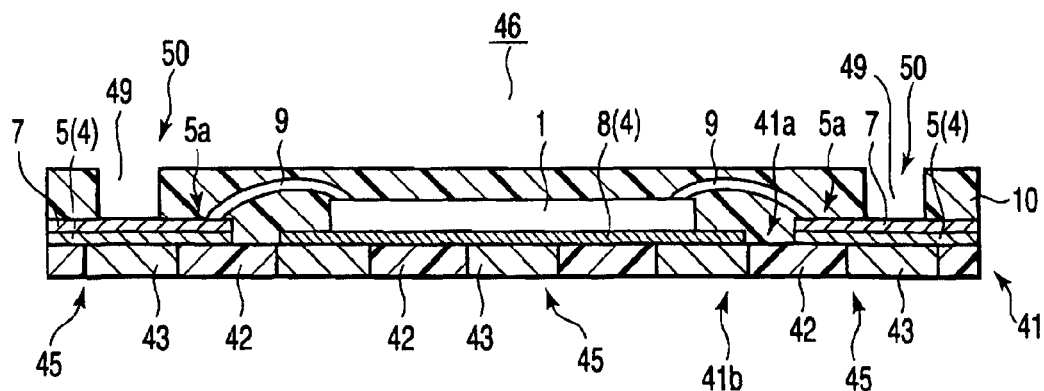

As shown in FIG. 10B, at least one fourth interconnection recess (hole or aperture) 49 for providing a fourth interconnection 48 is formed in the resin-sealed package 46. In the fourth embodiment, a plurality of fourth interconnection recesses 49 are formed in the resin-sealed package 46 in order to provide a plurality of fourth interconnections 48 in the resin-sealed package 46. In the fourth embodiment, of the fourth interconnections 48, at least fourth interconnections 48 which are electrically connected to the semiconductor chip 1 (chip interconnections 5) are electrically connected at once to the chip interconnections 5 and third interconnections 47 along the direction of thickness of the resin-sealed package 46. For this purpose, the recesses 49 for providing the fourth interconnections 48 to be electrically connected to the semiconductor chip 1 are formed at positions where the recesses 49 extend through the sealing resin 10 along the direction of thickness and can expose the surfaces of the Ni/Au-plating portions 7 on the pad connecting portions 5a of the chip interconnections 5. In the fourth embodiment, unlike the first embodiment, the recesses 49 for providing the fourth interconnections 48 to be electrically connected to the semiconductor chip 1 are formed as non-through holes (non-via holes) which do not extend through the resin-sealed package 46. That is, the recesses 49 for providing the fourth interconnections 48 to be electrically connected to the semiconductor chip 1 extend through the sealing resin 10 along the direction of thickness without extending through the flexible base 41 and second interconnections 43.

The recesses 49 for providing the fourth interconnections 48 to be electrically connected to the semiconductor chip 1 may or may not extend through the pad connecting portions 5a of the chip interconnections and the Ni/Au-plating portions 7 on the surfaces of the pad connecting portions 5a. The recesses 49 for providing the fourth interconnections 48 to be electrically connected to the semiconductor chip 1 suffice to be formed to a depth at which the fourth interconnections 48 in the recesses 49 can electrically contact the Ni/Au-plating portions 7. In the fourth embodiment, the recesses 49 for providing the fourth interconnections 48 to be electrically connected to the semiconductor chip 1 extend through only the sealing resin 10 along the direction of thickness to a depth at which the surfaces of the Ni/Au-plating portions 7 on the pad connecting portions 5a of the chip interconnections 5 are exposed.

Although not shown, according to the fourth embodiment, recesses for providing the fourth interconnections 48 not connected to the chip interconnections 5 (semiconductor chip 1) are also formed as non-via holes. By forming all the fourth interconnection recesses 49 as non-via holes, the step of forming the fourth interconnection recesses 49 can be simplified (unified) regardless of the connection states between the semiconductor chip 1 and the fourth interconnections 48. This can increase the manufacturing efficiency of the semiconductor device 52. In the following description, portions at which the fourth interconnections 48 to be electrically connected to the semiconductor chip 1 are electrically connected at once to the chip interconnections 5 and third interconnections 47 will be called second interconnection connecting portions (second external terminals or surface layer connecting terminals) 50.

The non-via holes 49 are formed at the second interconnection connecting portions 50 by forming apertures in the sealing resin 10 from its surface side along the direction of thickness with, e.g., a laser beam until the surfaces of the Ni/Au-plating portions 7 are exposed. At this time, the chip interconnections 5 formed by etching at the surface layer connecting terminals 50 function as a blind Cu mask so as to form the fourth interconnection recesses 49 at the second interconnection connecting portions 50 as non-via holes which do not extend through the flexible base 41 and second interconnections 43.

Figure 10C:
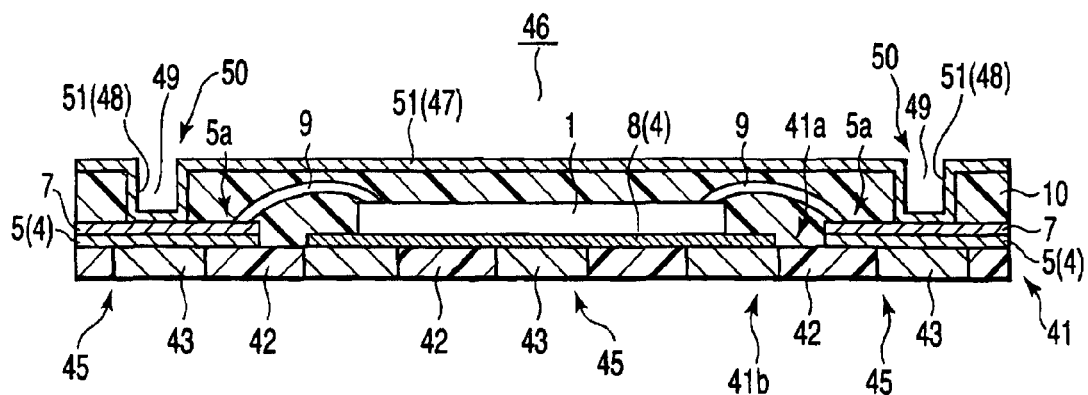

As shown in FIG. 10C, one Cu layer 51 serving as the third and fourth interconnections 47 and 48 is provided at once integrally on the surface of the sealing resin 10 and inside the non-via holes 49 by the same step as that of the first embodiment. That is, one Cu layer 51 prepared by successively executing electroless plating and electrolytic plating and integrating an electroless Cu layer about 0.01 µm to 1 µm thick and an electrolytic Cu layer about 1 µm to 30 µm thick is provided at once integrally on the surface of the sealing resin 10 and inside the non-via holes 49. The Cu layer 51 provided inside each non-via hole 49 is directly used as the non-via plug 48 which is the fourth interconnection.

In the fourth embodiment, the thickness of the electrolytic Cu layer is properly set to an appropriate size in accordance with the diameter of each non-via hole 49 so as not to fill the non-via hole 49. In a series of plating steps, surfaces of the second interconnections 43 that are exposed on the non-chip mounting surface 41b of the flexible base 41 and provided in the base body 42 are entirely kept covered with the mask applied in forming the chip interconnections 5. The mask suffices to be peeled from the surfaces of the second interconnections 43 on a predetermined stage after the series of plating steps ends.

As described above, the non-via plugs 48 (Cu layer 51) formed at the surface layer connecting terminals 50 are integrated with the Cu layer 51 serving as the third interconnections 47 on the surface of the sealing resin 10. In addition, the non-via plugs 48 formed at the surface layer connecting terminals 50 are electrically connected via the Ni/Au-plating portions 7 to the chip interconnections (first interconnections) 5 formed on the chip mounting surface 41a of the flexible base 41. Hence, as shown in FIG. 10C, the semiconductor chip 1 in the resin-sealed package 46 is electrically connected to the second and third interconnections 43 and 47 serving as external interconnections via the non-via plugs 48 and chip interconnections 5 serving as internal interconnections, and the like. Similar to the first embodiment, all the non-via plugs 48 need not necessarily be electrically connected to the semiconductor chip 1. Some of the non-via plugs 48 may not be electrically connected to the semiconductor chip 1. Non-via plugs 48 which are not connected to the semiconductor chip 1 may be formed as dummy plugs or relay plugs.

Figure 11A:
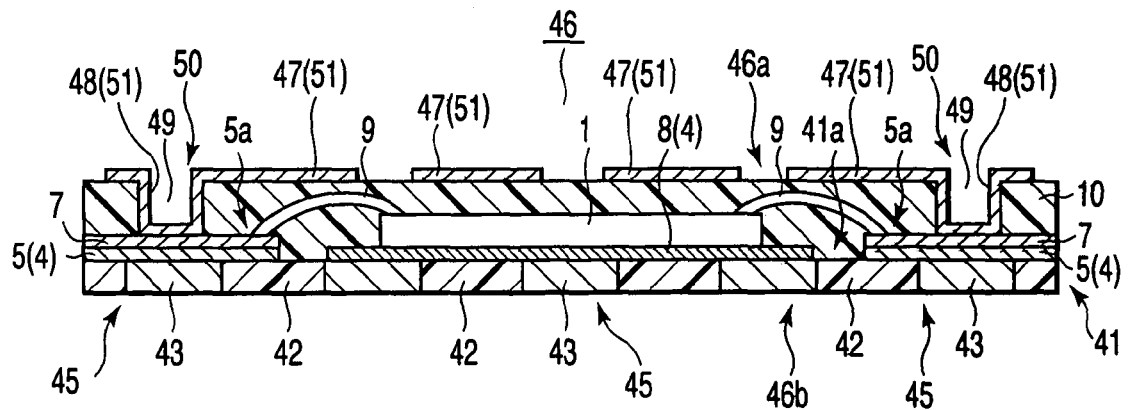
FIGS. 11A and 11B are sectional views respectively showing steps in the semiconductor device manufacturing method according to the fourth embodiment.

As shown in FIG. 11A, a plurality of third interconnections 47 of one Cu layer 51 are formed on the surface of the sealing resin 10 by the same step as that of the first embodiment. Some of the third interconnections 47 are electrically connected to the semiconductor chip 1 via the non-via plugs (fourth interconnections) 48 and chip interconnections (first interconnections) 5. However, similar to the first embodiment, all the third interconnections 47 need not necessarily be electrically connected to the semiconductor chip 1. Some of the third interconnections 47 may not be electrically connected to the semiconductor chip 1. Third interconnections 47 which are not connected to the semiconductor chip 1 may be formed as dummy interconnections or relay interconnections. Also in the fourth embodiment, similar to the first embodiment, a major surface (sealing resin 10 side) of the resin-sealed package 46 on which the third interconnections 47 are formed is designed as a package mounting surface 46a. A major surface (flexible base 41 side) of the resin-sealed package 46 on which the second interconnections 43 are formed serves as a substrate packaging surface 46b.

Figure 11B:
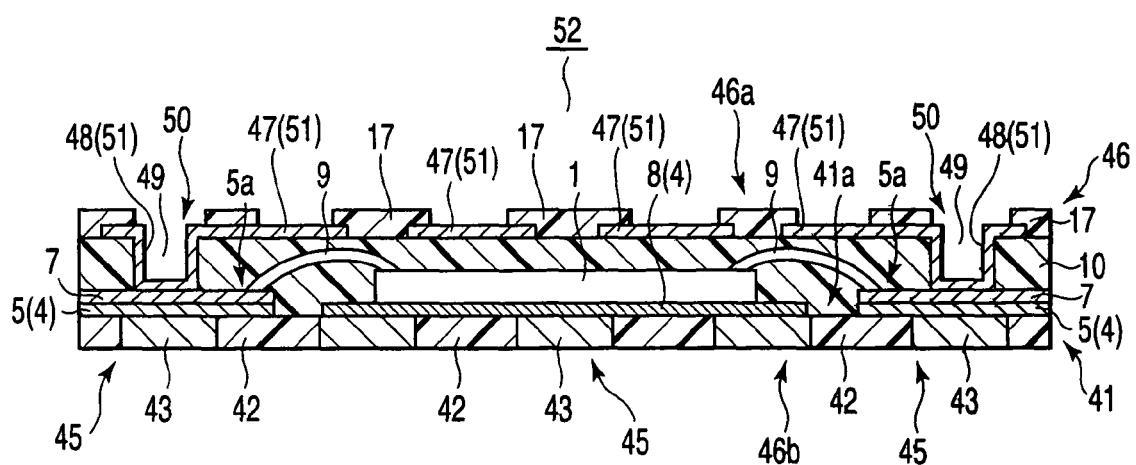

As shown in FIG. 11B, a solder resist 17 is applied with a predetermined pattern onto the surface of the sealing resin 10 having a plurality of third interconnections 47 by the same step as that of the first embodiment.

Although not shown, if necessary, predetermined surface treatment such as Ni/Au plating or corrosion prevention is performed for the third interconnections 47 serving as package mounting terminals by the same step as that of the first embodiment. Subsequently, a solder paste is applied onto the package mounting surface 46a of the resin-sealed package 46. If necessary, a plurality of solder balls are brought into contact with (bonded to) the second interconnections 43, and mounted on the substrate packaging surface 46b of the resin-sealed package 46. The resin-sealed package 46 having the solder paste is reflowed to form solder layers about 50 μm to 0.3 mm thick over surfaces of the third interconnections 47 that are exposed from the solder resist 17. The interiors of the non-via holes 49 having the non-via plugs 48 are filled with the solder layers. If necessary, the second interconnections 43 serving as substrate packaging terminals undergo surface treatment such as corrosion prevention or Ni/Au plating which makes the solder easily wet and makes it difficult to form an unfused oxide film on the surfaces of the second interconnections 43 at a high-temperature test.

An assembly of the resin-sealed packages 46 fabricated at once by the above steps is cut from a tape into individual packages by dicing or the like. Various tests are executed for the resin-sealed packages 46, and resin-sealed packages 46 which have passed these tests are determined as nondefectives. As a result, a desired semiconductor device 52 according to the fourth embodiment having the resin-sealed package 46 shown in FIG. 11B as a main building component is obtained.

That is, the semiconductor device 52 is built by the resin-sealed package 46. The resin-sealed package 46 comprises a plurality of Cu interconnections (third interconnections) 47 serving as package mounting terminals (package mounting interconnections) on the package mounting surface 46a of the resin-sealed package 46, and on the substrate packaging surface 46b of the resin-sealed package 46, a plurality of Cu interconnections (second interconnections) 43 serving as substrate packaging terminals each having one end which extends through the base body 42 of the chip mounting base 41 and is electrically connected to a corresponding one of Cu chip interconnections (first interconnections) 5 on the chip mounting surface 41a of the chip mounting base 41, and the other end which is exposed on the non-chip mounting surface 41b of the chip mounting base 41. One semiconductor chip 1 which is wire-bonded to the Cu chip interconnections 5 and mounted on the chip mounting base 41 is electrically connected to the Cu interconnections 43 and 47 via the chip interconnections 5 and a plurality of non-via plugs (fourth interconnections) 48 which extend through the sealing resin 10 along the direction of thickness.

If necessary, predetermined external devices (not shown) such as a passive component are mounted on the package mounting surface 46a of the semiconductor device 52. Also, if necessary, a packaging substrate (not shown) is packaged on the substrate packaging surface 46b of the semiconductor device 52. If necessary, a plurality of semiconductor devices 52 are stacked and used as a multichip package.

As described above, the fourth embodiment can attain the same effects as those of the first and third embodiments even by using the single-sided copper-clad tape 41 instead of the double-sided copper-clad tape 2 used in the first and third embodiments. The Cu second interconnections 43 are buried in the base body 42 of the flexible base 41, and hardly oxidize. In other words, the second interconnections 43 are so formed as to hardly deteriorate their quality with high durability, high reliability, and the like. Thus, the semiconductor device 52 of the fourth embodiment having the second interconnections 43 is improved in quality, reliability, durability, yield, and the like. The fourth embodiment can efficiently, easily manufacture a semiconductor device 52 with high versatility, high quality, high reliability, high durability, and high yield at low cost.

Fifth Embodiment

The fifth embodiment according to the present invention will be described with reference to FIGS. 12A to 14B. FIGS. 12A to 14B are sectional views respectively showing steps in a semiconductor device manufacturing method according to the fifth embodiment. The same reference numerals as in the first embodiment denote the same parts, and a detailed description thereof will be omitted.

More specifically, the fifth embodiment will explain a semiconductor device and manufacturing method therefor as a combination of the third and fourth embodiments described above. The fifth embodiment will be described in detail.

As shown in FIG. 12A, one flexible base (single-sided copper-clad tape) 41 employed in the fourth embodiment is prepared as a chip mounting base. A plurality of first interconnections 5 including at least one chip interconnection are provided on a chip mounting surface 41a of the flexible base 41 by the same step as that of the third embodiment. The first interconnections 5 also include a chip mount die pad 8 on which at least one semiconductor chip 1 is to be electrically connected and mounted by flip chip connection. By the same step as that of the third embodiment, a plurality of Ni/Au plated bumps 31 are provided on the surfaces of pad connecting portions 5a of the chip mount die pad 8 in accordance with the layout of the connecting pads of the semiconductor chip 1. A plurality of second interconnections 43 each having one end which extends through a base body 42 of the chip mounting base 41 and is electrically connected to a corresponding one of the chip interconnections (first interconnections) 5 on the chip mounting surface 41a, and the other end which is exposed on a non-chip mounting surface 41b of the flexible base 41 are provided at first interconnection connecting portions 45 of the flexible base 41 by the same step as that of the fourth embodiment.

As shown in FIG. 12B, one semiconductor chip 1 is flip-chip-connected to the chip mount die pad 8 via the Ni/Au-plating bumps 31 by the same step as that of the third embodiment. At this time, the semiconductor chip 1 is adhered to the chip mount die pad 8 with an adhesive 32. Accordingly, the semiconductor chip 1 is electrically connected to at least one chip interconnection 5, and mounted on the chip mounting surface 41a of the flexible base 41.

As shown in FIG. 12C, similar to the third embodiment, a sealing resin 10 is applied by transfer molding onto the chip mounting surface 41a of the flexible base 41, and cover the semiconductor chip 1, chip interconnections 5, chip mount die pad 8 (pad connecting portions 5a), Ni/Au-plating bumps 31, adhesive 32, and the like. The above steps provide a resin-sealed package 61 comprised of the semiconductor chip 1, flexible base 41, sealing resin 10, and the like. The resin-sealed package 61 serves as a main building component of a semiconductor device 64 according to the fifth embodiment.

Figure 13A:
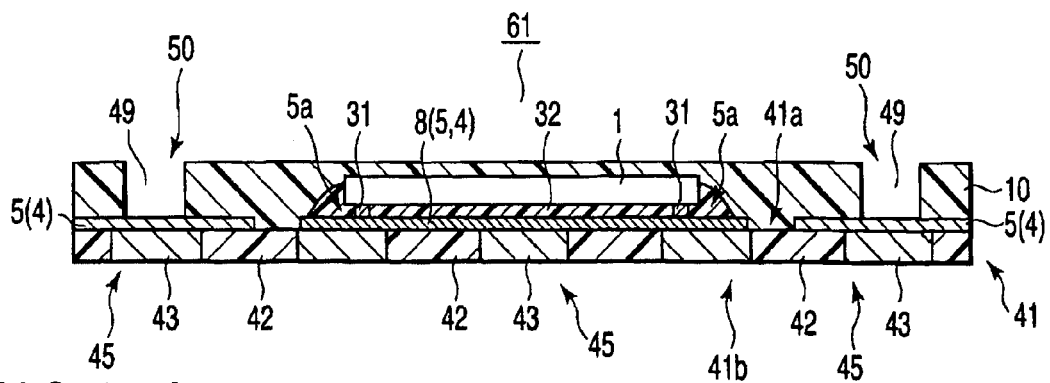
FIGS. 13A to 13D are sectional views respectively showing steps in the semiconductor device manufacturing method according to the fifth embodiment.

As shown in FIG. 13A, a plurality of non-via holes 49 are provided at second interconnection connecting portions 50 of the resin-sealed package 61 by the same step as that of the fourth embodiment, and extend through only the sealing resin 10 along the direction of thickness.

Figure 13B:
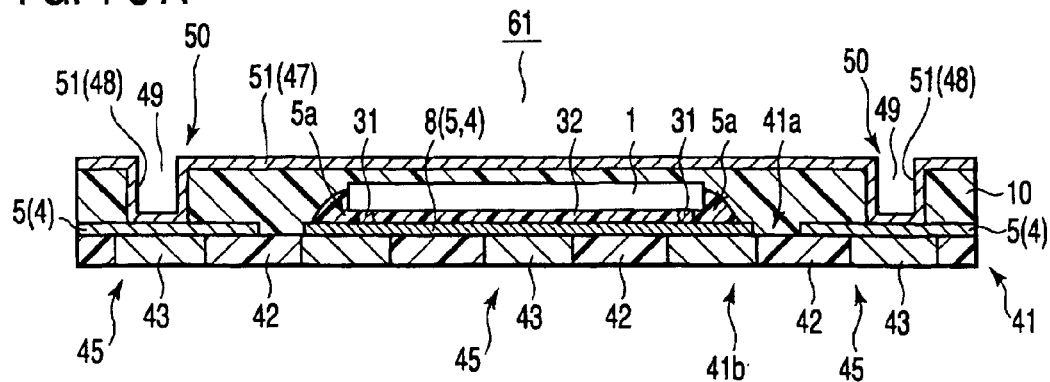

As shown in FIG. 13B, similar to the fourth embodiment, one Cu layer 51 as a combination of an electroless Cu layer about 0.01 μm to 1 μm thick and an electrolytic Cu layer about 1 μm to 30 μm thick is provided at once integrally on the surface of the sealing resin 10 and inside the non-via holes 49 by successively executing electroless plating and electrolytic plating. The Cu layer 51 provided on the sealing resin 10 is processed into a plurality of third interconnections 47 in a subsequent step. The Cu layer 51 provided inside the non-via holes 49 is directly used as a plurality of non-via plugs 48 which are a plurality of fourth interconnections.

Figure 13C:
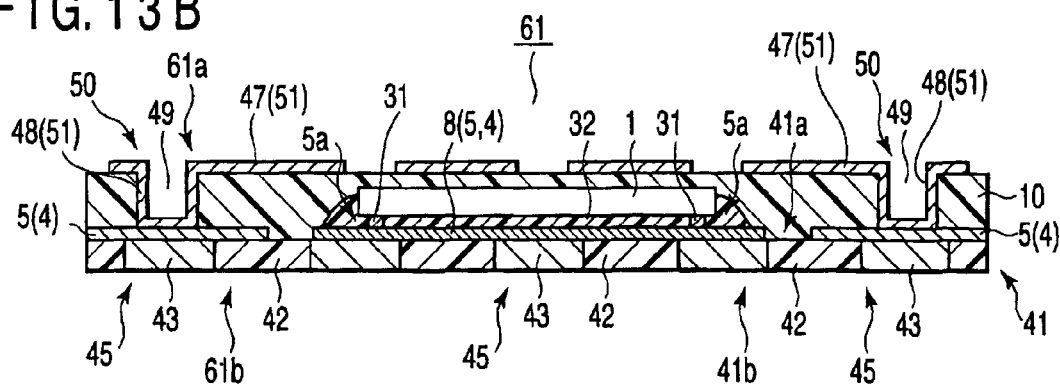

As shown in FIG. 13C, a plurality of third interconnections 47 of one Cu layer 51 are formed on the surface of the sealing resin 10 by the same step as that of the fourth embodiment.

Some of the third interconnections 47 are electrically connected to the semiconductor chip 1 via the non-via plugs 48 and chip interconnections 5.

Also in the fifth embodiment, similar to the first, third, and fourth embodiments, a major surface (sealing resin 10 side) of the resin-sealed package 61 on which the third interconnections 47 are formed serves as a package mounting surface 61a. A major surface (flexible base 41 side) of the resin-sealed package 61 on which the second interconnections 43 are formed serves as a substrate packaging surface 61b.

Figure 13D:
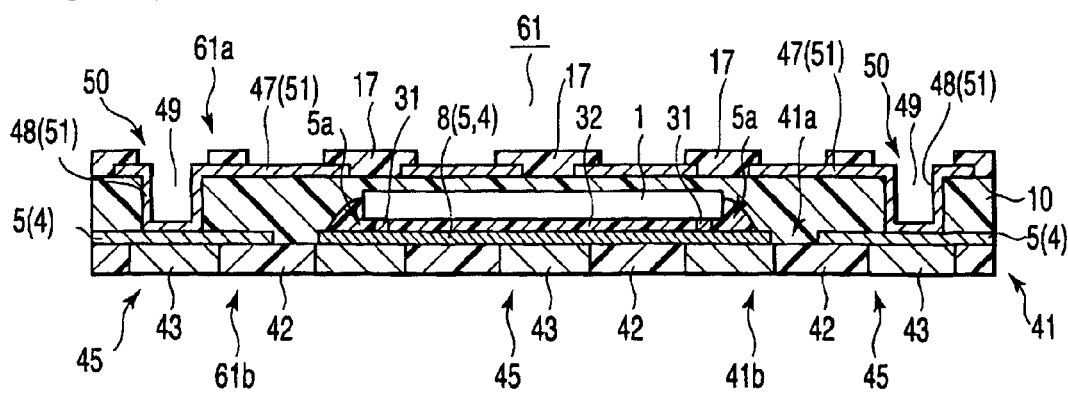

As shown in FIG. 13D, a solder resist 17 is applied with a predetermined pattern onto the surface of the sealing resin 10 having a plurality of third interconnections 47 by the same step as that of the first, third, and fourth embodiment. Although not shown, if necessary, predetermined surface treatment such as Ni/Au plating or corrosion prevention is performed for the third interconnections 13 serving as package mounting terminals by the same step as that of the first embodiment.

Figure 14A:
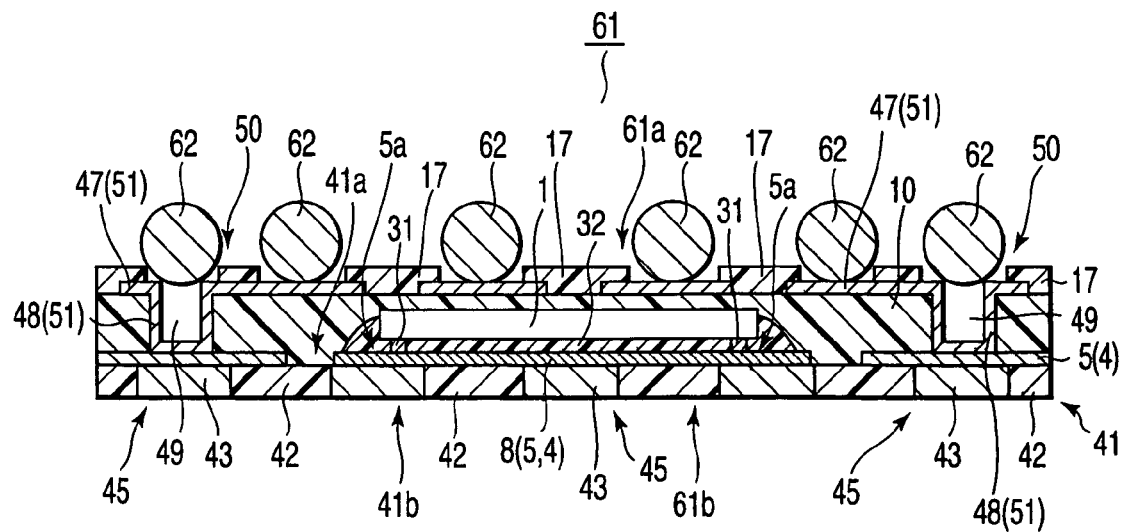
FIGS. 14A and 14B are sectional views respectively showing steps in the semiconductor device manufacturing method according to the fifth embodiment.

As shown in FIG. 14A, connecting conductive members 62 for electrically connecting an external component and the like to the third interconnections 47 and non-via plugs 48 are provided on the chip mounting surface 61a of the resin-sealed package 61. In the fifth embodiment, for example, one solder ball 62 is provided on a surface of each third interconnection 47 that is exposed from the solder resist 17. At the same time, one solder ball 62 is provided in the opening of each non-via hole 49 having one non-via plug 48.

Figure 14B:
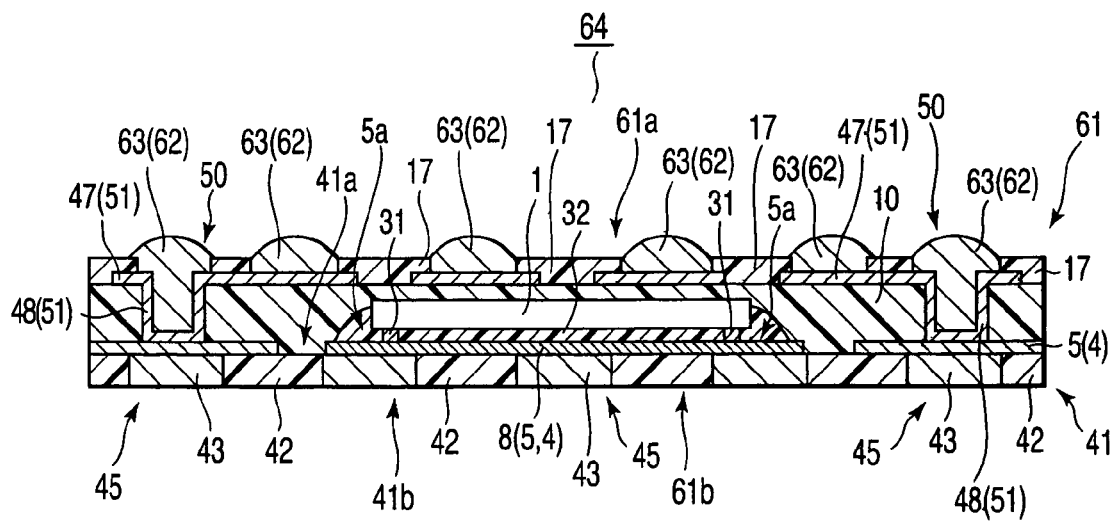

As shown in FIG. 14B, solder layers 63 are formed on the package mounting surface 61a of the resin-sealed package 61. More specifically, similar to the first embodiment, the solder balls 62 on the package mounting surface 61a of the resin-sealed package 61 are reflowed to form the solder layers 63 over surfaces of the third interconnections 47 that are exposed from the solder resist 17. At this time, the interior of each non-via hole 49 having one non-via plug 48 is filled with the solder layer 19. Although not shown, if necessary, the surfaces of the second interconnections 43 serving as substrate packaging terminals are subjected by the same step as that of the first embodiment to surface treatment such as corrosion prevention or Ni/Au plating which makes the solder easily wet and makes it difficult to form an unfused oxide film on the surfaces of the second interconnections 43 at a high-temperature test.

An assembly of the resin-sealed packages 61 fabricated at once by the above steps is cut from a tape into individual packages by dicing or the like. Various tests are executed for the resin-sealed packages 61, and resin-sealed packages 61 which have passed these tests are determined as nondefectives. As a result, a desired semiconductor device 64 according to the fifth embodiment having the resin-sealed package 61 shown in FIG. 14B as a main building component is attained.

That is, the semiconductor device 64 is built by the resin-sealed package 61. The resin-sealed package 61 comprises a plurality of Cu interconnections (third interconnections) 47 serving as package mounting terminals (package mounting interconnections) on the package mounting surface 61a of the resin-sealed package 61, and on the substrate packaging surface 61b of the resin-sealed package 61, a plurality of Cu interconnections (second interconnections) 43 serving as substrate packaging terminals each having one end which extends through the base body 42 of the chip mounting base 41 and is electrically connected to a corresponding one of Cu chip interconnections (first interconnections) 5 on the chip mounting surface 41a of the chip mounting base 41, and the other end which is exposed on the non-chip mounting surface 41b of the chip mounting base 41. One semiconductor chip 1 which is flip-chip-connected to the Cu chip interconnections 5 and mounted on the chip mounting base 41 is electrically connected to the Cu interconnections 43 and Cu interconnections 47 via the chip interconnections 5 and a plurality of non-via plugs (fourth interconnections) 48 which extend through the sealing resin 10 along the direction of thickness.

If necessary, predetermined external devices (not shown) such as a passive component are mounted on the package mounting surface 61a of the semiconductor device 64. Also, if necessary, a packaging substrate (not shown) is packaged on the substrate packaging surface 61b of the semiconductor device 64. If necessary, a plurality of semiconductor devices 64 are stacked and used as a multichip package. A technique of stacking a plurality of semiconductor devices 64 into a multichip package will be described in detail in the sixth embodiment.

As described above, the fifth embodiment can attain the same effects as those of the first, third, and fourth embodiments. In the fifth embodiment, the semiconductor chip 1 is mounted by flip chip connection on the flexible base (single-sided copper-clad tape) 41 in which the Cu second interconnections 43 are buried in the base body 42. This can achieve a compact, highly integrated semiconductor device 64 and suppress the production cost while improving the quality, reliability, durability, performance, production efficiency, and yield of the semiconductor device 64. The fifth embodiment can efficiently, easily manufacture a compact semiconductor device 64 with high versatility, high quality, high reliability, high durability, high performance (function), and high yield at low cost.

Sixth Embodiment

Figure 15:
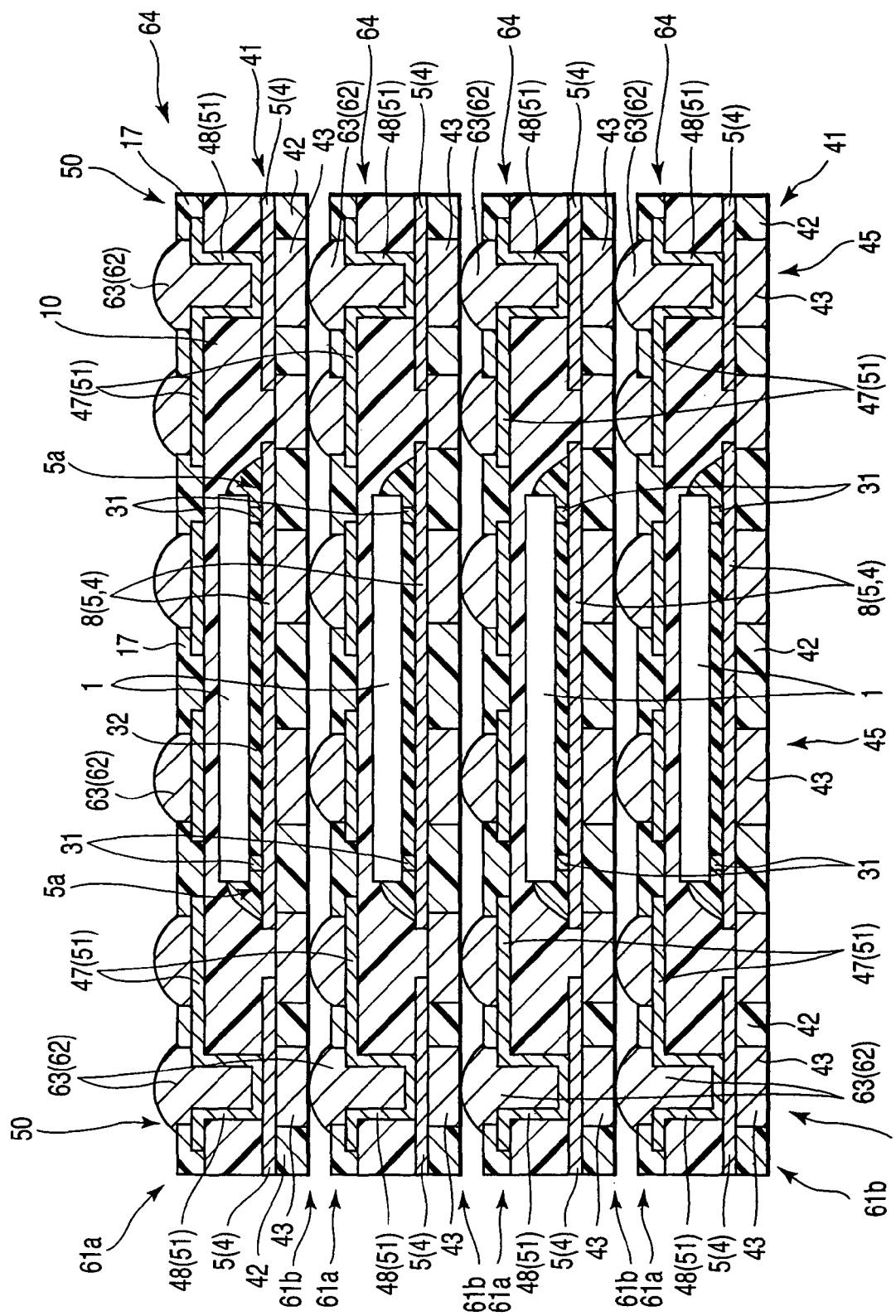
FIG. 15 is a sectional view showing a step in a semiconductor device manufacturing method according to the sixth embodiment.
Figure 16:
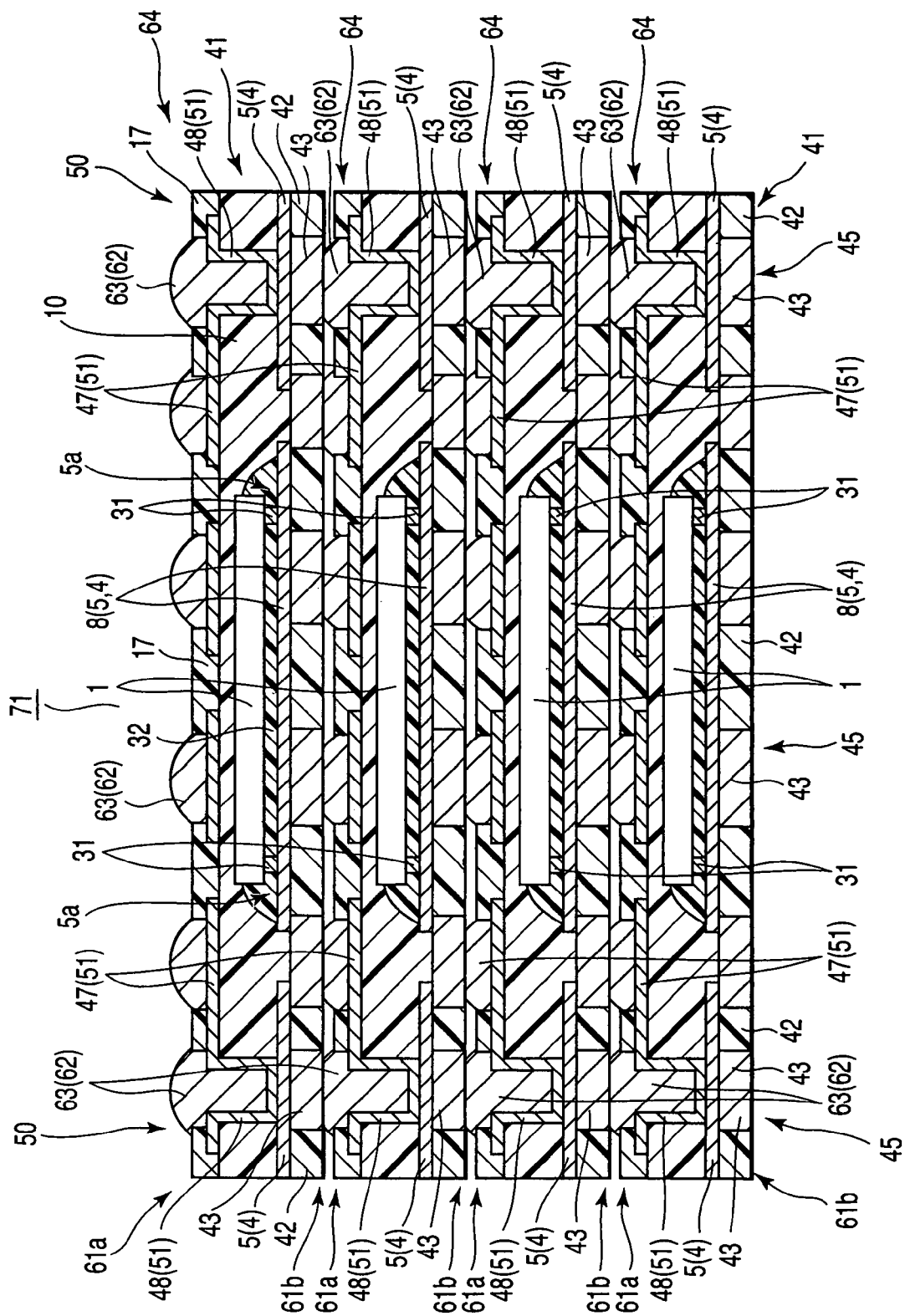
FIG. 16 is a sectional view showing another step in the semiconductor device manufacturing method according to the sixth embodiment.

The sixth embodiment according to the present invention will be described with reference to FIGS. 15 and 16. FIGS. 15 and 16 are sectional views respectively showing steps in a semiconductor device manufacturing method according to the sixth embodiment. The same reference numerals as in the first embodiment denote the same parts, and a detailed description thereof will be omitted.

The sixth embodiment will explain a semiconductor device manufactured by stacking a plurality of semiconductor devices 64 according to the fifth embodiment, and a manufacturing method therefor. The sixth embodiment will be described in detail.

As shown in FIG. 15, four semiconductor devices 64 of the fifth embodiment are stacked and arranged. Solder layers 63 on a package mounting surface 61a of a lower semiconductor device 64 and lower connecting terminals (lower interconnections or second interconnections) 43 on a substrate packaging surface 61b of an upper semiconductor device 64 are brought into contact with each other, thus arranging the semiconductor devices 64.

As shown in FIG. 16, the four stacked semiconductor devices 64 are reflowed. The adjacent semiconductor devices 64 are electrically connect and bonded to each other.

Although not shown, various tests to inspect whether the multilayered member can be actually used as a product are executed for the multilayered member of the four bonded semiconductor devices 64 under various environments such as low temperatures or high temperatures. A multilayered member which has passed these tests is adopted as a nondefective. Consequently, a desired semiconductor device 71 according to the sixth embodiment is obtained, as shown in FIG. 16. In other words, the semiconductor device 71 is attained as a chip-stacked multichip package (multichip module) prepared by stacking four semiconductor devices 64 of the fifth embodiment which are single chip packages (single chip modules).

If necessary, predetermined external devices (not shown) such as a passive component are mounted on the package mounting surface 61a of the uppermost single chip package 64. Also, if necessary, a packaging substrate (not shown) is packaged on the substrate packaging surface 61b of the lowermost single chip package 64.

As described above, the sixth embodiment can realize the same effects as those of the second embodiment. The chip-stacked multichip package 71 of the sixth embodiment is fabricated by stacking the semiconductor devices 64 of the fifth embodiment as single chip packages. Compactness, high integration degree, and suppression of the production cost can be achieved while the quality, reliability, durability, performance, production efficiency, and yield of the multichip package 71 are improved. The sixth embodiment can more efficiently, more easily manufacture a more compact chip-stacked multichip package 71 with higher versatility, higher quality, higher reliability, higher durability, higher performance (function), and higher yield at lower cost.

Seventh Embodiment

Figure 17A:
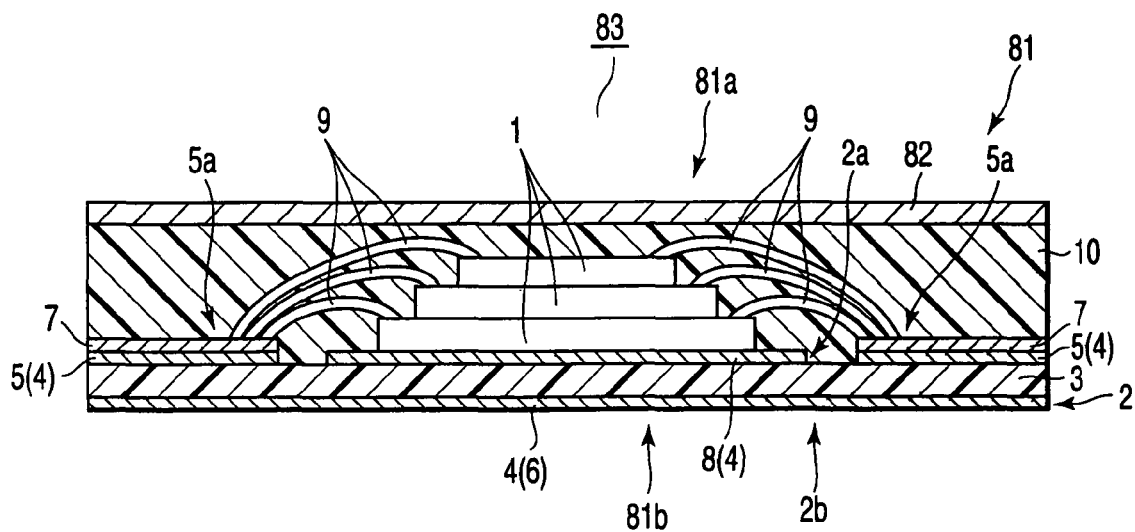
FIGS. 17A and 17B are sectional views showing a semiconductor device according to the seventh embodiment.
Figure 17B:
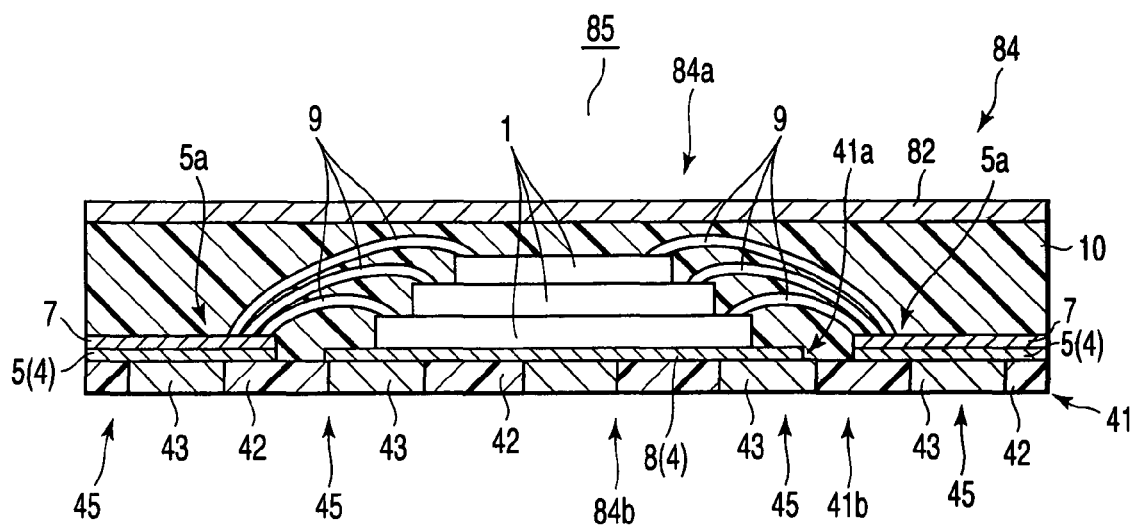

The seventh embodiment according to the present invention will be described with reference to FIGS. 17A and 17B. FIGS. 17A and 17B are sectional views each showing a semiconductor device according to the seventh embodiment. The same reference numerals as in the first embodiment denote the same parts, and a detailed description thereof will be omitted.

The seventh embodiment will explain a semiconductor device manufactured by stacking a plurality of semiconductor elements in one semiconductor device, and a manufacturing method therefor. The seventh embodiment will be described in detail.

FIG. 17A shows a resin-sealed package 81 in which a semiconductor chip 1 is wire-bonded and mounted on a chip mounting surface 2a of a flexible base 2 formed from a double-sided copper-clad tape, similar to the resin-sealed package 11 (semiconductor device 20) according to the first embodiment. A plurality of first interconnections (chip interconnections) 5 are formed on the flexible base 2. Unlike the first embodiment, three semiconductor chips 1 are stacked and mounted on the chip mounting surface 2a of the flexible base 2. The semiconductor chips 1 are electrically connected to the chip interconnections 5 by Au bonding wires 9, respectively. A Cu foil 82 serving as the third interconnection is provided on the surface of a sealing resin 10.

Although not shown, pluralities of second to fourth interconnections are formed on the resin-sealed package 81 having this arrangement. Of the second to fourth interconnections, the second and third interconnections are formed by the same steps as those of the first embodiment. More specifically, the second interconnections are formed by etching a Cu foil 4 on a non-chip mounting surface 2b of the flexible base 2 into a predetermined pattern. Similarly, the third interconnections are formed by etching the Cu foil 82 on the surface of the sealing resin 10 into a predetermined pattern. Unlike the first embodiment, the fourth interconnections (through plugs) are formed in a different step separately from the third interconnections.

More specifically, a plurality of through holes are so formed as to extend at once through the Cu foil 82 (third interconnections), the sealing resin 10, Ni/Au-plating portions 7, the chip interconnections (first interconnections), the flexible base 2, and the Cu foil 4 (second interconnections) along the direction of thickness of the resin-sealed package 81. A Cu layer is provided over the inner wall surfaces of the through holes. Consequently, a plurality of through plugs which electrically connect the chip interconnections (first interconnections), second interconnections, and third interconnections at once along the direction of thickness of the resin-sealed package 81 are formed in the resin-sealed package 81.

According to this interconnection formation step, the order of forming the second interconnections, third interconnections, and through plugs can be properly set. For example, the second interconnections, third interconnections, and through plugs may be formed in an order named. The third interconnections, second interconnections, and through plugs may be formed in an order named. The through plugs, second interconnections, and third interconnections may be formed in an order named. The through plugs, third interconnections, and second interconnections may be formed in an order named. The through plugs may be formed after the second and third interconnections are formed at once. The second and third interconnections may be formed at once after the through plugs are formed.

After the second to fourth interconnections are formed in the resin-sealed package 81, a solder resist is applied with predetermined patterns onto the non-chip mounting surface 2*b* of the flexible base 2 having the second interconnections and the surface of the sealing resin 10 having the third interconnections. If necessary, predetermined surface treatment such as Ni/Au plating or corrosion prevention is done for interconnections serving as package mounting terminals out of the second and third interconnections. A solder paste is applied onto a package mounting surface 81*a* of the resin-sealed package 81. If necessary, a plurality of solder balls are brought into contact with (bonded to) the second interconnections, and mounted on a substrate packaging surface 81*b* of the resin-sealed package 81.

The resin-sealed package 81 having the solder paste is reflowed to form solder layers over surfaces of the third interconnections that are exposed from the solder resist. The interiors of the through holes having the through plugs (fourth interconnections) are filled with the solder layers. If necessary, the second interconnections serving as substrate packaging terminals undergo surface treatment such as corrosion prevention or Ni/Au plating which makes the solder easily wet and makes it difficult to form an unfused oxide film on the surfaces of the second interconnections at a high-temperature test.

An assembly of the resin-sealed packages 81 fabricated at once by the above steps is cut from a tape into individual packages by dicing or the like. Various tests are executed for the resin-sealed packages 81, and resin-sealed packages 81 which have passed these tests are determined as nondefectives. As a result, a desired semiconductor device 83 according to the seventh embodiment having the resin-sealed package 81 shown in FIG. 17A as a main building component is obtained. That is, the seventh embodiment provides the semiconductor device 83 in which three semiconductor chips 1 are stacked and mounted by wire bonding within the resin-sealed package 81 having almost the same arrangement as that of the resin-sealed package 11 of the first embodiment.

If necessary, predetermined external devices (not shown) such as a passive component are mounted on the package mounting surface 81*a* of the semiconductor device 83. Also, if necessary, a packaging substrate (not shown) is packaged on the substrate packaging surface 78*b* of the semiconductor device 83. If necessary, a plurality of semiconductor devices 83 are stacked and used as a multichip package.

FIG. 17B shows a resin-sealed package 84 in which a semiconductor chip 1 is flip-chip-connected and mounted on a chip mounting surface 41*a* of a flexible base 41 formed from a single-sided copper-clad tape, similar to the resin-sealed package 46 (semiconductor device 52) according to the fourth embodiment. Pluralities of first interconnections (chip interconnections) 5 and second interconnections 43 are formed on the flexible base 41. Unlike the fourth embodiment, three semiconductor chips 1 are stacked and mounted on the chip mounting surface 41*a* of the flexible base 41. The semiconductor chips 1 are electrically connected to the chip interconnections 5 by Au bonding wires 9, respectively. A Cu foil 82 serving as the third interconnection is provided on the surface of a sealing resin 10.

Although not shown, pluralities of third and fourth interconnections are formed on the resin-sealed package 84 having this arrangement. Similar to the fourth embodiment, the third interconnections are formed by etching the Cu foil 82 on the surface of the sealing resin 10 into a predetermined pattern. Unlike the fourth embodiment, the fourth interconnections (non-via plugs) are formed in a different step separately from the third interconnections.

More specifically, a plurality of non-via holes are so formed as to extend at once through only the Cu foil 82 (third interconnections) and sealing resin 10 along the direction of thickness of the resin-sealed package 84 with, e.g., a predetermined laser beam. A Cu layer is provided inside the non-via holes by, e.g., plating. As a result, a plurality of non-via plugs which electrically connect the chip interconnections (first interconnections) electrically connected to the third and second interconnections are electrically connected at once along the direction of thickness of the resin-sealed package 84 are formed in the resin-sealed package 84.

According to this interconnection formation step, the order of forming the third interconnections and non-via plugs can be properly set. For example, the third interconnections and non-via plugs may be formed in an order named. The non-via plugs and third interconnections may be formed in an order named.

After the third and fourth interconnections are formed in the resin-sealed package 84, a solder resist is applied with predetermined patterns onto a non-chip mounting surface 41*b* of the flexible base 41 having the second interconnections 43 and the surface of the sealing resin 10 having the third interconnections. If necessary, predetermined surface treatment such as Ni/Au plating or corrosion prevention is done for interconnections serving as package mounting terminals out of the second and third interconnections. A solder paste is applied onto a package mounting surface 84*a* of the resin-sealed package 84. If necessary, a plurality of solder balls are brought into contact with (bonded to) the second interconnections 43, and mounted on a substrate packaging surface 84*b* of the resin-sealed package 84.

The resin-sealed package 84 having the solder paste is reflowed to form solder layers over surfaces of the third interconnections that are exposed from the solder resist. The interiors of the non-via holes having the non-via plugs (fourth interconnections) are filled with the solder layers. If necessary, the second interconnections 43 serving as substrate packaging terminals undergo surface treatment such as corrosion prevention or Ni/Au plating which makes the solder easily wet and makes it difficult to form an unfused oxide film on the surfaces of the second interconnections 43 at a high-temperature test.

An assembly of the resin-sealed packages 84 fabricated at once by the above steps is cut from a tape into individual packages by dicing or the like. Various tests are executed for the resin-sealed packages 84, and resin-sealed packages 84 which have passed these tests are determined as nondefectives. As a result, another desired semiconductor device 85 according to the seventh embodiment having the resin-sealed package 84 shown in FIG. 17B as a main building component is obtained. That is, the seventh embodiment implements the semiconductor device 85 in which three semiconductor chips 1 are stacked and mounted by wire bonding within the resin-sealed package 84 having almost the same arrangement as that of the resin-sealed package 46 of the fourth embodiment.

If necessary, predetermined external devices (not shown) such as a passive component are mounted on the package mounting surface 84a of the semiconductor device 85. Also, if necessary, a packaging substrate (not shown) is packaged on the substrate packaging surface 84b of the semiconductor device 85. If necessary, a plurality of semiconductor devices 85 are stacked and used as a multichip package.

As described above, the seventh embodiment can obtain the same effects as those of the first and third to fifth embodiments. Each of the semiconductor devices 83 and 85 according to the seventh embodiment incorporates a plurality of stacked semiconductor chips 1. In other words, each of the semiconductor devices 83 and 85 according to the seventh embodiment is built as a chip-stacked multichip package. Hence, the semiconductor devices 83 and 85 exhibit a higher integration degree and more advanced functions (a larger number of functions) in comparison with the semiconductor devices 20, 34, 52, and 64 according to the first and third to fifth embodiments. If the number of stacked semiconductor chips 1 is constant, the semiconductor devices 83 and 85 can be fabricated more compact than the semiconductor devices (multichip packages) 21 and 71 of the second and sixth embodiments which are fabricated by stacking pluralities of semiconductor devices 20 and 64 of the first and fifth embodiments.

Eighth Embodiment

Figure 18A:
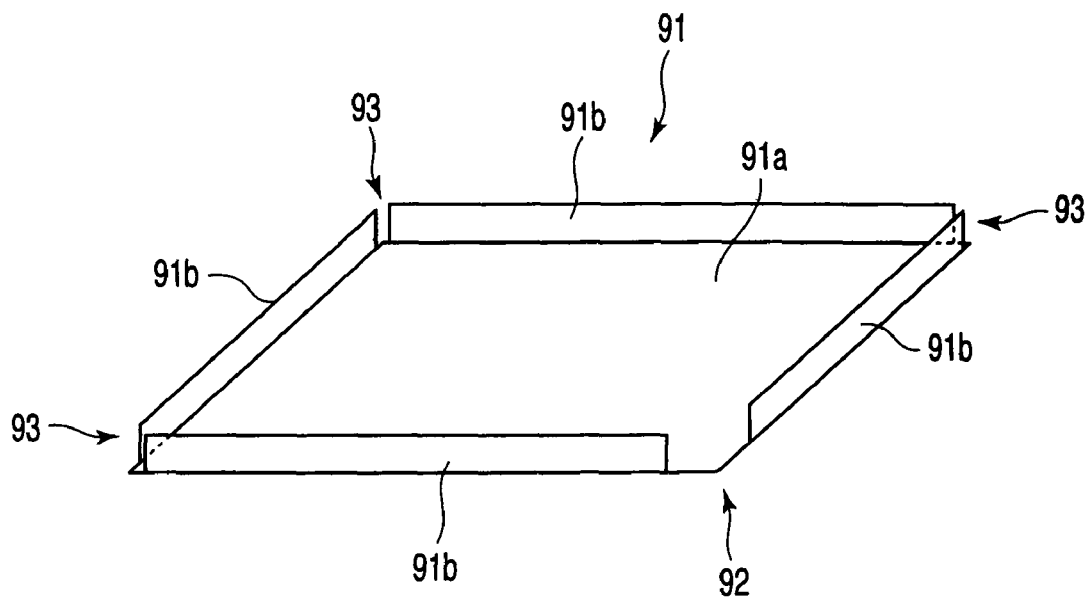
FIGS. 18A and 18B are a perspective view and plan view respectively showing a conductor serving as the third interconnection of a semiconductor device according to the eighth embodiment.
Figure 18B:
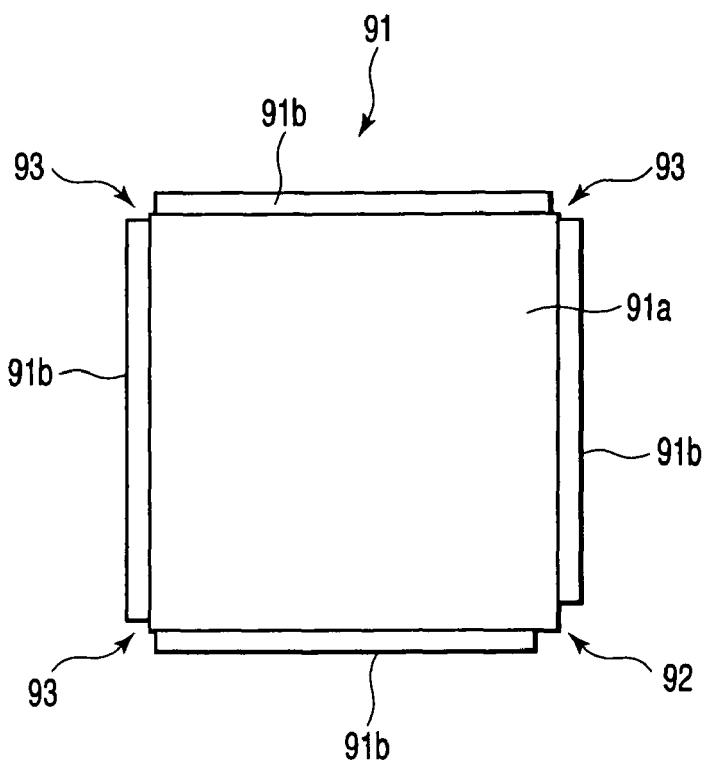

The eighth embodiment according to the present invention will be described with reference to FIGS. 18A to 20B. FIGS. 18A and 18B are a perspective view and plan view respectively showing a conductor serving as the third interconnection of a semiconductor device according to the eighth embodiment. FIGS. 19A to 20B are sectional views respectively showing steps in a semiconductor device manufacturing method according to the eighth embodiment. The same reference numerals as in the first embodiment denote the same parts, and a detailed description thereof will be omitted.

The eighth embodiment will explain a semiconductor device manufactured by providing a sealing resin and third interconnection (upper interconnection or package mounting interconnection) at once, and a manufacturing method therefor. The eighth embodiment will be described in detail.

Prior to a description of the present invention, the prior art will be explained as a comparative example of the eighth embodiment with reference to FIGS. 25 to 27.

Figure 25:
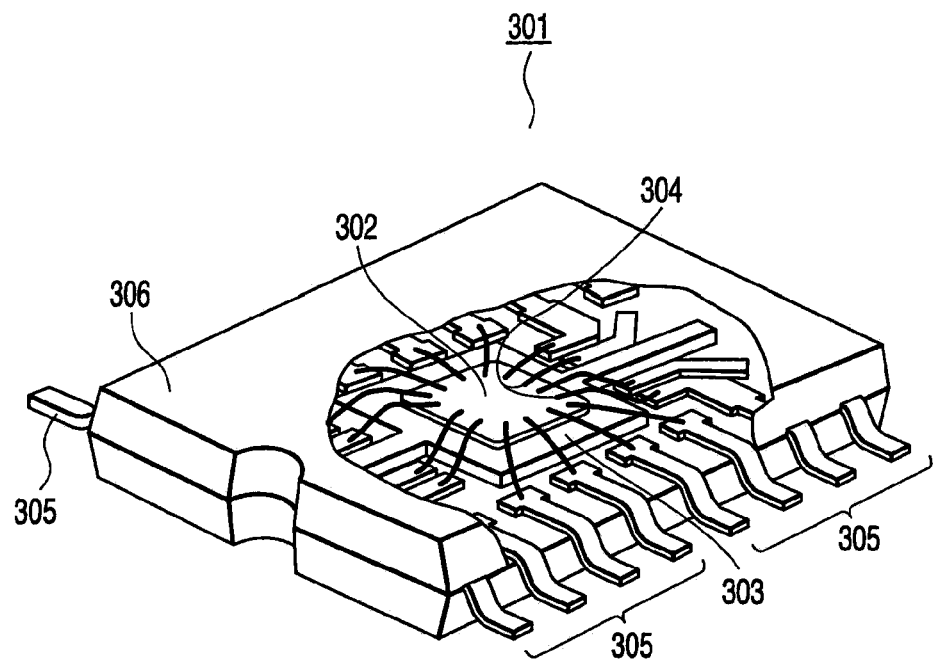
FIG. 25 is a partially cutaway perspective view showing a semiconductor device according to the prior art as a comparative example of the semiconductor devices according to the eighth and ninth embodiments.

A semiconductor device (semiconductor package) 301 shown in FIG. 25 is manufactured by, e.g., the following method. A semiconductor chip 302 is die-attached to a die pad 303. A plurality of connecting pads (electrodes: not shown) of the semiconductor chip 302 are electrically connected to a plurality of lead frames 305 via a plurality of bonding wires 304. The semiconductor chip 302, die pad 303, bonding wires 304, and lead frames 305 are stored in the cavity of a mold (not shown). A sealing resin (mold resin) 306 as a resin mixture of epoxy and silica filler is poured into the cavity to execute transfer forming (transfer molding). At this time, ends of the lead frames 305 that are not connected to the semiconductor chip 302 are set so that the ends are not covered with the mold resin 306. As shown in FIG. 25, the semiconductor package (resin-sealed package) 301 in which ends of the lead frames 305 that are not connected to the semiconductor chip 302 are exposed from the mold resin 306 is obtained.

Figure 26:
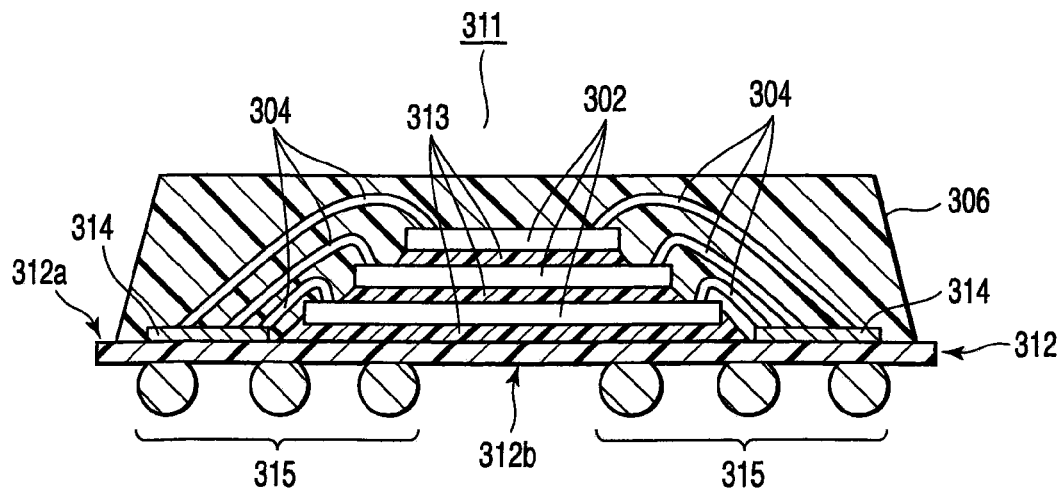
FIG. 26 is a sectional view showing another semiconductor device according to the prior art as another comparative example of the semiconductor devices according to the eighth and ninth embodiments.

A semiconductor device (semiconductor package) 311 shown in FIG. 26 is manufactured by, e.g., the following method. A plurality of semiconductor chips 302 are stacked and mounted on one chip mounting substrate 312. The semiconductor chips 302 are adhered to the chip mounting substrate 312 or lower semiconductor chips 302 with an adhesive 313. The connecting pads of the semiconductor chips 302 are electrically connected to a plurality of chip interconnections 314 on a chip mounting surface 312a of the chip mounting substrate 312 via a plurality of bonding wires 304. The semiconductor chips 302, chip mounting substrate 312, and bonding wires 304 are stored in the cavity of a mold (not shown). The mold resin 306 as a resin mixture of epoxy and silica filler is poured into the cavity to execute transfer forming. At this time, the mold resin 306 is set so that it is provided on only the chip mounting surface 312a of the chip mounting substrate 312 and covers the semiconductor chips 302, bonding wires 304, and chip interconnections 314. A plurality of solder balls (Ball Grid Arrays: BGA) 315 are provided as external terminals on a non-chip mounting surface 312b of the chip mounting substrate 312. As shown in FIG. 26, the chip-stacked semiconductor package (multichip BGA package) 311 in which the semiconductor chips 302, bonding wires 304, and chip interconnections 314 are covered with the mold resin 306 is obtained.

Figure 27:
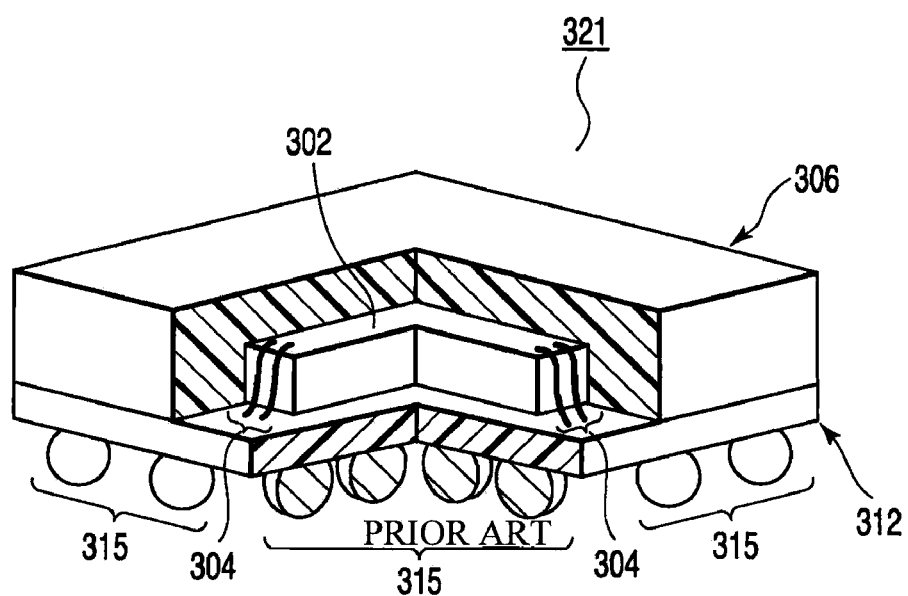
FIG. 27 is a partially cutaway perspective view showing still another semiconductor device according to the prior art as still another comparative example of the semiconductor devices according to the eighth and ninth embodiments.

A semiconductor device (semiconductor package) 321 shown in FIG. 27 is a package in which only one semiconductor chip 302 is mounted on the chip mounting substrate 312 in the chip-stacked semiconductor device 311 shown in FIG. 26. The semiconductor package 321 shown in FIG. 27 is a so-called single chip BGA package.

According to the above-described semiconductor package manufacturing methods, the mold resin 306 covers the structure except for I/O terminals such as the solder balls 315 and the ends of the lead frames 305 formed on the chip mounting substrate 312 and lead frames 305. In other words, according to the above-described semiconductor package manufacturing methods, interconnections and terminals for electrically connecting other devices and components cannot be formed on the surface of the mold resin 306 serving as the upper surface of the semiconductor package 301, 311, or 321. Although not shown, when the semiconductor package 301, 311, or 321 is packaged on a packaging substrate, no other semiconductor package, passive component, or the like can be packaged (arranged) in the area where the semiconductor package 301, 311, or 321 is packaged. To embed the semiconductor package 301, 311, or 321 on one packaging substrate together with other semiconductor packages, passive components, and the like, they can only be arranged in a direction along the surface of the packaging substrate. The semiconductor package 301, 311, or 321 inhibits an increase in packaging density.

Techniques associated with semiconductor devices having the structures as shown in FIGS. 25 to 27 and manufacturing methods therefor are disclosed in, e.g., Jpn. Pat. Appln. KOKAI Publication Nos. 11-87560, 10-284873, 2001-189515, 2001-223295, 2001-127186, and 2000-31207.

The eighth embodiment prevents a decrease in packaging density in the use of a resin-sealed package (molding package) having the above-mentioned structure. An object of the eighth embodiment is to provide a semiconductor device which has, on the surface of a sealing member, interconnections and terminals capable of connecting external devices and the like and can be easily, efficiently manufactured. The eighth embodiment also provides a semiconductor device manufacturing method capable of easily, efficiently manufacturing the semiconductor device.

In the eighth embodiment, similar to the first, third to fifth, and seventh embodiments, a semiconductor chip mounted on a substrate is sealed by transfer molding. In sealing, a box-like conductor which covers the semiconductor chip is interposed between the mold and the semiconductor chip (substrate). A sealing member is supplied between the conductor and the substrate supporting the semiconductor chip. Accordingly, sealing of the semiconductor chip and the like and setting of the conductor on the surface (mold-sealed surface) of the sealing resin are executed at once. The conductor on the mold-sealed surface serves as an upper interconnection (upper terminal) and package mounting interconnection (package mounting terminal). The semiconductor device and manufacturing method therefor according to the eighth embodiment will be described in detail with reference to FIGS. 18A to 20B.

A conductor 91 serving as the third interconnection (upper interconnection or package mounting interconnection) on the surface of a sealing resin 10 will be explained with reference to FIGS. 18A and 18B. The conductor 91 preferably uses a copper foil (Cu foil) made of electrolytic copper about 1 to 20 μm thick. As shown in FIG. 18A, the Cu foil 91 adopted in the eighth embodiment is made up of one major surface (lid or bottom) 91a and four side surfaces (side walls) 91b each of which is formed into a square shape. More specifically, the Cu foil 91 is formed into a box shape which conforms to the shape of a cavity 95 of a mold 94 used in the molding step (to be described later). The Cu foil 91 is formed into a box shape which has an opening on a side facing the sealing resin 10 (semiconductor chip 1) and covers the semiconductor chip 1 mounted on a chip mounting base 2 (41).

In formation of the Cu foil 91 into a box shape, cutting into a cross shape as shown in FIG. 18B and bending into a box shape as shown in FIG. 18A are preferably executed at once with a punch die (not shown). At this time, the height (width) of each side wall (bent portion) 91b is set to a size at which the side wall 91b does not contact the semiconductor chip 1 mounted on the chip mounting base 2 (41) during and after the sealing step. For example, the height of the side wall 91b is preferably set to the sum of about 10 to 200 μm and the height from a chip mounting surface 2a (41a) of the chip mounting base 2 (41) to the surface (upper surface) of the semiconductor chip.

The Cu foil 91 has at least at one portion a sealing member inlet port 92 for guiding the sealing resin 10 from outside to inside the Cu foil 91. The sealing member inlet port 92 is provided at a position corresponding to a sealing resin injection gate 96 of the mold 94. In the eighth embodiment, the sealing member inlet port 92 is provided at one of the four corners of the copper foil 91, as shown in FIGS. 18A and 18B. In order to allow the sealing resin 10 to smoothly flow from outside to inside the Cu foil 91 via the sealing member inlet port 92, the sealing member inlet port 92 is formed by setting the interval between the side walls 91b equal to or larger than the sealing resin injection gate 96 of the mold 94.

Similarly, a vent 93 for allowing gas to freely come in and out is provided at at least one portion of the Cu foil 91, different from the sealing member inlet port 92. The mold 94 has an air vent portion (air vent port) 97 for exhausting air of almost the same volume as that of the sealing resin 10 from the mold 94 when the sealing resin 10 flows into the mold 94. The vent 93 is provided at a position corresponding to the air vent portion 97 of the mold 94. In the eighth embodiment, vents 93 are provided at, of the four corners of the Cu foil 91, three corners at which no sealing member inlet port 92 is provided, as shown in FIGS. 18A and 18B. The vent 93 is formed by setting the interval between the side walls 91b equal to or smaller than the air vent portion 97 of the mold 94 so as to exhaust air in the mold 94 from inside to outside the Cu foil 91 via the vents 93. Each vent 93 is formed narrower than the sealing member inlet port 92.

Transfer molding of the eighth embodiment in which sealing of the semiconductor chip 1 and the like and setting of the Cu foil 91 on the surface of the sealing resin 10 are performed at once will be explained with reference to FIGS. 19A to 19C.

Figure 19A:
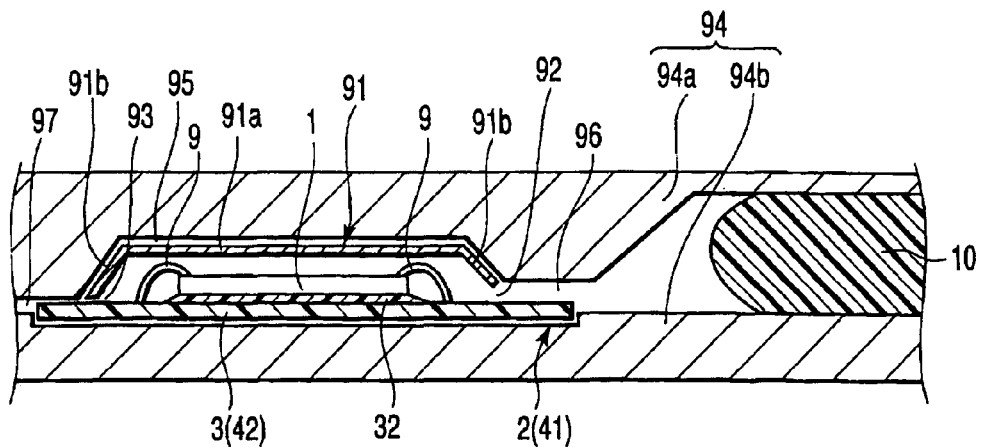
FIGS. 19A to 19C are sectional views respectively showing steps in a semiconductor device manufacturing method according to the eighth embodiment.

As shown in FIG. 19A, the chip mounting base 2 (41) bearing the semiconductor chip 1 is arranged in the cavity 95 of the mold 94 made up of an upper mold 94a and lower mold 94b. In addition, the box-like Cu foil 91 is arranged in the cavity 95 with an opening facing the semiconductor chip 1 so as to cover the semiconductor chip 1, Au bonding wires 9, and the like from above them. That is, the lid 91a and side walls 91b of the Cu foil 91 are arranged in the cavity 95 of the Cu foil 91 along the inner surface of the cavity 95 on the upper mold 94a side. As shown in FIG. 19A, the sealing member inlet port 92 of the Cu foil 91 is opposed to the sealing resin injection gate 96 of the mold 94. Similarly, the vents 93 of the Cu foil 91 are opposed to the air vent portions 97 of the mold 94. After the chip mounting base 2 (41) bearing the semiconductor chip 1 and the Cu foil 91 are stored in the cavity 95 of the mold 94, the sealing resin 10 is injected into the cavity 95.

Figure 19B:
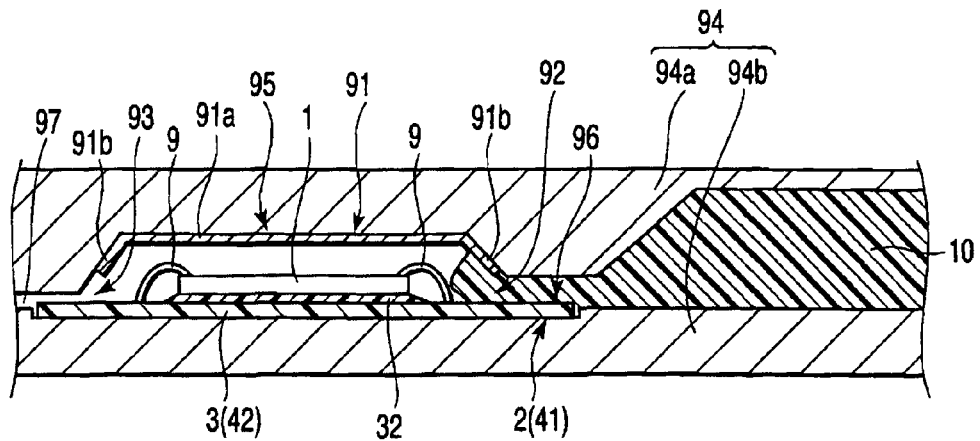

As shown in FIG. 19B, the sealing resin 10 is guided between the Cu foil 91 and the chip mounting base 2 (41) bearing the semiconductor chip 1, from the sealing resin injection gate 96 of the mold 94 via the sealing member inlet port 92 of the Cu foil 91.

Figure 19C:
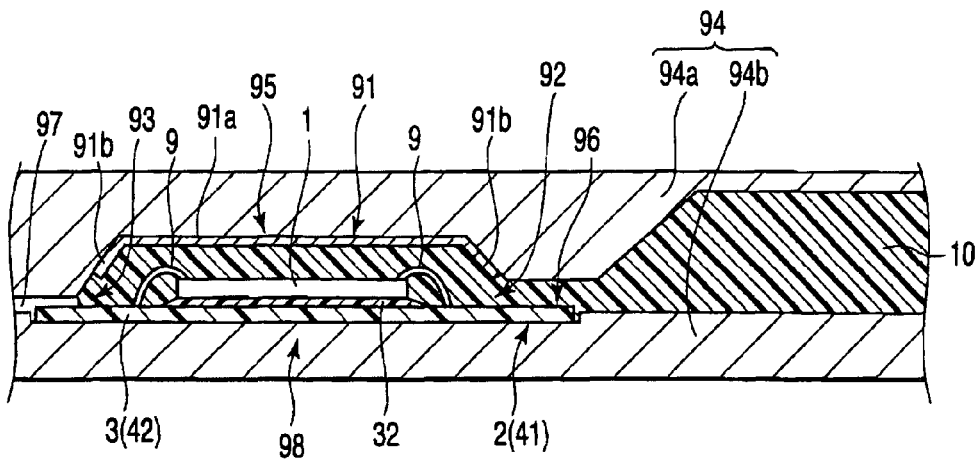

As shown in FIG. 19C, the sealing resin 10 is kept supplied (filled) between the Cu foil 91 and the chip mounting base 2 (41) until the sealing resin 10 almost entirely covers the inner surface of the Cu foil 91, the semiconductor chip 1 on the chip mounting base 2 (41), the Au bonding wires 9, and the like. While the surface of the Cu foil 91 is exposed, sealing of the semiconductor chip 1, Au bonding wires 9, and the like and attachment of the Cu foil 91 onto the surface (mold-sealed surface) of the sealing resin 10 are executed at once. The Cu foil 91 on the mold-sealed surface forms the third interconnections, i.e., upper interconnections (upper terminals) or package mounting interconnections (package mounting terminals) 99. The above steps fabricate a resin-sealed package (mold-sealed package) 98 comprised of the semiconductor chip 1, flexible base 2 (41), sealing resin 10, Cu foil 91, and the like. The resin-sealed package 98 serves as a main building component of a semiconductor device 102 according to the eighth embodiment.

In the transfer molding step of the eighth embodiment, the box-like Cu foil 91 is pressed against the upper mold 94a by the pressure (injection pressure) of the sealing resin 10 flowing inside the Cu foil 91. As a result, the Cu foil 91 is formed into a shape (mold shape) along the inner surface of the cavity 95 on the upper mold 94a side. As described above, the height of each side wall 91b of the Cu foil 91 is set to a size at which the side wall 91b does not contact the semiconductor chip 1 and the like mounted on the chip mounting base 2 (41) during and after the sealing step. Thus, the Cu foil 91 is attached onto the mold-sealed surface without contacting the semiconductor chip 1, Au bonding wires 9, and the like.

In the above-described transfer molding step, as shown in FIG. 19C, the Cu foil 91 which is shaped along the inner surface of the cavity 95 on the upper mold 94a side by the pressure of the sealing resin 10 is interposed between the sealing resin (mold resin) 10 and the upper mold 94a. The Cu foil 91 arranged at this position plays the role of a mold releasing member, and contributes to improving mold release properties between the mold 84 and the resin-sealed package 98. This can reduce the ratio at which the mold releasing member occupies the composite material of the mold resin 10, and improve the adhesion strength between the mold resin 10 and the Cu foil 91. In addition, the adhesion strength between the mold resin 10 and the semiconductor chip 1 or chip mounting base 2 (41) can be improved. This leads to good sealing properties (tight sealing properties) of the whole resin-sealed package 98.

Prior to the transfer molding step, a plurality of chip interconnections (first interconnections) 5 which are electrically connected to the semiconductor chip 1 via the Au bonding wires 9 are formed on the chip mounting surface 2a (41a) of the chip mounting base 2 (41). When the chip mounting base 2 is used, a plurality of second interconnections 6 are formed on a non-chip mounting surface 2b of the chip mounting base 2 after the transfer molding step. The second interconnections 6 serve as external interconnections (external connecting terminals) for electrically connecting the semiconductor chip 1 to external components and the like on the resin-sealed package 98, and external packaging interconnections (external packaging terminals) for packaging the semiconductor chip 1 on a packaging substrate. Also after the transfer molding step, a plurality of fourth interconnections are formed at first interconnection connecting portions (cascade connecting portions) 16 described above, and extend through the chip mounting base 2. The fourth interconnections serve as cascade interconnections for electrically connecting the chip interconnections 5 and second interconnections 6 along the direction of thickness (vertical direction) of the chip mounting base 2.

When the chip mounting base 41 is used, a plurality of second interconnections 43 are formed at first interconnection connecting portions (first external terminals or cascade connecting portions) 45, and extend through the chip mounting base 41 prior to the transfer molding step. The second interconnections 43 play the role of some of cascade interconnections.

Note that FIGS. 19A to 19C illustrate only a base body 3 or 42 of the chip mounting base 2 (41) for illustrative convenience, and do not illustrate interconnections such as the chip interconnections (first interconnections) 5 and second interconnections 43.

A step of forming the third interconnection 99 serving as an upper interconnection (package mounting interconnection), a fourth interconnection 100 serving as a cascade interconnection, and the like in the resin-sealed package 98 fabricated by the transfer molding step will be briefly described with reference to FIGS. 20A and 20B. A case in which the chip mounting base 2 as a double-sided copper-clad tape is employed as a chip mounting base will be explained. In this case, the third and fourth interconnections 99 and 100 are formed by almost the same method as those of the first and third embodiments. A case in which a lead frame is employed in place of the chip mounting base will be described in the ninth embodiment.

Figure 20A:
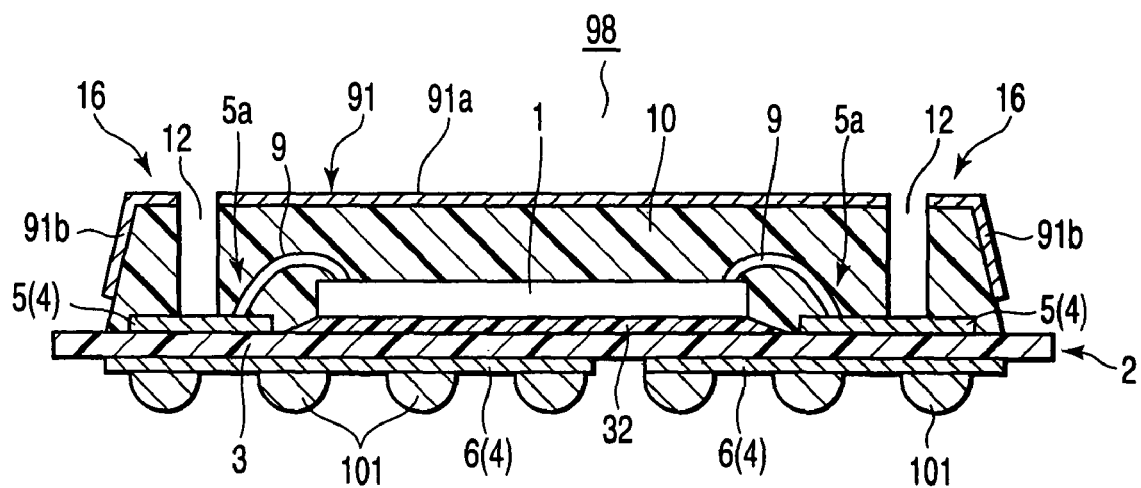
FIGS. 20A and 20B are sectional views respectively showing steps in the semiconductor device manufacturing method according to the eighth embodiment.

As shown in FIG. 20A, through holes 12 are respectively formed with a drill, laser, or the like at the first interconnection connecting portions (cascade connecting portions) 16 of the resin-sealed package 98 in which the Cu foil 91 is integrally provided on the surface of the sealing resin 10. In the eighth embodiment, the through holes 12 extend through only the Cu foil 91, sealing resin 10, chip interconnections 5, and base body 3 at the cascade connecting portions 16 of the resin-sealed package 98 without extending through a Cu foil 4 (second interconnections 6) on the non-chip mounting surface 2b of the chip mounting base 2. At this time, the diameter of each through hole 12 is preferably set to a ratio of about 1:6 or less with respect to the thickness of the resin-sealed package 98. The diameter of a portion (cascade connecting portion 16) of the chip mounting base 2 at which the through hole 12 is formed is preferably set to the sum of the diameter of the through hole 12 and about 5 to 100 μm. In other words, of the Cu foils 4 serving as the chip interconnections (first interconnections) 5 and second interconnections 6, the diameter of a portion which is electrically connected to the through plug 100 serving as the fourth interconnection is preferably set to the sum of the diameter of the through hole 12 and about 5 to 100 μm.

Figure 20B:
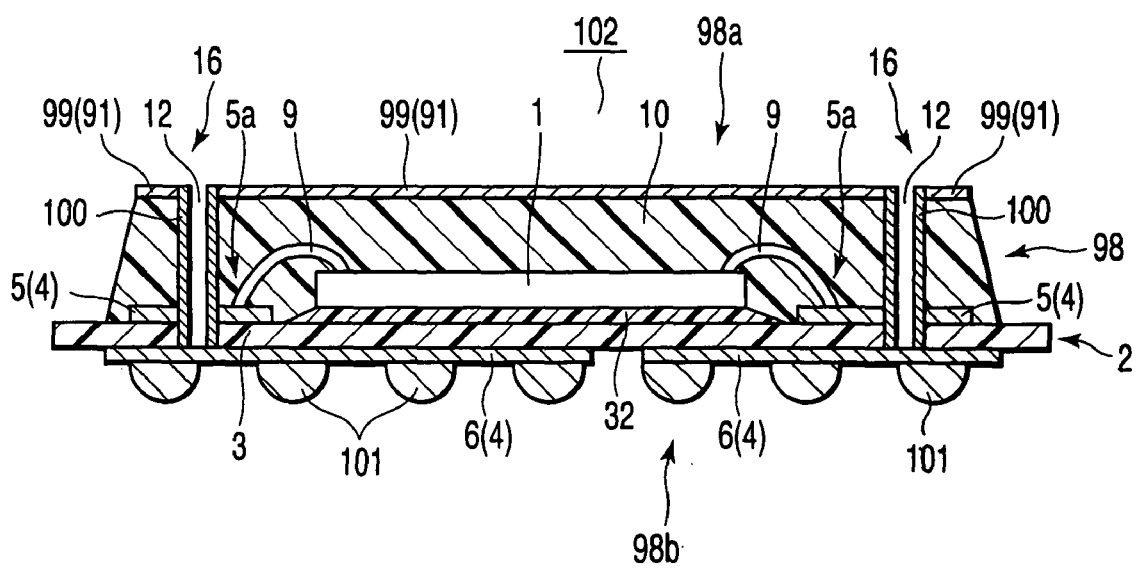

As shown in FIG. 20B, an electroless Cu plating film about 0.01 to 3 μm thick is entirely provided on the inner wall surface of each through hole 12 by electroless copper plating. The electroless Cu plating film in the through hole 12 ensures the conductivity between the Cu foil 91 on a package mounting surface (upper surface or front surface) 98a of the resin-sealed package 98 and the Cu foil 4 on a substrate packaging surface (lower surface or back surface) 98b of the resin-sealed package 98. In the electroless plating step, if etched (patterned) interconnections, terminals, and the like exist on an exposed surface of the resin-sealed package 98, they are covered in advance with a mask (not shown). After that, electrolytic copper plating is executed using the electroless Cu plating film in the through hole 12 as a seed layer. This makes the film thickness of the Cu film in the through hole 12 equal to the thickness of a general interconnection. Consequently, the Cu film 100 of the integrated electroless Cu plating film and electrolytic Cu plating film is provided in each through hole 12. The Cu films 100 serve as through plugs (fourth interconnections) which are cascade interconnections.

Although not shown, a resist film such as a photosensitive dry film is adhered onto the surface of the Cu foil 91. Exposure is performed using an exposure mask bearing the pattern of a plurality of cascade connecting terminals (interconnections) on the Cu foil 91, the pattern of packaging terminals corresponding to the connecting terminals of a component to be mounted on the package mounting surface 98a, the pattern of a plurality of third interconnections 99, and the like. The patterns of the above-mentioned terminals, third interconnections 99, and the like are transferred onto the surface of the Cu foil 91. The Cu foil 91 undergoes etching, development, or the like. A plurality of third interconnections 99 and the like are formed on the package mounting surface 98a of the resin-sealed package 98. If necessary, a solder resist is applied to the surfaces of the third interconnections 99, or Ni/Au plating is executed for the surfaces of the cascade connecting terminals, packaging terminals, and the like.

Although not shown, a resist film such as a photosensitive dry film is adhered onto the surface of the Cu foil 4 on the non-chip mounting surface 2b of the chip mounting base 2. Exposure is performed using an exposure mask bearing the pattern of a plurality of cascade connecting terminals (interconnections) on the Cu foil 4, the pattern of packaging terminals corresponding to the connecting terminals of a substrate to be packed on the substrate packaging surface 98b, the pattern of a plurality of second interconnections 6, and the like. The patterns of the above-mentioned terminals, second interconnections 6, and the like are transferred onto the surface of the Cu foil 4. The Cu foil 4 undergoes etching, development, or the like. Hence, a plurality of second interconnections 6 and the like are formed on the substrate packaging surface 98*b* of the resin-sealed package 98. If necessary, a solder resist is applied to the surfaces of the second interconnections 6, or Ni/Au plating is executed for the surfaces of the cascade connecting terminals, packaging terminals, and the like.

By the above steps, a plurality of third interconnections 99 with a desired interconnection pattern, and the like can be formed on the package mounting surface 98*a* of the resin-sealed package 98, as shown in FIG. 20B. The third interconnections 99 serve as component mounting interconnections (component mounting terminals) for mounting components such as a package on the package mounting surface 98*a*. The second interconnections 6 undergo surface treatment such as corrosion prevention or Ni/Au plating which makes the solder easily wet and makes it difficult to form an unfused oxide film on the surfaces of the second interconnections 6 at a high-temperature test. At the same time, a plurality of solder balls 101 are brought into contact with (bonded to) the second interconnections 6, and mounted on the substrate packaging surface 98*b* of the resin-sealed package 98.

An assembly of the resin-sealed packages 98 fabricated at once by the above steps is cut from a tape into individual packages by dicing or the like. Various tests are executed for the resin-sealed packages 98, and resin-sealed packages 98 which have passed these tests are determined as nondefectives. A desired semiconductor device 102 according to the eighth embodiment having the resin-sealed package 98 shown in FIG. 20B as a main building component is obtained. That is, the eighth embodiment implements the semiconductor device 102 comprised of the resin-sealed package 98 in which a plurality of third interconnections 99 and the sealing resin 10 are integrally provided at once by the transfer molding step.

If necessary, predetermined external devices (not shown) such as a passive component are mounted on the package mounting surface 98*a* of the semiconductor device 102. Also, if necessary, a packaging substrate (not shown) is packaged on the substrate packaging surface 98*b* of the semiconductor device 102. If necessary, a plurality of semiconductor devices 102 are stacked and used as a multichip package.

As described above, the eighth embodiment can attain the same effects as those of the first and third to fifth embodiments. In the eighth embodiment, the Cu foil 91 serving as the third interconnections 99 and the sealing resin 10 are integrally provided at once by the transfer molding step. This can increase the adhesion strength between the third interconnections 99 and the sealing resin 10. The third interconnections 99 having high adhesion strength with the sealing resin 10 also improve in strength, durability, and reliability. By increasing the adhesion strength between the third interconnections 99 and the sealing resin 10, the content of the mold releasing member in the sealing resin 10 can be decreased, and the adhesion strength between the sealing resin 10 and the semiconductor chip 1 or chip mounting base 2 can be increased. The sealing properties (tight sealing properties) of the overall resin-sealed package 98 are enhanced, and the strength, durability, and reliability of the semiconductor device 102 can be improved.

Since the Cu foil 91 and sealing resin 10 are provided at once, the manufacturing process of the semiconductor device 102 (resin-sealed package 98) can be simplified. In transfer molding, the Cu foil 91 is simply arranged in the cavity 95 of the mold 94 together with the chip mounting base 2 bearing the semiconductor chip 1. Thus, general assembly equipment can be easily applied, and the burden such as equipment cost hardly rises. The eighth embodiment can efficiently, easily manufacture the semiconductor device 102 with higher versatility, higher strength, higher reliability, and higher durability at low cost.

Ninth Embodiment

Figure 21A:
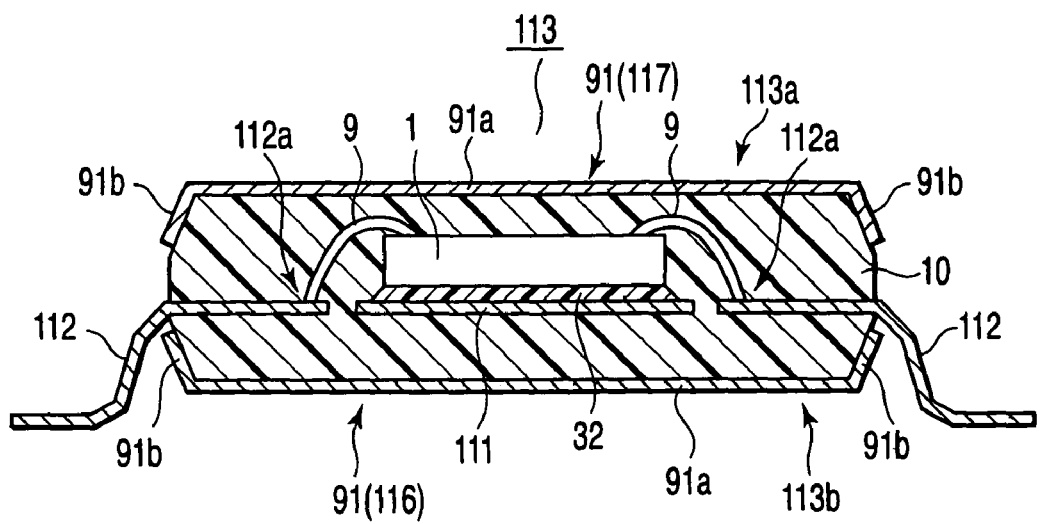
FIGS. 21A and 21B are sectional views respectively showing steps in a semiconductor device manufacturing method according to the ninth embodiment.
Figure 21B:
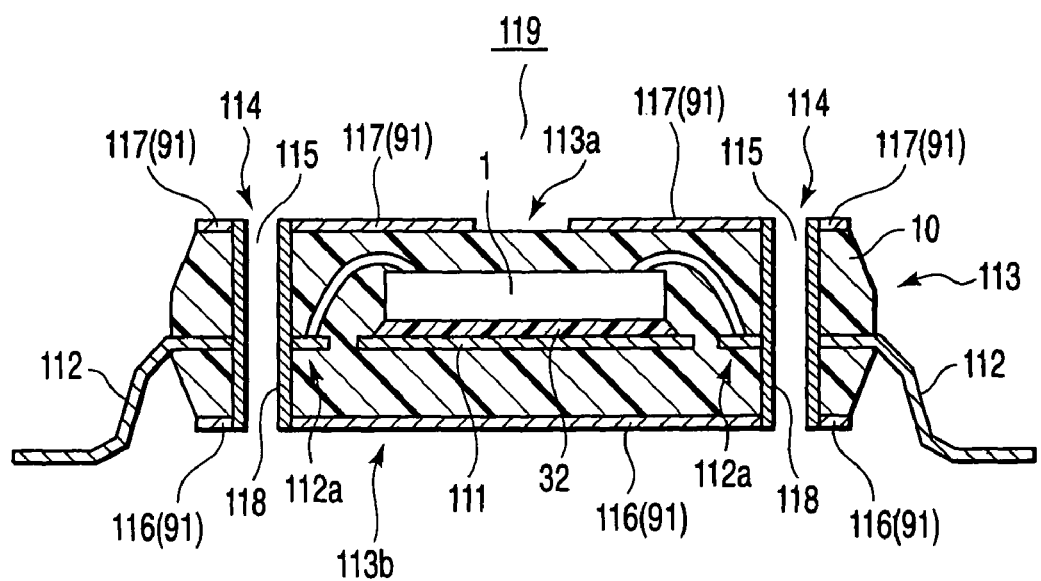

The ninth embodiment according to the present invention will be described with reference to FIGS. 21A and 21B. FIGS. 21A and 21B are sectional views respectively showing steps in a semiconductor device manufacturing method according to the ninth embodiment. The same reference numerals as in the first embodiment denote the same parts, and a detailed description thereof will be omitted.

The ninth embodiment is one of variations of the semiconductor device and manufacturing method therefor according to the eighth embodiment. More specifically, in the ninth embodiment, a semiconductor chip is connected to a lead frame instead of a chip mounting base. The ninth embodiment will be explained in detail.

As shown in FIG. 21A, one semiconductor chip 1 is adhered with an adhesive 32 and mounted on a chip mount die pad 111. The connecting pads (electrodes) of the semiconductor chip 1 and a plurality of lead frames 112 serving as first interconnections are electrically connected by Au bonding wires 9. The Au bonding wires 9 are connected as chip interconnections to pad connecting portions 112*a* of the lead frames 112.

Although not shown, the semiconductor chip 1 on the chip mount die pad 111, the lead frames 112, the Au bonding wires 9, and the like are arranged in the cavity of a mold. In addition, a box-like Cu foil 91 is arranged in the cavity with an opening facing the semiconductor chip 1 so as to cover the semiconductor chip 1, Au bonding wires 9, and the like from above them. Further, in the ninth embodiment, another box-like Cu foil 91 is arranged in the cavity with an opening facing the chip mount die pad 111 so as to cover the semiconductor chip 1, Au bonding wires 9, and the like from below them. That is, in the ninth embodiment, the two box-like Cu foils 91 are opposed to each other so as to sandwich the semiconductor chip 1, lead frames 112, and the like between them. The box-like Cu foils 91 are then arranged in the cavity so as to cover the semiconductor chip 1, Au bonding wires 9, chip mount die pad 111, and the like from the upper and lower (front and back) major surfaces of the semiconductor chip 1. At this time, the Cu foils 91 are arranged so that sealing member inlet ports 92 face the sealing resin injection gate of the mold. Similarly, the Cu foils 91 are arranged so that vents 93 face the air vent portions of the mold.

Subsequently, a sealing resin 10 is injected into the cavity which stores the semiconductor chip 1, lead frames 112, two Cu foils 91, and the like. The sealing resin 10 is guided between the Cu foils 91 from the sealing resin injection gate of the mold via the sealing member inlet ports 92 of the Cu foils 91. The sealing resin 10 is kept supplied (filled) between the Cu foils 91 until the sealing resin 10 almost entirely covers the inner surfaces of the Cu foils 91, the semiconductor chip 1 on the chip mount die pad 111, the Au bonding wires 9, the pad connecting portions 112*a* of the lead frames 112, and the like. While the surfaces of the Cu foils 91 and ends of the lead frames 112 that are opposite to the pad connecting portions 112*a* are exposed, sealing of the semiconductor chip 1, Au bonding wires 9, and the like and attachment of the Cu foils 91 onto the upper and lower major surfaces (upper and lower mold-sealed surfaces) of the sealing resin 10 are executed at once.

Of the Cu foils 91, the Cu foil 91 on the mold-sealed surface facing the semiconductor chip 1 forms the third interconnections, i.e., upper interconnections (upper terminals) or package mounting interconnections (package mounting terminals) 117. Of the Cu foils 91, the Cu foil 91 which is provided on the mold-sealed surface and opposed to the chip mount die pad 111 provides the second interconnections, i.e., lower interconnections (lower terminals) or substrate packaging interconnections (substrate packaging terminals) 116. The height of each side wall 91b of at least one Cu foil 91 which is provided on the mold-sealed surface and opposed to the semiconductor chip 1 is set to a size at which the side wall 91b does not contact the Au bonding wires 9 connected to the lead frames 112 and the like during and after the sealing step. For example, the height of the side wall 91b is preferably set to the sum of about 10 to 200 μm and the height from the surface of the lead frame 112 to the highest portion of the Au bonding wire 9. Thus, the Cu foil 91 is attached onto the mold-sealed surface without contacting the Au bonding wires 9 and the like.

The above steps fabricate a resin-sealed package (mold-sealed package) 113 comprised of the semiconductor chip 1, lead frames 112, sealing resin 10, two, upper and lower Cu foils 91, and the like, as shown in FIG. 21A. The resin-sealed package 113 serves as a main building component of a semiconductor device 119 according to the ninth embodiment. When a plurality of lead frames 112 are used as chip interconnections, like the package 113, the Cu foils 91 are respectively opposed to upper and lower molds in the cavity via the semiconductor chip 1, lead frames 112, and the like in transfer molding. By performing transfer molding with this setting, the conductors (Cu foils) 91 used as external interconnections (external terminals) can be attached at once onto the upper and lower major surfaces of the sealing resin 10 (package 113) together with sealing of the semiconductor chip 1, Au bonding wires 9, and the like.

As shown in FIG. 21B, through holes 115 are respectively formed with a drill, laser, or the like at first interconnection connecting portions (cascade connecting portions) 114 of the resin-sealed package 113 in which the Cu foils 91 are provided integrally on the upper and lower major surfaces of the sealing resin 10, respectively. In the ninth embodiment, the through holes 115 extend through the two, upper and lower Cu foils 91 (second interconnections 116 and third interconnections 117), sealing resin 10, and lead frames (chip interconnections) 112 at the cascade connecting portions 114 of the resin-sealed package 113. Similar to the eighth embodiment, the diameter of each through hole 115 is preferably set to a ratio of about 1:6 or less with respect to the thickness of the resin-sealed package 113. Also similar to the eighth embodiment, the diameter of a portion (cascade connecting portion 114) of the lead frame 112 at which the through hole 115 is formed is preferably set to the sum of the diameter of the through hole 115 and about 5 to 100 μm. In other words, of the Cu foils 91 serving as the lead frames (chip interconnections or first interconnections) 112 and second interconnections 116, the diameter of a portion which is electrically connected to a through plug 118 serving as the fourth interconnection is preferably set to the sum of the diameter of the through hole 115 and about 5 to 100 μm.

As shown in FIG. 21B, an electroless Cu plating film about 0.01 to 3 μm thick is provided on the inner wall surface of each through hole 115 by electroless copper plating. The electroless Cu plating film in the through hole 115 ensures the conductivity between the Cu foil 91 on a package mounting surface (upper surface or front surface) 113a of the resin-sealed package 113 and the Cu foil 91 on a substrate packaging surface (lower surface or back surface) 113b of the resin-sealed package 113. In the electroless plating step, if etched (patterned) interconnections, terminals, and the like exist on an exposed surface of the resin-sealed package 113, they are covered in advance with a mask (not shown). After that, electrolytic copper plating is executed using the electroless Cu plating film in the through hole 115 as a seed layer. This makes the film thickness of the Cu film in the through hole 115 equal to the thickness of a general interconnection. Consequently, the Cu film 118 of the integrated electroless Cu plating film and electrolytic Cu plating film is provided in each through hole 115. The Cu films 118 serve as through plugs (fourth interconnections) which are cascade interconnections.

Although not shown, a resist film such as a photosensitive dry film is adhered onto the surfaces of the upper and lower Cu foils 91. Exposure is performed for the Cu foil 91 on the substrate packaging surface 113b of the resin-sealed package 113. This exposure employs an exposure mask bearing the pattern of a plurality of cascade connecting terminals (interconnections) on the Cu foil 91, the pattern of packaging terminals corresponding to the connecting terminals of a substrate to be packed on the substrate packaging surface 113b, the pattern of a plurality of second interconnections 116, and the like. The patterns of the above-mentioned terminals, second interconnections 116, and the like are transferred onto the surface of the Cu foil 91 on the substrate packaging surface 113b. The Cu foil 91 undergoes etching, development, or the like. Hence, a plurality of second interconnections 116 and the like are formed on the substrate packaging surface 113b of the resin-sealed package 113. If necessary, a solder resist is applied to the surfaces of the second interconnections 116, or Ni/Au plating is executed for the surfaces of the cascade connecting terminals, packaging terminals, and the like.

Although not shown, exposure is done for the Cu foil 91 on the package mounting surface 113a of the resin-sealed package 113. This exposure employs an exposure mask bearing the pattern of a plurality of cascade connecting terminals (interconnections) on the Cu foil 91, the pattern of packaging terminals corresponding to the connecting terminals of a component to be mounted on the package mounting surface 113a, the pattern of a plurality of third interconnections 117, and the like. The patterns of the above-mentioned terminals, third interconnections 117, and the like are transferred onto the surface of the Cu foil 91 on the package mounting surface 113a. The Cu foil 91 undergoes etching, development, or the like. Accordingly, a plurality of third interconnections 117 and the like are formed on the package mounting surface 113a of the resin-sealed package 113. If necessary, a solder resist is applied to the surfaces of the third interconnections 117, or Ni/Au plating is executed for the surfaces of the cascade connecting terminals, packaging terminals, and the like.

By the above steps, a plurality of second interconnections 116 with a desired interconnection pattern, and the like can be formed on the substrate packaging surface 113b of the resin-sealed package 113, as shown in FIG. 21B. The second interconnections 116 serve as substrate packaging interconnections (substrate packaging terminals) for packaging a packaging substrate on the substrate packaging surface 113b. Also, a plurality of third interconnections 117 with a desired interconnection pattern, and the like can be formed on the package mounting surface 113a of the resin-sealed package 113. The third interconnections 117 serve as component mounting interconnections (component mounting terminals)

for mounting components such as a package on the package mounting surface 113a. Although not shown, the second interconnections 116 undergo surface treatment such as corrosion prevention or Ni/Au plating which makes the solder easily wet and makes it difficult to form an unfused oxide film on the surfaces of the second interconnections 116 at a high-temperature test. At the same time, a plurality of solder balls are mounted on exposed surfaces of the second interconnections 116.

An assembly of the resin-sealed packages 113 fabricated at once by the above steps is cut from a tape into individual packages by dicing or the like. Various tests are executed for the resin-sealed packages 113, and resin-sealed packages 113 which have passed these tests are determined as nondefectives. A desired semiconductor device 119 according to the ninth embodiment having the resin-sealed package 113 shown in FIG. 21B as a main building component is obtained. That is, the ninth embodiment implements the semiconductor device 119 comprised of the resin-sealed package 113 in which the sealing resin 10, and pluralities of second and third interconnections 116 and 117 facing each other on the upper and lower major surfaces while sandwiching the sealing resin 10 between them are integrally provided at once by the transfer molding step.

If necessary, predetermined external devices (not shown) such as a passive component are mounted on the package mounting surface 113a of the semiconductor device 119. Also, if necessary, a packaging substrate (not shown) is packaged on the substrate packaging surface 113b of the semiconductor device 119. If necessary, a plurality of semiconductor devices 119 are stacked and used as a multichip package.

As described above, the ninth embodiment can achieve the same effects as those of the first, third to fifth, and eighth embodiments. Since the Cu foil 91 serving as the second interconnections 116, the Cu foil 91 serving as the third interconnections 117, and the sealing resin 10 are provided at once, the manufacturing process of the semiconductor device 119 (resin-sealed package 113) can be further simplified. In transfer molding, the lead frames 112 electrically connected to the semiconductor chip 1 are simply interposed between the two Cu foils 91 and arranged in the cavity of the mold. General assembly equipment can be easily applied, and the burden such as equipment cost hardly rises. The ninth embodiment can efficiently, easily manufacture the semiconductor device 119 with higher versatility, higher strength, higher reliability, and higher durability at lower cost.

10th Embodiment

The 10th embodiment according to the present invention will be described with reference to FIGS. 22A to 22C. FIGS. 22A to 22C are sectional views respectively showing steps in a semiconductor device manufacturing method according to the 10th embodiment. The same reference numerals as in the first embodiment denote the same parts, and a detailed description thereof will be omitted.

In the 10th embodiment, similar to the eighth and ninth embodiments, a conductor serving as the third interconnection is provided on the surface of a sealing resin, and the fourth interconnection is provided in the sealing resin. Unlike the eighth and ninth embodiments, the sealing resin and conductor are separately provided in different steps. The 10th embodiment will be briefly described.

As shown in FIG. 22A, a sealing resin 10 is applied onto a chip mounting surface 2a of a chip mounting base 2 on which a semiconductor chip 1 is mounted by wire bonding. The sealing resin 10 covers the semiconductor chip 1, chip interconnections 5, Au bonding wires 9, and the like. Similar to the eighth and ninth embodiments, the sealing resin 10 is applied by transfer molding onto the chip mounting surface 2a of the chip mounting base 2. In the transfer molding step of the 10th embodiment, unlike the eighth and ninth embodiments, only the sealing resin 10 is provided on the chip mounting surface 2a of the chip mounting base 2.

As shown in FIG. 22B, a conductor 121 serving as the third interconnection is provided on the surface of the sealing resin 10. More specifically, a Cu foil 121 about 5 to 12 μm thick is provided as the conductor on the surface of the sealing resin 10. In the 10th embodiment, unlike the eighth and ninth embodiments, the Cu foil 121 is provided on the surface of the sealing resin 10 separately from the sealing resin 10 in a step subsequent to the transfer molding step. For this reason, the Cu foil 121 need not always be formed into a box shape, unlike the Cu foil 91 used in the eighth and ninth embodiments. In addition, the Cu foil 121 need not comprise any sealing member inlet port 92 or vent 93. However, the 10th embodiment adopts the Cu foil 121 of the same shape as that of the Cu foil 91 in the eighth and ninth embodiments. By sharing the building components of semiconductor devices, commonality of the manufacturing equipment of semiconductor devices and simplification of the manufacturing process can be achieved regardless of the difference in manufacturing process between semiconductor devices. This can reduce the manufacturing cost of the semiconductor device.

Although not shown, an adhesive about 8 to 50 μm thick is applied onto a surface of the Cu foil 121 that is adhered to the sealing resin 10. As the adhesive, for example, an epoxy- or imide-based adhesive is used. The Cu foil 121 with the adhesive is adhered onto the surface (mold-sealed surface) of the sealing resin 10 by hot lamination or vacuum press. The above steps fabricate a resin-sealed package (mold-sealed package) 122 comprised of the semiconductor chip 1, flexible base 2, sealing resin 10, Cu foil 121, and the like. The resin-sealed package 122 serves as a main building component of a semiconductor device 125 according to the 10th embodiment.

As shown in FIG. 22C, a plurality of through holes 12 are formed at first interconnection connecting portions (cascade connecting portions) 16 of the resin-sealed package 122 by the same step as that of the eighth embodiment. Through plugs (fourth interconnections) 100 are respectively provided as cascade interconnections in the through holes 12. At the same time, a plurality of second interconnections 6 serving as lower interconnections (substrate packaging interconnections), a plurality of third interconnections 123 serving as upper interconnections (package mounting interconnections or component mounting terminals), and the like are formed on the resin-sealed package 122 having the through plugs. The third interconnections 123 are formed by processing the Cu foil 121 into a predetermined pattern by the etching step or the like. Similar to the eighth embodiment, if necessary, predetermined surface treatment is done for the second interconnections 6, third interconnections 123, and the like. A plurality of solder balls 101 are brought into contact with (bonded) to the second interconnections 6, and mounted on a substrate packaging surface 122b of the resin-sealed package 122.

An assembly of the resin-sealed packages 122 fabricated at once by the above steps is cut from a tape into individual packages by dicing or the like. Various tests are executed for the resin-sealed packages 122, and resin-sealed packages 122 which have passed these tests are determined as nondefectives. Hence, a desired semiconductor device 125 according to the 10th embodiment having the resin-sealed package 122 shown in FIG. 22C as a main building component is obtained. That is, the 10th embodiment implements the semiconductor device 125 comprised of the resin-sealed package 122 in which the Cu foil 121 serving as a plurality of third interconnections 123 and the sealing resin 10 are separately provided in different steps.

If necessary, predetermined external devices (not shown) such as a passive component are mounted on a package mounting surface 122a of the semiconductor device 125. Also, if necessary, a packaging substrate (not shown) is packaged on the substrate packaging surface 122b of the semiconductor device 125. If necessary, a plurality of semiconductor devices 125 are stacked and used as a multichip package.

As described above, the 10th embodiment can obtain the same effects as those of the first, third to fifth, and eighth embodiments. The Cu foil 121 and sealing resin 10 need not be integrally provided at once in the molding step, and thus the Cu foil 121 need not be formed into a special shape which facilitates supply of the sealing resin 10 inside the Cu foil 121. The step of forming the Cu foil 121 can be simplified, and the formation cost of the Cu foil 121 can be suppressed. This results in a simple manufacturing process of the semiconductor device 125 and low manufacturing cost of the semiconductor device 125. The semiconductor device and manufacturing method therefor according to the 10th embodiment can be applied to the manufacture of various resin-sealed packages such as a so-called SOP, OMPAC, or Stacked MCP by forming the shape of the Cu foil 121 into a proper one corresponding to the mold-sealed surface of the resin-sealed package. That is, the semiconductor device and manufacturing method therefore according to the 10th embodiment can be applied to the manufacture of various semiconductor devices regardless of the shape of the cavity of the mold. The semiconductor device and manufacturing method therefor according to the 10th embodiment exhibit a wide application range and high versatility.

The semiconductor device and manufacturing method therefor according to the present invention are not limited to the first to 10th embodiments described above. The arrangements and manufacturing steps can be partially changed to various settings, or various settings can be properly combined without departing from the spirit or scope of the invention.

For example, in the first and fourth embodiments, the chip mounting bases 2 and 41 are formed into a tape shape, but the present invention is not limited to this. The chip mounting bases 2 and 41 may be formed into a film or plate shape.

The semiconductor chip 1 is not limited to one function. As the semiconductor chip 1, semiconductor chips with various functions such as a CPU, memory, DSP, and image processing engine can be employed.

In the second embodiment, four semiconductor devices 20 of the first embodiment are stacked to fabricate one multichip package (semiconductor device) 21. Similarly, in the sixth embodiment, four semiconductor devices 64 of the fifth embodiment are stacked to fabricate one multichip package 71. However, the multichip package is not always fabricated by stacking identical semiconductor devices 20 or 64, or the like. For example, one multichip package may be fabricated by mixedly stacking the semiconductor device 20 of the first embodiment, the semiconductor device 34 of the third embodiment, the semiconductor device 52 of the fourth embodiment, the semiconductor device 64 of the fifth embodiment, and semiconductor devices 83 and 85 of the seventh embodiment. To fabricate a chip-stacked multichip package, proper numbers of semiconductor devices 20, 34, 52, 64, 83, and 85 are arranged at proper positions in accordance with a desired arrangement. Also, electrical connections between the semiconductor devices 20, 34, 52, 64, 83, and 85 (semiconductor chips 1), i.e., the first to fourth interconnections 5, 6, 13, 15, 43, 47, and 48 are set to proper patterns and numbers in accordance with a desired arrangement.

In the fourth embodiment, the sealing resin 10 is applied onto the chip mounting surface 41a of the chip mounting base 41, and the third and fourth interconnections 47 and 48 are integrally provided at once. However, the present invention is not limited to this. For example, the semiconductor device 52 may be fabricated by the same steps as those of the eighth embodiment. More specifically, the sealing resin 10 and a Cu foil serving as the third interconnections 47 are integrally provided at once on the chip mounting surface 41a of the flexible base 41. Thereafter, the non-via plugs 48 are provided as the fourth interconnections, and extend at once through at least the Cu foil and the sealing resin 10 having the Cu foil along the direction of thickness. In this manner, the non-via plugs 48 may be provided in a different step separately from the third interconnections 47 after the sealing resin 10 and the Cu foil serving as the third interconnections 47 are integrally provided at once on the chip mounting surface 41a of the flexible base 41.

Alternatively, the semiconductor device 52 of the fourth embodiment may be fabricated by the same step as that of the 10th embodiment. More specifically, the sealing resin 10 is applied onto the chip mounting surface 41a of the flexible base 41. The third interconnections 47 are provided on the surface of the sealing resin 10 in a different step separately from the sealing resin 10. Subsequently, the non-via plugs 48 are provided as the fourth interconnections, and extend at once through at least the third interconnections 47 and the sealing resin 10 having the third interconnections 47 along the direction of thickness. In this way, the third interconnections 47 and non-via plugs 48 may be separately provided in different steps after the sealing resin 10 is applied onto the chip mounting surface 41a of the flexible base 41.

In the semiconductor devices 83 and 85 according to the seventh embodiment, all the semiconductor chips 1 are mounted on the chip mounting base 2 or 41 by wire bonding. However, the present invention is not limited to this. For example, of the semiconductor chips 1, the lowermost semiconductor chip 1 in direct contact with the chip mounting base 2 or 41 may be mounted on the chip mounting base 2 or 41 by flip chip connection. In the semiconductor devices 83 and 85, semiconductor chips 1 with various functions such as a CPU, memory, DSP, and image processing engine can be stacked and mixedly mounted on the chip mounting base 2 or 41.

In the eighth embodiment, recesses for providing the fourth interconnections 100 are formed as the through holes 12, but the present invention is not limited to this. For example, the chip mounting base 41 of a single-sided copper-clad tape may be used as a chip mounting base, and recesses for providing the fourth interconnections 90 may be formed as non-via holes, similar to the fourth embodiment. In this case, the diameter of each non-via hole is preferably set to a ratio of about 1:1 or more with respect to the thickness of the resin-sealed package 98. This also applies to the semiconductor device 119 of the ninth embodiment using the lead frame 112 instead of the chip mounting bases 2 and 41. At least electrical connection between the second interconnection 116 and the lead frame 112 and electrical connection between the third interconnection 117 and the lead frame 112 suffice to be ensured.

In the eighth and ninth embodiments, the Cu foil 91 has a square box shape as shown in FIGS. 18A and 18B, but the present invention is not limited to this. The shape of the Cu foil 91 may be formed into a proper one in accordance with the shape of the cavity of the mold, the shape of the mold-sealed surface of a desired resin-sealed package (semiconductor device), or the like. This also applies to the sizes, shapes, formation portions, and numbers of the sealing member inlet port 92 and vent 93. When the Cu foil 91 and sealing resin 10 are integrally provided at once in the transfer molding step, the sizes, shapes, formation portions, and numbers of the sealing member inlet port 92 and vent 93 are properly set so as to obtain the same effects as those of the eighth and ninth embodiments. In other words, the sizes, shapes, formation portions, and numbers of the sealing member inlet port 92 and vent 93 are so set as to appropriately fill the sealing resin 10 between the Cu foil 91 and the chip mounting base 2 without covering the surface (upper surface) of the Cu foil 91 with the sealing resin 10 in the transfer molding step and exposing the semiconductor chip 1, Au bonding wires 9, and the like from the sealing resin 10.

In the ninth embodiment, only one semiconductor chip 1 is mounted on one major surface of the chip mount die pad 111 (lead frame 112), but the present invention is not limited to this. Similar to the seventh embodiment, a plurality of semiconductor chips 1 may be stacked and mounted on one major surface of the chip mount die pad 111. Alternatively, semiconductor chips 1 may be mounted each on the upper and lower major surfaces of the chip mount die pad 111, and opposed to each other. A plurality of semiconductor chips 1 may also be stacked on the upper and lower major surfaces of the chip mount die pad 111, and opposed to each other.

In the ninth embodiment, the sealing resin 10, and the two Cu foils 91 serving as the second and third interconnections 116 and 117 are integrally provided at once, and then the through plugs 108 serving as the fourth interconnections are provided. However, the present invention is not limited to this. For example, the semiconductor device 119 may be fabricated by the same steps as those of the first embodiment. More specifically, the sealing resin 10 is applied over the semiconductor chip 1, and the connecting portions between the semiconductor chip 1 and the lead frames 112 serving as the first interconnections. The through plugs 118 are provided by, e.g., plating, and extend at once through the sealing resin 10 and the lead frames 112 covered with the sealing resin 10 along the direction of thickness of the semiconductor chip 1. At least one of the Cu foil 91 serving as the second interconnections 116 and the Cu foil 91 serving as the third interconnections 117 is provided at once integrally with the through plugs 118 on the surface of the sealing resin 10. The other Cu foil 91 is provided on an opposite surface of the sealing resin 10, and opposed to the previous Cu foil 91. In this fashion, the through plugs 118, and at least one of the Cu foil 91 serving as the second interconnections 116 and the Cu foil 91 serving as the third interconnections 117 may be integrally provided at once after the sealing resin 10 is applied over the semiconductor chip 1, and the connecting portions between the semiconductor chip 1 and the lead frames 112.

Alternatively, the semiconductor device 119 may be fabricated by the same steps as those of the 10th embodiment. More specifically, the sealing resin 10 is applied over the semiconductor chip 1, and the connecting portions between the semiconductor chip 1 and the lead frames 112 serving as the first interconnections. At least one of the Cu foil 91 serving as the second interconnections 116 and the Cu foil 91 serving as the third interconnections 117 is provided on the surface of the sealing resin 10 in a different step separately from the sealing resin 10. Subsequently, the through plugs 118 are so provided as to extend at once through the sealing resin 10, the lead frames 112 covered with the sealing resin 10, and at least one of the Cu foil 91 serving as the second interconnections 116 and the Cu foil 91 serving as the third interconnections 117 along the direction of thickness of the semiconductor chip 1. The other Cu foil 91 is provided on an opposite surface of the sealing resin 10, and opposed to the previous Cu foil 91. The through plugs 118, and at least one of the Cu foil 81 serving as the second interconnections 116 and the Cu foil 91 serving as the third interconnections 117 may be separately provided in different steps after the sealing resin 10 is applied over the semiconductor chip 1, and the connecting portions between the semiconductor chip 1 and the lead frames 112.

Further, a multichip package similar to the chip-stacked multichip packages (semiconductor devices) 21 and 71 of the second and sixth embodiments is fabricated using a plurality of semiconductor devices 119 of the ninth embodiment. In this case, the semiconductor chips 1 of respective layers may be electrically connected by electrically connecting the lead frames (first interconnections) 112 of the semiconductor devices 119 adjacent in the stacking direction.

In the first and third to fifth embodiments, the fourth interconnections 15 and 48 are provided at the same time as the third interconnections 13 and 47. In the eighth to 10th embodiments the third interconnections 99, 117, and 123 are provided prior to formation of the fourth interconnections 100 and 118. However, the fourth interconnections 15, 48, 100, and 118 are not always provided in the above-described orders. For example, in the first, third to fifth, eighth, and 10th embodiments, the fourth interconnections 15, 48, and 100 may be provided in the sealing resin 10, and then the third interconnections 13, 47, 99, and 123 may be provided on the surface of the sealing resin 10. Alternatively, in the ninth embodiment, the fourth interconnections 118 may be provided in the sealing resin 10, and then at least either the second interconnections 116 or third interconnections 117 may be provided on the surface of the sealing resin 10.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a chip mounting base having a first interconnection on a first major surface thereof, a second interconnection exposed to a second major surface thereof, the second interconnection being electrically connected to the first interconnection and extending through a base body of the chip mounting base;
    a semiconductor element mounted on the first major surface of the chip mounting base and electrically connected to the first interconnection;
    a sealing member provided on the first major surface of the chip mounting base, covering the semiconductor element and the first interconnection, and having a hole;
    a third interconnection provided on a surface of the sealing member; and
    a fourth interconnection provided in the sealing member, electrically connected to the first interconnection and the third interconnection, and extending through the hole of the sealing member,
    wherein the third interconnection and the fourth interconnection are integral with each other and form one layer.

2. A semiconductor device according to claim 1, wherein the third interconnection includes a Cu layer.

3. A semiconductor device according to claim 1, wherein a plurality of semiconductor elements are stacked on the first major surface of the chip mounting base.

4. A semiconductor device according to claim 1, wherein the semiconductor element is electrically connected to the first interconnection by a bonding wire.

5. A semiconductor device according to claim 4, wherein a plurality of semiconductor elements are stacked in the sealing member and electrically connected to the first interconnection.

6. A semiconductor device according to claim 1, wherein the fourth interconnection includes a Cu layer.

7. A semiconductor device according to claim 1, wherein the fourth interconnection forms a current passage.

8. A semiconductor device according to claim 1, further comprising a solder resist provided on the sealing member and covering an edge of the third interconnection.

9. A semiconductor device according to claim 1, wherein the fourth interconnection is formed along an inner surface of the hole of the sealing member, but does not entirely fill the hole.

10. A semiconductor device according to claim 1, further comprising a solder resist which fills the hole.

11. A semiconductor device according to claim 1, wherein the sealing member is formed of a resin.

12. A semiconductor device according to claim 1, wherein the third interconnection and the fourth interconnection are formed of a Cu layer.

13. A semiconductor device according to claim 12, wherein the Cu layer is formed by electroless plating and electrolytic plating.

* * * * *